(12) United States Patent
Hill

(10) Patent No.: US 7,460,245 B2  
(45) Date of Patent: Dec. 2, 2008

(54) APPARATUS AND METHOD FOR MEASUREMENT AND COMPENSATION OF ATMOSPHERIC TURBULENCE EFFECTS IN WAVEFRONT INTERFEROMETRY

(75) Inventor: Henry A. Hill, Tucson, AZ (US)

(73) Assignee: Zetetic Institute, Tucson, AZ (US)

( * ) Notice: Subject to any disclaimer, the term of this patent is extended or adjusted under 35 U.S.C. 154(b) by 131 days.

(21) Appl. No.: 11/466,990

(22) Filed: Aug. 24, 2006

(65) Prior Publication Data

US 2007/0046951 A1  Mar. 1, 2007

Related U.S. Application Data

(60) Provisional application No. 60/711,952, filed on Aug. 26, 2005.

(51) Int. Cl.  
G01N 21/41 (2006.01)

(52) U.S. Cl. .................... 356/517; 356/515

(58) Field of Classification Search ........... 356/515  
See application file for complete search history.

(56) References Cited

U.S. PATENT DOCUMENTS

| | | | |
|---|---|---|---|
| 4,264,569 A | 4/1981 | Sinha | |
| 4,575,248 A | 3/1986 | Horwitz | |
| 4,733,967 A | 3/1988 | Sommargren | |
| 4,948,254 A | 8/1990 | Ishida | |
| 5,155,363 A | 10/1992 | Steinbichler et al. | |
| 5,392,116 A | 2/1995 | Makosch | |
| 5,404,222 A | 4/1995 | Lis | |
| 5,412,474 A | 5/1995 | Reasenberg et al. | |
| 5,589,938 A | 12/1996 | Deck | |
| 5,663,793 A | 9/1997 | De Groot | |
| 5,760,901 A | 6/1998 | Hill | |
| 5,764,362 A | 6/1998 | Hill et al. | |
| 5,777,741 A | 7/1998 | Deck | |
| 5,838,485 A | 11/1998 | De Groot et al. | |
| 5,883,717 A | 3/1999 | DiMarzio | |
| 5,915,048 A | 6/1999 | Hill et al. | |
| 6,271,923 B1 | 8/2001 | Hill | |
| 6,304,303 B1 | 10/2001 | Yamanaka | |
| 6,304,330 B1 | 10/2001 | Millerd et al. | |
| 6,445,453 B1 | 9/2002 | Hill | |

(Continued)

OTHER PUBLICATIONS

Bobroff, N. "Recent Advances in Displacement Measuring Interferometry," *Measurement Science & Tech.* 4(9) 907-926 (1993).

(Continued)

*Primary Examiner*—Tarifur R Chowdhury  
*Assistant Examiner*—Jonathon D Cook  
(74) *Attorney, Agent, or Firm*—Wilmer Cutler Pickering Hale & Dorr LLP

(57) ABSTRACT

A method of operating a wavefront interferometry system that generates an array of interference signals that contains information about relative wavefronts of measurement and reference beams, the method involving: from the array of interference signals, computing a first array of phase measurements for a first time and a second array of phase measurements for a second time; computing a difference of the first and second arrays of phase measurements to determine an array of rates of phase changes; and from the array of rates of phase changes, computing an array of atmospheric turbulence effect values which is a measure of atmospheric turbulence effects in the wavefront interferometry system.

28 Claims, 7 Drawing Sheets

U.S. PATENT DOCUMENTS

| | | | |
|---|---|---|---|
| 6,480,285 | B1 | 11/2002 | Hill |
| 6,552,804 | B2 | 4/2003 | Hill |
| 6,731,570 | B1* | 5/2004 | Langdon ............... 367/149 |
| 6,839,141 | B2 | 1/2005 | Hill |
| 6,847,452 | B2 | 1/2005 | Hill |
| 6,940,602 | B2 | 9/2005 | Dubois et al. |
| 7,084,983 | B2 | 8/2006 | Hill |
| 7,099,014 | B2 | 8/2006 | Hill |
| 7,161,680 | B2 | 1/2007 | Hill |
| 7,355,722 | B2 | 4/2008 | Hill |
| 2001/0024311 | A1* | 9/2001 | Larkin et al. ............ 359/237 |
| 2004/0141185 | A1 | 7/2004 | HIll |
| 2004/0227951 | A1 | 11/2004 | Hill |
| 2004/0246486 | A1 | 12/2004 | Hill |
| 2004/0257577 | A1 | 12/2004 | Hill |
| 2005/0046864 | A1 | 3/2005 | Millerd et al. |
| 2005/0195500 | A1 | 9/2005 | Hill |
| 2006/0033924 | A1 | 2/2006 | Hill |
| 2007/0014319 | A1 | 1/2007 | Hill |
| 2007/0058174 | A1 | 3/2007 | Hill |

OTHER PUBLICATIONS

Bobroff, N. "Residual Errors in Laser Interferomerty from Air Turbulence and Nonlinearity," *Appl. Opt.* 26(13) 2676-2682 (1987).

D'Ariano et al. "Lower Bounds On Phase Sensitivity In Ideal And Feasible Measurements," *Phys. Rev* A 49, pp. 3022-3036 (1994).

deGroot, P. "Vibration in phase-shifting interferometry," *J. Opt. Soc. Am. A* 12 pp. 354-365 (1995).

Estler, W.t. "High-Accuracy Displacement Interferometry In Air" *Appl. Opt.* 24(6) p. 808-815 (1985).

Hariharan, P. et al. "Digital phase-shifting interferometry: a simple error-compensating phase calculation algorithm," *Appl. Opt* 26 pp. 2504-2506 (1987).

International Search Report, International Application No. PCT/US06/31066, mailed Nov. 19, 2007 (2 pgs).

International Search Report, International Application No. PCT/US06/33256, mailed Feb. 27, 2008 (2 pages).

Ishida, "Two Wavelength Displacement-Measuring Interferometer Using Second-Harmonic Light to Eliminate Air-Turbulence-Induced Errors" *Jpn. J. Appl. Phys.* 28 (3), L473-475 (1989).

Jones, F. "The Refractivity of Air" *J. Res. NBS* 86(1) p. 27 (1981).

Schwider et al. "Digital wave-front measuring interferometry: some systematic error sources," *Appl. Opt.* 22, pp. 3421-3432 (1983).

Zanoni, C. "Differntial Interferometer Arrangements For Distance And Angle Measurements: Principles, Advantages and Applications" *VDI Berichte* NR. 749, pp. 93-106 (1989).

Zhu et al. "Long-Arm Two-Color Interfermoter For Measuring the Change of Air Refractive Index" *Optics in Complex Systems*, p. 538-539 (1990).

* cited by examiner ent time
APPARATUS AND METHOD FOR MEASUREMENT AND COMPENSATION OF ATMOSPHERIC TURBULENCE EFFECTS IN WAVEFRONT INTERFEROMETRY This application claims the benefit of U.S. Provisional Application No. 60/711,952, filed Aug. 26, 2005, which is incorporated herein by reference.

RELATED APPLICATIONS

U.S. Ser. No. 11/204,758, filed Aug. 16, 2005, entitled "Apparatus and Method for Joint and Time Delayed Measurements of Components of Conjugated Quadratures of Fields of Reflected/Scattered Beams by an Object in Interferometry"; U.S. Ser. No. 11/463,036, filed Aug. 8, 2006, entitled "Apparatus and Methods for Reduction and Compensation of Effects of Vibrations and of Environmental Effects in Wavefront Interferometry"; U.S. Ser. No. 11/457,025, filed Jul. 12, 2006, entitled "Continuously Tunable External Cavity Diode Laser Sources with High Tuning Rates and Extended Tuning Ranges"; and U.S. Ser. No. 60/805,104, filed Jun. 19, 2006, entitled "Continuously Tunable External Cavity Diode Laser Sources with High Tuning and Switching Rates and Extended Tuning Ranges", all of which are incorporated herein by reference.

TECHNICAL FIELD

This invention generally relates to the field of wavefront sensors with applications in the manufacturing of optical elements, the assembly and testing of optical systems, and the manufacturing of multi-layer structures, such as semiconductor wafers and integrated circuits (ICs).

BACKGROUND OF THE INVENTION

Phase-shift interferometry is an established method for measuring a variety of physical parameters ranging from intrinsic properties of gases to the displacement of objects such as described in a review article by J. Schwider entitled "Advanced Evaluation Techniques In Interferometry," *Progress In Optics* XXVIII, Ed. E. Wolf (Elsevier Science Publishers 1990). The contents of the Schwider article are herein incorporated in their entirety by reference. Interferometric wavefront sensors can employ phase-shift interferometers (PSI) to measure the spatial distribution of a relative phase across an area or two-dimensional section, i.e., to measure a physical parameter across a two-dimensional section.

An interferometric wavefront sensor employing a PSI typically consists of a spatially coherent light source that is split into two beams, a reference beam and a measurement beam, which are later recombined after traveling respective optical paths of different lengths. The relative phase difference between the wavefronts of the two beams is manifested as a two-dimensional intensity pattern or interference signal known as an interferogram. PSIs typically have an element in the path of the reference beam which introduces three or more known phase-shifts. By detecting the intensity pattern with a detector for each of the phase-shifts, the relative phase difference distribution of the reference and measurement beam wavefronts can be quantitatively determined independent of any attenuation in either of the reference or measurement beams.

Phase shifting in homodyne detection methods using phase shifting methods such as piezo-electric driven mirrors have been widely used to obtain high-quality measurements under otherwise static conditions. The measurement of transient or high-speed events have required in prior art either ultra high speed phase shifting, i.e., much faster than the event time scales and corresponding detector read out speeds, or phase shifting apparatus and methods that can be used to acquire the required information by the essentially instantaneous measurements.

Effects of atmospheric turbulence in the reference and measurement paths of a wavefront interferometer reduce fringe contrast and introduce statistical errors in a measured wavefront profile. The essentially instantaneous measurements are used in prior art to reduce the effects of atmospheric turbulence on fringe contrast. However, the technique of the essentially instantaneous measurements of prior art does not reduce the magnitude of the statistical errors. Accordingly, the statistical effects of atmospheric turbulence in wavefront interferometry based on the technique of the essentially instantaneous measurements of prior art are subsequently reduced in the prior art by averaging a number of statistically independent the essentially instantaneous measurements of a wavefront profile.

Several methods of spatial phase shifting have been disclosed in the prior art which are directed to the acquisition of the essentially simultaneous measurements of electrical interference signal values. In 1983 Smythe and Moore described a spatial phase-shifting method in which a series of conventional beam-splitters and polarization optics are used to produce three or four phase-shifted images onto as many cameras for simultaneous detection. A number of US patents such as U.S. Pat. Nos. 4,575,248, 5,589,938, 5,663,793, 5,777,741, and 5,883,717 disclose variations of the Smythe and Moore method where multiple cameras are used to detect multiple interferograms.

One of the disadvantages of these methods is that multiple cameras are required or a single camera recording multiple images and complicated optical arrangements are required to produce the phase-shifted images. The disadvantages and limitations of using multiple cameras or a camera recording multiple images are described and addressed for example in the commonly owned U.S. Provisional Patent Application No. 60/442,858 and U.S. patent application Ser. No. 10/765,368 wherein both are entitled "Apparatus and Method for Joint Measurements of Conjugated Quadratures of Fields of Reflected/Scattered and Transmitted Beams by an Object in Interferometry." Both U.S. Provisional Patent Application No. 60/442,858 and U.S. patent application Ser. No. 10/765,368 are by Henry A. Hill and the contents of each of which are herein incorporated in their entirety by reference.

An alternative technique for the generation of four simultaneous phase-shifted images for a homodyne detection method has also been disclosed by J. E. Millerd and N. J. Brock in U.S. Pat. No. 6,304,330 B1 entitled "Methods And Apparatus For Splitting, Imaging, And Measuring Wavefronts In Interferometry." The technique disclosed in U.S. Pat. No. 6,304,330 B1 uses holographic techniques for the splitting of a beam into four beams. The four beams are detected by a single multi-pixel detector. One consequence of the use of a single multi-pixel detector to record four phase-shifted images simultaneously is a reduction in frame rate for the detector by a factor of approximately four compared to a PSI recording a single phase-shifted image on a single multi-pixel detector with the same image resolution. It is further observed that since the generation of the multiple beams in the technique described in U.S. Pat. No. 6,304,303 B1 is performed on a non-mixed beam of an interferometer, the alternative technique of U.S. Pat. No. 6,304,303 B1 is most readily applicable to for example a Twyman-Green type interferometer.

Another alternative technique for generating the equivalent of multiple simultaneous phase shifted images has also been accomplished by using a tilted reference wave to induce a spatial carrier frequency to a pattern in an interferogram, an example of which is disclosed by H. Steinbichler and J. Gutjahr in U.S. Pat. No. 5,155,363 entitled "Method For Direct Phase Measurement Of Radiation, Particularly Light Radiation, And Apparatus For Performing The Method." This another alternative technique for generating the equivalent of multiple simultaneous phase shifted images requires the relative phase of the reference and measurement field to vary slowly with respect to the detector pixel spacing.

The another alternative technique for generating the equivalent of multiple simultaneous phase shifted images using a tilted reference wave is also used in an acquisition technology product FlashPhase™ of Zygo Corporation. The steps performed in FlashPhase™ are first acquire a single frame of intensity or interferogram, next generate a two-dimensional complex spatial frequency map by a two-dimensional finite Fourier transform (FFT), next generate a filter and use the filter to isolate a first order signal, then invert the filtered spatial frequency map by an inverse two-dimensional FFT to a phase map or wavefront map. Although the acquisition technology product FlashPhase™ is computationally complex, it is very fast on today's powerful computers.

A difficult procedure related to the refractive index of a gas is the compensation of refractive index fluctuations over reference and measurement paths of unknown or variable length and with uncontrolled temperature and pressure. Example situations are in Fizeau and Twyman-Green interferometers and high-precision linear displacement interferometry such as is employed in manufacturing of optical elements and in micro-lithographic fabrication of ICs. See for example an article entitled "Residual Errors In Laser Interferometry From Air Turbulence And Nonlinearity," by N. Bobroff, *Appl. Opt.* 26(13), 2676-2682 (1987) and an article entitled "Recent Advances In Displacement Measuring Interferometry," also by N. Bobroff, *Measurement Science & Tech.* 4(9), 907-926 (1993).

As noted in the aforementioned cited references, interferometric displacement measurements in a gas are subject to environmental uncertainties, particularly to changes in air pressure and temperature; to uncertainties in air composition such as resulting from changes in humidity; and to the effects of turbulence in the gas. Such factors alter the wavelength of the light used to measure the displacement. Under normal conditions the refractive index of air for example is approximately 1.0003 with a variation of the order of $1 \times 10^{-5}$ to $1 \times 10^{-4}$. In many applications the refractive index of air must be known with a relative precision of less than 0.1 ppm (parts per million) to less than 0.001 ppm, these two relative precisions corresponding to a displacement measurement accuracy of 100 nm and less than 1 nm, respectively, for a one meter interferometric displacement measurement.

There are frequent references in the art to heterodyne methods of phase estimation, in which the phase varies with time in a controlled way. For example, in a known form of prior-art heterodyne distance-measuring interferometer, the source emits two orthogonally polarized beams having slightly different optical frequencies (e.g. 2 MHz). The interferometric receiver in this case is typically comprised of a linear polarizer and a photodetector to measure a time-varying interference signal. The signal oscillates at the beat frequency and the phase of the signal corresponds to the relative phase difference. A further representative example of the prior art in heterodyne distance-measuring interferometry is taught in U.S. Pat. No. 4,688,940 issued to G. E. Sommargren and M. Schaham (1987). These known forms of interferometric metrology do not compensate for fluctuations in refractive index of a gas in reference and measurement paths of an interferometer.

One way to detect refractive index fluctuations is to measure changes in pressure and temperature along a measurement path and calculate the effect on the optical path length of the measurement path. Mathematical equations for effecting this calculation are disclosed in an article entitled "The Refractivity Of Air," by F. E. Jones, *J. Res. NBS* 86(1), p 27 (1981). An implementation of the technique is described in an article entitled "High-Accuracy Displacement Interferometry In Air," by W. T. Estler, *Appl. Opt.* 24(6), p 808 (1985). This technique provides approximate values, is cumbersome, and corrects for slow, global fluctuations in air density.

Another, more direct way to detect the effects of a fluctuating refractive index over a reference and/or measurement path is by multiple-wavelength distance measurement. The basic principle may be understood as follows. Interferometers and laser radar measure the optical path length between a reference and an object, most often in open air. The optical path length is the integrated product of the refractive index and the physical path traversed by a beam. In that the refractive index varies with wavelength, but the physical path is independent of wavelength, it is generally possible to determine the physical path length from the optical path length, particularly the contributions of fluctuations in refractive index, provided that the instrument employs at least two wavelengths. The variation of refractive index with wavelength is known in the art as dispersion and this technique is often referred to as the dispersion technique.

An example of a two-wavelength distance measurement system is described in an article by Y. Zhu, H. Matsumoto, T. O'ishi, *SPIE* 1319, Optics in Complex Systems, p 538 (1990), entitled "Long-Arm Two-Color Interferometer For Measuring The Change Of Air Refractive Index." The system of Zhu et al. employs a 1064 nm wavelength YAG laser and a 632 nm HeNe laser together with quadrature phase detection. The interferometer of Zhu et al. has insufficient resolution for applications that require sub-micron displacement interferometry.

An example of a two wavelength high-precision interferometry system for microlithography is represented by U.S. Pat. No. 4,948,254 issued to A. Ishida (1990). A similar device is described by Ishida in an article entitled "Two Wavelength Displacement-Measuring Interferometer Using Second-Harmonic Light To Eliminate Air-Turbulence-Induced Errors," *Jpn. J. Appl. Phys.* 28(3), L473-475 (1989). In the article, a displacement-measuring interferometer is disclosed which eliminates errors caused by fluctuations in the refractive index by means of two-wavelength dispersion detection. However, the motion of the object results in rapid variations in phase that make it difficult to detect accurately the effects of fluctuations in the refractive index.

In U.S. Pat. No. 5,404,222 entitled "Interferometric Measuring System With Air Turbulence Compensation," by S. A. Lis, there is disclosed a two-wavelength interferometer employing the dispersion technique for detecting and compensating refractive index fluctuations. The principal innovation of this system with respect to that taught by Ishida in *Jpn. J. Appl. Phys.* (cited above) is the addition of a second BBO doubling crystal to improve the precision of the phase detection means. The additional BBO crystal makes it possible to optically interfere two beams having wavelengths that are exactly a factor of two different. The resultant interference has a phase that is directly dependent on the refractive index but is substantially independent of stage motion.

The application of multiple wavelength high-precision interferometric techniques to a single axis interferometer introduces considerable complexity and cost. In an application of multiple wavelength high-precision interferometric techniques to wavefront sensors, the considerable complexity and cost is compounded many fold wherein an application of the dispersion interferometric techniques is required for reference and measurement beam paths corresponding to each pixel of a large array of respective detector pixels to compensate for effects of atmospheric turbulence.

In U.S. Pat. No. 5,764,362 entitled "Superheterodyne Method And Apparatus For Measuring The Refractive Index Of Air Using Multiple-Pass Interferometry" by Henry A. Hill and P. de Groot and U.S. Pat. No. 5,838,485 entitled "Superheterodyne Interferometer And Methods For Compensating The Refractive Index Of Air Using Electronic Frequency Multiplication" by Peter de Groot and Henry A. Hill, there are described two two-wavelength distance measuring systems based on superheterodyne techniques. The first of the two cited patents is based on multiple pass interferometry and the second cited patent is based on electronic frequency multiplication. The application of the non-dispersive techniques described in U.S. Pat. Nos. 5,764,362 and 5,838,485 would require complex interferometric optical configurations and/or electronic signal processing for reference and measurement beam paths corresponding to each pixel of a large array of detector pixels of a wavefront sensor.

A non-dispersive apparatus and method for the compensation of atmospheric turbulent effects experienced by linear displacement interferometer is described in U.S. Pat. No. 6,839,141 B2 entitled "Method and Apparatus For Compensation Of Time-varying Optical Properties of Gas In Interferometry" by Henry A. Hill. U.S. Pat. No. 6,839,141 B2 compensates for turbulent effects of the gas on a first beam by using measured effects of the atmospheric turbulence on the directions of propagation of the first beam and a second beam. The application of the non-dispersive technique described in U.S. Pat. No. 6,839,141 B2 to wavefront interferometry would require that angle interferometers be added for the reference and measurement beam paths corresponding to each pixel of a large array of detector pixels of the respective wavefront sensor.

Another non-dispersive apparatus and method for the compensation of turbulent effects of a gas in a linear displacement interferometer is described in U.S. patent application Ser. No. 10/701,759 (Publication No. 20040141185 A1) entitled "Compensation of Refractivity Perturbations In An Interferometer Path" by Henry A. Hill. U.S. patent application Ser. No. 10/701,759 compensates for turbulent effects of the gas on the optical path length of a beam of an interferometer system by using measured transverse differential effects of the atmospheric turbulence at a single wavelength on the relative measurement path lengths of spatially separated first and second beams wherein cells of the gas that pass through the measurement path of the first beam are subsequently transported through the measurement path of the second beam. The transverse differential effects correspond to the difference between two electrical interference signal values from two linear displacement interferometers, respectively, wherein the two electrical interference signal values are obtained simultaneously. The interferometer system also comprises an angle interferometer to monitor changes in orientation of the measurement object in order to compensate for effects of orientation changes in the determination of effects of atmospheric effects on the beam of the interferometer system. The interferometer system further must acquire the surface figure of a measurement object from a different source when the measurement object is scanned during the use of the interferometer system, e.g., a stage mirror of a lithographic tool, in order to correct for effects departures of the measurement object from an assumed figure in the determination of the measured transverse differential effects.

Information about of effects of atmospheric turbulence are obtained in U.S. patent application Ser. No. 10/701,759 by the examination of measured transverse differential effects as a function of time, compensation for effects of changes in orientation of the measurement object, and subsequent summation or integration with respect to time of the transverse differential effects compensated for the effects of changes in orientation of the measurement object. The time period required for measuring and summing or integration with respect to time of the transverse differential effects compensated for effects of changes in orientation of the measurement object must be long compared to a characteristic time for changes of effects of atmospheric turbulence in order to achieve a statistically significant reduction of effects of atmospheric turbulence, e.g., the time period can be of the order of a second or longer. In applications such as to stage position metrology systems of lithographic tools where the respective stage mirror positions are monitored continuously, the long time period will generally not affect the throughput of the lithographic tool. However, in an application to wavefront interferometry where continuous monitoring of the respective measurement object is not typically part of a procedure for testing a measurement object surface, the required the time period may lead to a reduction of throughput. Also as a consequence of a property noted in the preceding paragraph, an application of U.S. patent application Ser. No. 10/701,759 to wavefront interferometry will encounter a difficult inverse problem: the wavefront for which information is being sought must be known prior to determination of the information in order to compensate for atmospheric turbulence effects while compensation for atmospheric turbulence effects must be performed in order to obtain the wavefront information.

The statistical accuracy to which the effects of atmospheric turbulence are determined in U.S. patent application Ser. No. 10/701,759 is directly related to the length of the time period and to information about atmospheric turbulence effects obtained from two column densities of gas corresponding to the reference and measurement beam paths of the first and second beams.

It is evident from the preceding material that a non-dispersive technique for the compensation of atmospheric turbulence effects in wavefront interferometry with improved statistical accuracy and which does not introduce complexities of dispersive techniques of prior art would be beneficial. It is further evident that it would be beneficial if the non-dispersive technique would meet these conditions with respect to complexity without the requirement of additional measurements or substantial additional measurements beyond that required for generating a measured array of conjugated quadratures representing a relative wavefront measurement, i.e. did not require additional time or substantial time beyond that required to obtain an array of conjugated quadratures representing a relative wavefront measurement.

SUMMARY OF THE INVENTION

A non-dispersive interferometric apparatus and method are described for measurement and compensation of atmospheric turbulence effects and other changes on properties of a gas on accuracy of interferometric measurements of wavefront interferometry. The atmospheric turbulence effects and other changes affect the refractivity of the gas in the reference and/or measurement paths of the interferometer and hereinafter are referred to simply as atmospheric turbulence effects. The apparatus and method is applicable to wavefront sensors such as Fizeau and Twyman-Green interferometers.

The non-dispersive interferometric apparatus and method of various embodiments described herein generate measurements of a temporal first derivative of atmospheric turbulence effects on an array of reference and measurement beam paths in an interferometer system. A contemporaneous measurement of atmospheric turbulence effects on measurements of relative wavefronts by the interferometer system is generated by a two dimensional inversion of the temporal first derivative of the atmospheric turbulence effects. The two-dimensional domain of the two dimensional inversion corresponds to two scales determined by the corresponding two-dimensional size of the wavefront being measured. The contemporaneously measured values of atmospheric turbulence effects are used in a procedure for compensating the atmospheric turbulence effects on the measurements of relative wavefronts.

The temporal first derivative of atmospheric turbulence effects are measured with a wavefront interferometer such as a Fizeau or a Twyman-Green interferometer using measured differential temporal effects of the atmospheric turbulence wherein the flow of a gas in the reference and measurement beam paths has a non zero component perpendicular to the reference and measurement beam paths of the wavefront interferometer. Measurements of the differential effects are made at the same wavelength that is used in the wavefront interferometer to measure the respective wavefront. However, the differential effects of the non-dispersive technique could be made at a wavelength that is different from the wavelength used in the wavefront interferometer to measure the respective wavefront.

The statistical accuracy of the measured atmospheric turbulence effects is determined in part by the size of the two-dimensional domain of two-dimensional inversion for a single measurement of the atmospheric turbulence effects and in part by the spatial frequencies of the atmospheric turbulence effects.

Compensation for environmental changes are made in part in various embodiments of the present invention by using apparatus and procedures described in commonly owned U.S. Provisional Patent Application No. 60/706,268 and U.S. patent application Ser. No. 11/463,036 wherein each is entitled "Apparatus and Methods for Reduction and Compensation of Effects of Vibrations and of Environmental Effects in Wavefront Interferometry." Provisional Patent Application No. 60/706,268 and U.S. patent application Ser. No. 11/463, 036 are both by Henry A. Hill and the contents of each of which are herein incorporated in their entirety by reference.

The apparatus and methods described herein are applicable on-line to metrology tools during the normal processing cycle of measurement objects, e.g. surfaces of optical elements and wafers.

Effects of turbulence and other changes on the refractivity of the gas are measured and compensated by a factor $\geq 10$ that exhibit spatial frequencies of the order of or less than the inverse of a transverse spatial resolution, i.e. a transverse spatial wavelength measured in a direction perpendicular to the direction of reference and measurement beam paths, determined by pixel-to-pixel spacing of a multi-pixel detector used to generate an array of electrical interference signal values. There is an effective long wavelength cut-off in the measurement and compensation at a transverse spatial wavelength of the order of a scale determined by the size of the array of pixels in the transverse directions used in generation of the array of electrical interference signal values. The scale corresponding to the effective long wavelength cut-off for the measurement and compensation is complimentary to the effects of turbulence and other changes that can be measured and compensated by use of measurements of environmental conditions, e.g. by use of a wavelength monitor or monitors.

In general, in one aspect, the invention features a wavefront interferometry system including: a wavefront interferometer that during operation combines a reference beam from a reference object and a return measurement beam from a measurement object to generate a combined beam; a detector system for receiving the combined beam and generating therefrom an array of interference signals; and a processor system programmed to process the array of interference signals and to compute therefrom a first array of phase measurements for a first time and a second array of phase measurements for a second time, to compute a difference of the first and second arrays of phase measurements to determine an array of rates of phase changes, and from the array of rates of phase changes to compute an array of atmospheric turbulence effect values which is a measure of atmospheric turbulence effects in the wavefront interferometer.

Other embodiments include one or more of the following features. The processor system is further programmed to subtract the array of atmospheric turbulence effect values from an array of phase measurements obtained from the array of interference signals to thereby remove the effects of atmospheric turbulence from phase measurements produced by the wavefront interferometry system. The wavefront interferometer is a Fizeau interferometer or a Twyman-Green interferometer. The detector system includes an array of detector elements. The array of interference signals is a two-dimensional array of interference signals and the first and second arrays of phase measurements are both two-dimensional arrays. The processor system is programmed to compute the array of atmospheric turbulence effect values by inverting the array of rates of phase changes. During operation the wavefront interferometer includes a gas through which the reference and return measurement beams pass and the processor system is further programmed to compute the array of atmospheric turbulence effect values by dividing values derived from the inverted array of rates of phase changes by corresponding values for a speed of the gas. The wavefront interferometry system also includes gas flow monitors within the wavefront interferometer and the processor system is further programmed to determine components of velocity of the gas from gas flows measured by the gas flow monitors, wherein the corresponding values for the speed of the gas are derived from the determined components of velocity of the gas. Alternatively, the processor system is further programmed to determine components of velocity of the gas by employing a cross-correlation technique and computed arrays of rates of phase changes derived from the array of interference signals, wherein the corresponding values for the speed of the gas are derived from the determined components of velocity of the gas. The array of rates of phase changes is an array of temporal first derivatives of the atmospheric turbulence effects. The array of phase measurements from which the array of atmospheric turbulence effect values is subtracted is obtained concurrently with either the first array of phase measurements or the second array of phase measurements. The array of phase measurements from which the array of atmospheric turbulence effect values is subtracted is selected from the group consisting of the first array of phase measurements and the second array of phase measurements. The processor system includes a controller that controls the operation of the wavefront interferometer. The processor system is programmed to use the array of interference signals to determine conjugated quadratures of fields of the return measurement beam. The processor system controls the wavefront interferometer and is programmed to process the array of interference signals by employing a multiple-homodyne technique.

In general, in another aspect, the invention features a method of operating a wavefront interferometry system. The method involves: combining a reference beam from a reference object and a return measurement beam from a measurement object to generate a combined beam; receiving the combined beam and generating therefrom an array of interference signals; based on the array of interference signals, computing a first array of phase measurements for a first time and a second array of phase measurements for a second time; computing a difference of the first and second arrays of phase measurements to determine an array of rates of phase changes; and from the array of rates of phase changes, computing an array of atmospheric turbulence effect values which is a measure of atmospheric turbulence effects in the wavefront interferometry system.

Other embodiments include one or more of the following features. The method further involves subtracting the array of atmospheric turbulence effect values from an array of phase measurements obtained from the array of interference signals to thereby remove the effects of atmospheric turbulence from phase measurements produced by the wavefront interferometry system. The array of interference signals is a two-dimensional array of interference signals and the first and second arrays of phase measurements are both two-dimensional arrays. Computing the array of atmospheric turbulence effect values involves inverting the array of rates of phase changes. During operation the wavefront interferometer includes a gas through which the reference and return measurement beams pass, and the method further involves computing the array of atmospheric turbulence effect values by dividing values derived from the inverted array of rates of phase changes by corresponding values for a speed of the gas. The method further involves: measuring gas flows within the wavefront interferometer; from the measured gas flows, determining components of velocity of the gas, wherein said corresponding values for the speed of the gas are derived from the determined components of velocity of the gas. Alternatively, the method involves determining components of velocity of the gas by employing a cross-correlation technique and computed arrays of rates of phase changes derived from the array of interference signals, wherein the corresponding values for the speed of the gas are derived from the determined components of velocity of the gas. The array of rates of phase changes is an array of temporal first derivatives of the atmospheric turbulence effects. The array of phase measurements from which the array of atmospheric turbulence effect values is subtracted is obtained concurrently with either the first array of phase measurements or the second array of phase measurements. Or, the array of phase measurements from which the array of atmospheric turbulence effect values is subtracted is selected from the group consisting of the first array of phase measurements and the second array of phase measurements. The processor system computes the first and second arrays of phase measurements by using the array of interference signals to determine conjugated quadratures of fields of the return measurement beam.

In general, in yet another aspect, the invention features a method of operating a wavefront interferometry system that generates an array of interference signals that contains information about relative wavefronts of measurement and reference beams. The method involves: from the array of interference signals, computing a first array of phase measurements for a first time and a second array of phase measurements for a second time; computing a difference of the first and second arrays of phase measurements to determine an array of rates of phase changes; and from the array of rates of phase changes, computing an array of atmospheric turbulence effect values which is a measure of atmospheric turbulence effects in the wavefront interferometry system.

An advantage of at least one embodiment of the present invention is the acquisition of information about the effects and the compensation for the effects of atmospheric turbulence in wavefront interferometry.

Another advantage of at least one embodiment of the present invention is the acquisition of information about the effects and the compensation for the effects of atmospheric turbulence with improved statistical accuracy.

Another advantage of at least one embodiment of the present invention is that the statistical accuracy of information obtained about effects and of the compensation for effects of atmospheric turbulence is based in part on information from a volume of gas with a cross-sectional area corresponding to the cross-sectional area of a wavefront being measured.

Another advantage of at least one embodiment of the present invention is that measurement of atmospheric effects can be achieved in the same time period required for measurement of a corresponding relative wavefront of a reference beam and a measurement beam.

Another advantage of at least one embodiment of the present invention is the reduction of the effects of vibration and environmental changes by the operation in a reference frame wherein the optical path length between a spot on a reference object and a corresponding spot on a measurement object is maintained a constant value mod $2\pi$ at a reference frequency of an optical beam.

Another advantage of at least one embodiment of the present invention is that it exhibits an intrinsic reduced sensitivity to the effects of vibrations and environmental changes.

Another advantage of at least one embodiment of the present invention is that it enables procedures for compensation of effects of the vibrations and environmental changes that appear as cyclic errors.

Another advantage of at least one embodiment of the present invention is the reduction of the effects of vibrations and environmental changes by the control of the physical path length difference between the corresponding spots on the reference and measurement objects.

Another advantage of at least one embodiment of the present invention is that the signal-to-noise ratios obtained operating in the reference frame are generally greater than the signal-to-noise ratios obtained when not operating in the reference frame such as with prior art techniques for generating simultaneous multiple phase shifted images in the presence of vibrations and environmental changes.

Another advantage of at least one embodiment of the present invention is that a one-, two- or three-dimensional image of a substrate may be obtained by an interferometric metrology system when operating in a scanning mode with a relatively fast scan rate. The image comprises a one-, a two-, or a three-dimensional array of conjugated quadratures of reflected and/or scattered or transmitted fields.

Another advantage of at least one embodiment of the present invention is that information used in the determination of a conjugated quadratures of reflected and/or scattered or transmitted fields by a substrate is obtained jointly or effectively obtained jointly, i.e., simultaneously or at the same average times, respectively.

Another advantage of at least one embodiment of the present invention is that the conjugated quadratures of fields that are obtained jointly when operating in the scanning mode and using either the bi-homodyne or quad-homodyne detection methods have reduced sensitivity, i.e., only in second and higher order effects, to effects of pinhole-to-pinhole variations in the properties of a conjugate set of pinholes used in a confocal microscopy system that are conjugate to a spot in or on the substrate being imaged at different times during the scan.

Another advantage of at least one embodiment of the present invention is that the conjugated quadratures of fields that are obtained jointly when operating in the scanning mode and using either the bi-homodyne or the quad-homodyne detection methods have reduced sensitivity, i.e., only in second and higher order effects, to effects of pixel-to-pixel variation of properties within a set of conjugate pixels that are conjugate to a spot in or on the substrate being imaged at different times during the scan.

Another advantage of at least one embodiment of the present invention is that the conjugated quadratures of fields that are obtained jointly when operating in the scanning mode and using either the bi-homodyne or the quad-homodyne detection methods can have reduced sensitivity, i.e., only in second and higher order effects, to effects of pulse to pulse variations of a respective set of pulses or pulse sequences of an input beam to the interferometer system.

Another advantage of at least one embodiment of the present invention is an increased throughput for an interferometric metrology system with respect to the number of spots in and/or on a substrate imaged per unit time.

Another advantage of at least one embodiment of the present invention is reduced systematic errors in a one-, a two-, or a three-dimensional image of a substrate obtained in interferometric metrology systems.

Another advantage of at least one embodiment of the present invention is reduced sensitivity, i.e., only in second and higher order effects, to an overlay error of a spot in or on the substrate that is being imaged and a conjugate image of a conjugate pixel of a multi-pixel detector during the acquisition of the respective electrical interference values for each spot in and/or on a substrate imaged using interferometric metrology systems. Overlay errors are errors in the set of four conjugate images of a respective set of conjugate detector pixels relative to the spot being imaged for either the bi-homodyne or quad-homodyne detection methods.

Another advantage of at least one embodiment of the present invention is that the phase of an input beam component does not affect values of measured conjugated quadratures when operating in a frequency or temporal encoded mode of either the bi-homodyne or quad-homodyne detection methods.

Another advantage of at least one embodiment of the present invention is the measurement of relative changes in position, orientation, and/or deformation between the reference and measurement objects based on phase measurements mod $2\pi$.

Another advantage of at least one embodiment of the present invention is the compensation for the residual effects of vibration and environmental changes including the effects of rotation and deformation in measured arrays of conjugated quadratures.

Another advantage of at least one embodiment of the present invention is the control of the relative positions, orientations, and/or deformations of the reference and measurement objects using the measurements of relative changes in positions, orientations, and/or deformations between the reference and measurement objects based on phase measurements mod $2\pi$.

The details of one or more embodiments of the invention are set forth in the accompanying drawings and the description below. Other features, objects, and advantages of the invention will be apparent from the description and drawings, and from the claims.

DETAILED DESCRIPTION

Figure 1A:
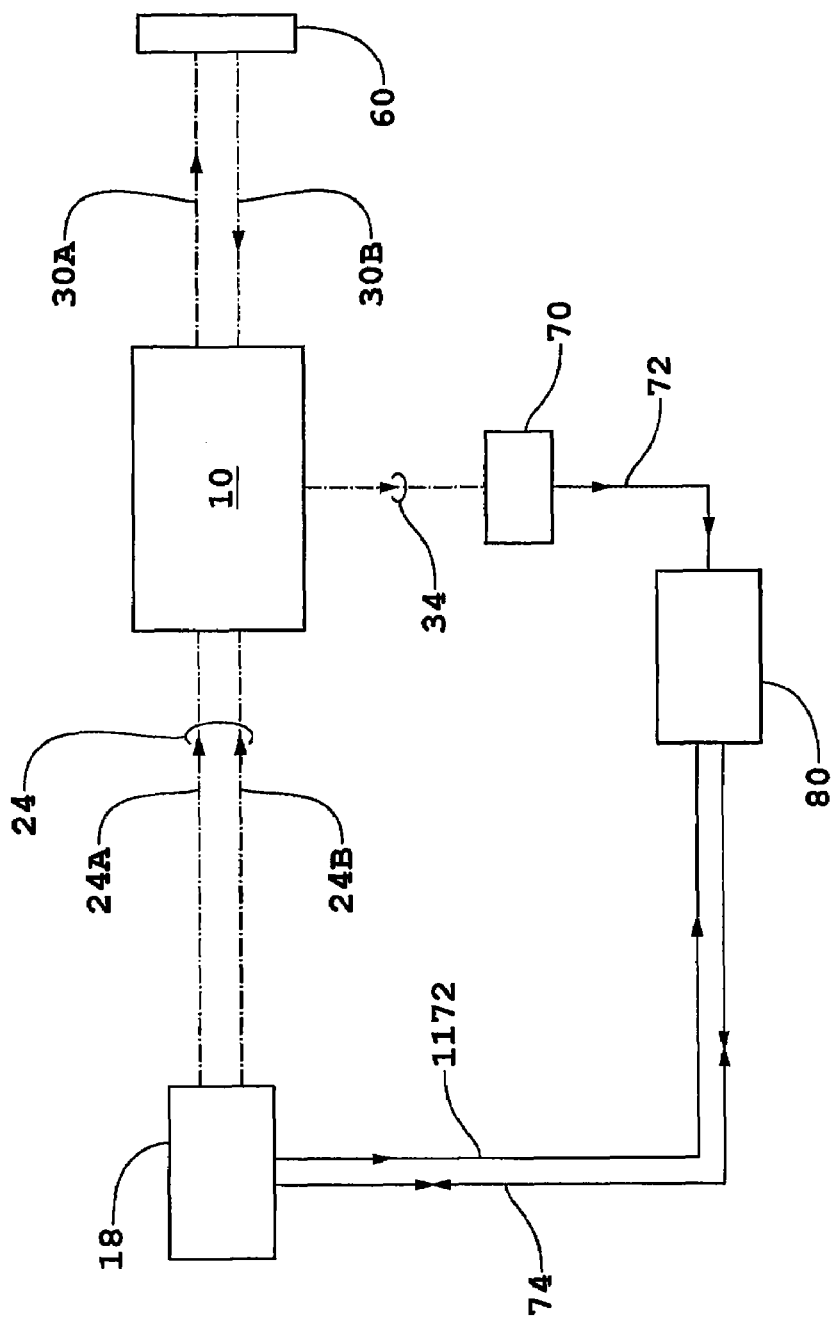
FIG. 1a is a diagram of an interferometric metrology system that uses homodyne detection methods.

High speed, high resolution, and high precision imaging with high signal-to-noise ratios are required in inspection of surfaces of optical elements, optical assemblies, and masks and wafers in microlithography. One technique for obtaining high resolution imaging with high signal-to-noise ratios is an interferometric metrology system. However, the acquisition of high signal-to-noise ratios with the high resolution imaging generally limits data rates in part by the necessity to acquire conjugated quadratures of fields of a reflected and/or scattered or transmitted beam for each spot in and/on a substrate being imaged. The determination of conjugated quadratures requires the measurement of at least three electrical interference signal values for the each spots in and/or on the substrate being imaged (see Section 7 of the article by Schwider, ibid.).

Acquisition of the at least three interference signal values for each spot places tight restrictions on acceptable levels of vibration, environmental changes, and atmospheric turbulence and on how large a rate of scan can be employed in generation of images of measurement objects having artifacts down to of the order of 100 nm in size or smaller. Various embodiments of the present invention relax the tight restriction on levels of vibration, environmental changes, and/or atmospheric turbulence for applications of multiple-homodyne detection methods as a consequence of a reduction and/or compensation for effects of vibrations, environmental changes, and/or atmospheric turbulence. Various embodiments of the present invention further reduce the statistical error of atmospheric turbulence effects introduced in measured wavefronts for applications of multiple-homodyne detection methods and in methods that generate the essentially instantaneous measurements of multiple phase-shifted images.

A general description of various embodiments of the present invention is first given wherein effects of vibration and environmental changes are reduced in measured quantities, e.g., the effects on fringe contrast are reduced in a given array of measured electrical interference signal values, and the resulting residual effects of vibration, environmental changes, and atmospheric turbulence subsequently compensated. Arrays of phases obtained from corresponding arrays of conjugated quadratures that contain information about relative wavefronts of reference and measurement beams are measured in various embodiments of the present invention with respective first order effects of vibration and environmental changes eliminated or significantly reduced. In addition corresponding arrays of rates of phase changes of the array of phases of corresponding arrays of conjugated quadratures are measured with respective first order effects of vibration and environmental changes eliminated or significantly reduced. The respective first order effects of vibration and environmental changes for the arrays of phases and the corresponding arrays of rates of phase changes are distinct one from the other, i.e., not the same quantities. Thus the arrays of phases contain errors which correspond to respective even and higher order effects of vibration and environmental changes and the arrays of rate of phase changes contain errors which correspond to respective even and higher order effects for the rate of change of effects of vibration and environmental changes.

The arrays of phases and the arrays of rate of phase changes may be obtained from a common set of arrays of measured electrical interference signal values when using a multiple-homodyne detection technique. The average time associated with an array of phases and the average time associated with a corresponding array of rate of phase changes may be the same or different depending on the methods used to acquire the respective information.

The residual first, second, and higher order effects of vibrations and environmental changes are determined and removed to certain levels from each of the two arrays. The resulting array of rate of phase changes is a two-dimensional array of rate of random or stochastic phase changes. The two-dimensional array of rate of stochastic phase changes are the result of atmospheric turbulence effects including the effects of non-uniform gas composition plus statistical errors arising in part in the detection process and signal processing of electrical interference signal values. Herein after, atmospheric turbulence effects including the effects of non-uniform gas composition will be referred to as atmospheric turbulence effects.

The contribution of atmospheric turbulence to the two-dimensional array of rate of stochastic phase changes corresponds principally to a first derivative with respect to time of the effects of atmospheric turbulence. The first derivatives are measured with an intrinsic reduced sensitivity to higher order effects. The first derivative with respect to time of the effects of atmospheric turbulence are related by a speed of gas flow to the first derivative of the effects with respect to a spatial coordinate that is parallel to a local component of the velocity of the gas flow that is on the average orthogonal to the respective reference or measurement beam path. The speed of gas is the magnitude of the component of the velocity. The direction of the component of the velocity and the speed of the gas flow will in general be functions of the location in the array of rate of stochastic phase changes and on the longitudinal position in the reference and measurement beam paths.

The measured two-dimensional array of rate of stochastic phase changes is first inverted to obtain a two-dimensional array of stochastic phase changes multiplied by the respective average velocity of gas flow and second the two-dimensional array of stochastic phase changes multiplied by the respective average velocity of gas flow is divided by the respective average velocity of gas flow to obtain a measured two-dimensional array of stochastic phase changes. The respective average velocity of gas flow is parallel to the corresponding the two-dimensional array of stochastic phase changes multiplied by the respective average velocity of gas flow. There are different procedures that may be used for the inversion of the measured two-dimensional array of rate of stochastic phase changes. A general procedure applicable to a non-uniform average gas flow velocity and two examples of procedures for a uniform average gas flow velocity are described herein. The first and second procedures are applicable to the inversion of the measured two-dimensional array of rate of stochastic phase changes where the average velocity of the gas flow is constant across a wavefront and the cross-sectional shapes of respective wavefronts are rectangular and circular, respectively. The determined two-dimensional array of the stochastic phase changes are subsequently subtracted from the measured array of phases of the array of corresponding conjugated quadratures to compensate for atmospheric turbulence effects.

The measured arrays of conjugated quadratures may be obtained using the multiple-homodyne detection techniques described herein or the techniques of the essentially instantaneous measurements of prior art cited herein such as U.S. Pat. Nos. 4,575,248, 5,155,363, 5,589,938, 5,663,793, 5,777,741, 5,883,717, and 6,304,330 B1.

The effect $\psi_j$ of a gas in the measurement and reference beam paths for measurement and reference paths associated with pixel j is equal to the integration of the refractivity $\delta(x',y',z',t) = [n(x',y',z',t)-1]$ over the respective volumes of the measurement and reference beam paths, i.e., $$\psi_j(t) = \int_j \delta(x', y', z', t) dx' dy' dz'. \quad (1)$$

The effect $\psi_j$ includes the effects of turbulence and non-isotropic distributions of gas composition.

The effects of a non-isotropic distribution of the gas composition are first developed for a gas comprising two components. The results for an arbitrary number of components can than be obtained by induction from the results derived for the case of two components. In order to track the effects of a non-isotropic distribution of the gas composition in measurement and reference beam paths j, it is most convenient to work with the specific refractivity $$\tilde{\delta} \equiv \frac{\delta}{\rho} \quad (2)$$

of a component of a gas where $\rho$ is the density of the gas component. The Lorentz-Lorenz relation for a mixture of two gas components a and b may to a very good condition be written as $$\delta = \rho_a \tilde{\delta}_a + \rho_b \tilde{\delta}_b \qquad (3)$$

where the subscripts a and b denote the respective components [see for example the article entitled "Investigation of the Invariance of Atmospheric Dispersion with a Long-Path Refractometer" by K. E. Erickson *JOSA* 52, pp 777-780 (1962)]. Eq. (1) rewritten in terms of specific refractivities is $$\psi_j(t) = \int_j [\rho_a(x', y', z', t)\tilde{\delta}_a + \rho_b(x', y', z', t)\tilde{\delta}_b] dx' dy' dz'. \qquad (4)$$

The temporal derivative of $\psi_j$, i.e., $\partial\psi_j/\partial t$, is measured using homodyne detection methods. The bi-homodyne detection method of the first embodiment of the present invention is a variant of the bi-homodyne detection methods described in referenced U.S. Provisional Patent Application No. 60/442,858, U.S. patent application Ser. No. 10/765,368, US Provisional Patent Application No. 60/706,268, and U.S. patent application Ser. No. 11/463,036. The variants of the bi-homodyne detection methods described herein are configured such that measured values of the two-dimensional arrays of phases that include effects of $\psi_j$ are accurate up to second and higher order terms, e.g., second order terms of the type $(\partial\psi_j/\partial t)^2\tau^2$ and $(\partial^2\psi_j/\partial t^2)\tau^2$, where $\tau$ is a time scale set by the homodyne detection used to acquire the measured arrays of phases. The variants of the bi-homodyne detection methods are also configured such that measured values of $(\partial\psi_j/\partial t)$ obtained from the same arrays of electrical interference signal values used to obtain the measured arrays of phases that include $\psi_j$ are also accurate up to second and higher order terms, e.g., second order terms of the type $(\partial^2\psi_j/\partial t^2)(\partial\psi_j/\partial t)\tau^2$ and $(\partial^3\psi_j/\partial t^3)\tau^2$. For the variants of the bi-homodyne detection methods and for the bi-homodyne detection methods used in certain embodiments herein, a typical value for $\tau$ is the inverse of the frame rate of a respective CCD detector.

In certain other embodiments, the value of $\tau$ can be essentially zero, e.g., less than a µs, for measurement of the array of phases when the array of phases is obtained by the essentially instantaneous phase measurement techniques referenced herein. However, for both the multiple-homodyne and the essentially instantaneous phase measurement techniques, the corresponding typical value of $\tau$ for the measurement of the arrays of rate of changes of phases is the inverse of the frame rate of a respective CCD detector.

The rate of corresponding change of atmospheric or gas effects which are expressed by Eq. (4) is given by the formula $$\frac{\partial\psi_j(t)}{\partial t} = \int_j \left[\frac{\partial\rho_a}{\partial t}(x', y', z', t)\tilde{\delta}_a + \frac{\partial\rho_b}{\partial t}(x', y', z', t)\tilde{\delta}_b\right] dx' dy' dz'. \qquad (5)$$

The conservation of mass is given by the equation $$\frac{\partial\rho}{\partial t} + \{\nabla \cdot [u(x', y', z', t)\rho(x', y', z', t)]\} = 0 \qquad (6)$$

where $u(x',y',z',t)$ is the velocity of the gas and $\nabla \cdot s$ is the divergence of vector s. With the use of Eq. (6) for each of gas components a and b, Eq. (5) is rewritten as $$\frac{\partial\psi_j}{\partial t} = -\int_j \{\nabla \cdot u[\rho_a(x', y', z', t)\tilde{\delta}_a + \rho_b(x', y', z', t)\tilde{\delta}_b]\} dx' dy' dz' \qquad (7)$$

where it is assumed that the velocities of gas components a and b are the same.

The integral on the right hand side of Eq. (7) is reorganized to obtain the following result:

$$\frac{\partial\psi_j}{\partial t} = -\int_j \frac{\partial}{\partial x'}\left\{\iint_j u_{x'}[\rho_a(x', y', z', t)\tilde{\delta}_a + \rho_b(x', y', z', t)\tilde{\delta}_b] dy' dz'\right\} dx' - \qquad (8)$$

$$\int_j \frac{\partial}{\partial y'}\left\{\iint_j u_{y'}[\rho_a(x', y', z', t)\tilde{\delta}_a + \rho_b(x', y', z', t)\tilde{\delta}_b] dx' dz'\right\} dy' -$$

$$\int_j \frac{\partial}{\partial z'}\left\{\iint_j u_{z'}[\rho_a(x', y', z', t)\tilde{\delta}_a + \rho_b(x', y', z', t)\tilde{\delta}_b] dx' dy'\right\} dz'.$$

The third term on the right hand side of Eq. (8) is equal to zero because $u_{z'}=0$ at the limits of integration in z'.

For the case where the x and y dimensions of the measurement and reference beam paths j are much less than the corresponding scales of rates of change of the double integration factors in Eq. (8), the remaining two terms in Eq. (8) are written to a good approximation as $$\frac{\partial\psi_j}{\partial t} = -\nabla_\perp \cdot \int_j \{u_\perp[\rho_a(x', y', z', t)\tilde{\delta}_a + \rho_b(x', y', z', t)\tilde{\delta}_b]\} dx' dy' dz' \qquad (9)$$

where $\nabla_\perp$ and $u_\perp$ the respective transverse components, i.e., components that are orthogonal to the z axis. In a next step, Eq. (9) is written in terms of a local average value $\langle u_j \rangle_\perp$ of $u_\perp$, an average over the volume of the reference and measurement beam paths j as $$\frac{\partial\psi_j}{\partial t} = \qquad (10)$$

$$-\nabla_\perp \cdot \langle u_j \rangle_\perp \int_j [\rho_a(x', y', z', t)\tilde{\delta}_a + \rho_b(x', y', z', t)\tilde{\delta}_b] dx' dy' dz' -$$

$$\nabla_\perp \cdot \int_j [(u_\perp - \langle u_j \rangle_\perp)[\rho_a(x', y', z', t)\tilde{\delta}_a + \rho_b(x', y', z', t)\tilde{\delta}_b]]$$

$$dx'_j dy'_j dz'$$

or with the definition of $\psi_j$ given by Eq. (4) as $$\frac{\partial\psi_j}{\partial t} \cong -\nabla_\perp \cdot \langle u_j \rangle_\perp \psi_j - \nabla_\perp \cdot \int_j \left[\begin{array}{c}(u_\perp - \langle u_j \rangle_\perp) \\ [\rho_a(x', y', z', t)\tilde{\delta}_a + \\ \rho_b(x', y', z', t)\tilde{\delta}_b]\end{array}\right] dx'_j dy'_j dz'. \qquad (11)$$

Average velocity $\langle u_j \rangle_\perp$ is in general a function of $x_j$ and $y_j$, i.e., a function of j and the value of $\langle u_j \rangle_\perp$ is selected such that statistically or on the average $$\nabla_\perp \cdot \sum_{m=1} \int_j \left\{ \frac{(u_\perp - \langle u_j \rangle_\perp)}{\left[ \rho_a(x', y', z', t)\tilde{\delta}_a + \rho_b(x', y', z', t)\tilde{\delta}_b \right]} \right\} dx'_j dy'_j dz'_j = 0. \quad (12)$$

By the definition of $\langle u_j \rangle_\perp$ using the condition expressed by Eq. (12), first order effects of treating velocity $u_\perp$ as a constant over the volume of integration for measurement and reference paths j can be reduced or eliminated and only second order effects related to the variance of $(u_\perp - \langle u_j \rangle_\perp)$, i.e., the weighted average of $(u_\perp - \langle u_j \rangle_\perp) \cdot (u_\perp - \langle u_j \rangle_\perp)$, and higher order effects remain in representing $\partial \psi_j / \partial t = -\nabla_\perp \cdot \langle u_j \rangle_\perp \psi_j$. This is an important advantage. By induction, the term $-\nabla_\perp \cdot \langle u_j \rangle_\perp \psi_j$ on the right hand side of Eq. (11) is extended to include an arbitrary number of gas components.

Determination of $\langle u_j \rangle_\perp$

The components of velocity $u_\perp$ can be determined in several different ways. For example, the gas velocity can be monitored empirically using one or more gas flow meters. The measured values of $u_\perp$ are then fit with a function comprising for example orthogonal polynomials or a power series in x and y and the function used to compute $\langle u_j \rangle_\perp$.

Gas velocity data can also be determined using computational methods in conjunction with measured boundary condition type of information. An example of a computational method is to determine the gas velocity using commercial computational fluid dynamics programs with input data such as from the gas flow meters. One example of such a program is Star-CD, available from the CD-adapco Group (Melville, N.Y.). In general, computational fluid dynamics solve fluid dynamics problems in complex systems by solving one or more sets of differential equations relating parameters of the fluid (e.g., density, temperature) at a set of discrete locations and times within the system.

The set of discrete locations, often referred to as a mesh, is usually defined according to the physical structure of the system. The differential equation(s) usually requires a set of user-defined boundary values describing, e.g., initial system conditions to be entered prior to solving. These can include boundary conditions for any parameter, such as a velocity profile, an initial temperature profile, or the temperature of certain portions of the mesh. Accordingly, by determining an appropriate mesh and entering boundary conditions, one can computationally determine values of the gas velocity and/or other parameters at different locations in the measurement and reference beam paths.

Gas velocity data can also be determined based on the interferometry measurements themselves or interferometry measurements different from the interferometers in various embodiments of the present invention. Consider the cross-correlation coefficients of measured values of $\partial \psi_j / \partial t$, i.e., $$C_{j,j'}(t') = \left\langle \left[ \frac{\partial \psi_j(, t+t')}{\partial t} \right] \left[ \frac{\partial \psi_{j'}(, t)}{\partial t} \right] \right\rangle \quad (13)$$

where the average of the right hand side of Eq. (13) is over a subsection of the domain of the space tracked by j.

The basis of the cross-correlation procedure may be understood heuristically by representing the gas turbulence as an ensemble of cells of gas that move across the reference and measurement beam paths in an interferometer. The cells of gas generally comprise angular momentum with weak dissipative mechanisms. As a result of the angular momentum and weak dissipative mechanisms, the cells generally have a relatively long life time compared to the time it takes a cell to pass a point in space. Because of the relative long life time of the cells, the observed changes in effects of atmospheric turbulence are to a good approximation due primarily to transport of the cells across the measurement and reference beam paths and not due to evolution of the cell.

Because of the relatively long life time of the structure of the atmospheric turbulence, the cross-correlation coefficients will exhibit structure determined by the characteristic time it takes the cells to pass from one measurement and reference beam paths to another measurement and reference beam paths. The direction in which $C_{j,j'}(t')$ is a maximum corresponds to the direction of the corresponding $\langle u_j \rangle_\perp$ and the value of t' for a corresponding peak in $C_{j,j'}(t')$ is used to determine the magnitude of $|\langle u_j \rangle \perp| = d_{j,j'}/t'$ where $d_{j,j'}$ is the distance between measurement and reference beam paths j and j'.

Fourier Transform of $C_{j,j'}(t')$

The direction and magnitude of velocity $\langle u_j \rangle_\perp$ may also be determined from properties of a two-dimensional FFT of $C_{j,j'}(t')$. A peak at a non-zero frequency in the two-dimensional FFT of $C_{j,j'}(t')$ determines the direction of the corresponding $\langle u_j \rangle_\perp$ and the corresponding value of t' used in the calculation $|\langle u_j \rangle \perp| = d_{j,j'}/t'$.

Measured Values of Temporal Derivative $\partial \psi_j / \partial t$ and Divergence $-\nabla_\perp \cdot [\langle u_j \rangle_\perp \psi_j]$ The array of temporal derivative $\partial \psi_j / \partial t$ is measured as the difference between two arrays of phase measurements corresponding to two different average times or the same average time. [Higher order temporal derivatives may be used to obtain a more accurate value of $\partial \psi_j / \partial t$ using three or more arrays of phase measurements.] The acquisition of an array of phase measurements is described in a subsequent section herein entitled "Acquisition of an Array of Phase Measurements." The phase measurements are obtained from measurements of conjugated quadratures such as described in section entitled "Electrical Interference Signal" herein. The reduction and compensation for effects of vibration and environmental effects are obtained for measurements of conjugated quadratures such as described herein in the subsection entitled "Reduction and Compensation for Effects of Vibration and Environmental Effects." The divergence $-\nabla_\perp \cdot [\langle u_j \rangle_\perp \psi_j \nu]$ is obtained from the temporal derivative using Eq. (10) and values of $\langle u_j \rangle_\perp$ obtained as described above.

Inversion of $-\nabla_\perp \cdot [\langle u_j \rangle_\perp \psi_j]$

For the general case where $\langle u_j \rangle_\perp$ is not constant across a wavefront about which information is desired, the inversion is accomplished by recognizing that $[\langle u_j \rangle_\perp \psi_j]$ is to a good approximation irrotational and representing $[\langle u_j \rangle_\perp \psi_j]$ as a gradient of a scalar function $\Phi(x,y)$, i.e., $\nabla \Phi$. The resulting equation is

(14) $\quad \nabla^2 \Phi = -\nabla_\perp \cdot [\langle u_j \rangle_\perp \psi_j]$.

Eq. (14) has the same mathematical form as the Poisson equation of electrostatics [see for example Section 1.7 of the book entitled "Classical Electrodynamics" by J. D. Jackson, $2^{nd}$ Ed. (Wiley 1975)]. The number of different procedures that have been developed in the field of electrostatics can be used to solve Eq. (14) for $\Phi(x, y)$ with the boundary condition that the average value of the resulting atmospheric turbulence contribution $\psi_j$ over the wavefront is equal to zero.

The atmospheric turbulence contribution $\psi_j$ is then obtain with the formula $$\psi_j(x, y) = \frac{\nabla_\perp \Phi(x, y)}{\langle u_j \rangle_\perp}. \tag{15}$$

Inversion of $-\nabla \nabla_\perp \cdot [\langle u_j \rangle_\perp \psi_j]$: $\langle u_j \rangle_\perp$ Constant Across a Rectangular Wavefront Cross Section For the case of $\langle u_j \rangle_\perp$ constant across a rectangular wavefront, the inversion of the divergence $-\nabla_\perp \cdot [\langle u_j \rangle_\perp \psi_j]$ which is obtained from temporal derivative $\partial \psi_j / \partial t$ may be performed by representing $\psi_j = \psi(x, y)$ in terms of a series of orthogonal functions. The use of a two-dimensional Fourier series representation is described to show in a simple example a method for the inversion. The inversion could also be performed using a two-dimensional finite Fourier transform (FFT). The two-dimensional Fourier series representation is written as $$\psi(x, y) = \sum_{n=0}^{N} \sum_{m=0}^{M} \left[ \begin{array}{l} a_{nm}\cos(nk_x x + mk_y y) + \\ b_{nm}\sin(nk_x x + mk_y y) \end{array} \right] \tag{16}$$

for $0 \leq x \leq L_x$, $0 \leq y \leq L_y$, $k_x = 2\pi/L_x$, and $k_y = 2\pi/L_y$. The coefficients $a_{nm}$ and $b_{nm}$ are real and $a_{00} = 0$ on the average since $\psi(x, y)$ represents the effects of atmospheric turbulence which is defined in such a way such that the effects have an average value of zero.

The divergence $-\nabla_\perp \cdot [\langle u_j \rangle_\perp \psi_j]$ is generated using Eq. (16) for the series representation of $\psi(x,y)$ with the result $$-\nabla_\perp \cdot \left[ \langle u \rangle_\perp \psi(x, y) \right] = + \sum_{n=0}^{N} \sum_{m=0}^{M} \left\{ \begin{array}{l} \langle u_x \rangle n k_x \\ \left[ \begin{array}{l} -a_{nm}\sin(nk_x x + mk_y y) + \\ b_{nm}\cos(nk_x x + mk_y y) \end{array} \right] + \\ \langle u_y \rangle m k_y \\ \left[ \begin{array}{l} -a_{nm}\sin(nk_x x + mk_y y) + \\ b_{nm}\cos(nk_x x + mk_y y) \end{array} \right] \end{array} \right\}. \tag{17}$$

Eq. (17) can be written in a contracted form by redefining the coefficients of $\cos(nk_x x + mk_y y)$ and $\sin(nk_x x + mk_y y)$ in Eq. (17) as $$-\nabla_\perp \cdot \left[ \langle u_\perp \rangle \psi(x, y) \right] = \tag{18}$$
$$+ \sum_{n=0}^{N} \sum_{m=0}^{M} a'_{nm}\cos(nk_x x + mk_y y) + \sum_{n=0}^{N} \sum_{m=0}^{M} b'_{nm}\sin(nk_x x + mk_y y)$$

where $$a'_{nm} = (\langle u_x \rangle n k_x + \langle u_y \rangle m k_y) b_{nm}, \tag{19}$$
$$b'_{nm} = -(\langle u_x \rangle n k_x + \langle u_y \rangle m k_y) a_{nm}.$$

The coefficients $a'_{nm}$ and $b'_{nm}$ are determined by a two-dimensional Fourier series representation of measured values of $-\nabla_\perp \cdot [\langle u_j \rangle_\perp \psi_j]$. The coefficients $a_{nm}$ and $b_{nm}$ are next generated from the measured coefficients $a'_{nm}$ and $b'_{nm}$ using Eqs. (19) except for the case of $a_{00}$. As noted in the discussion following Eq. (16), $a_{00}=0$ on the average since $\psi(x,y)$ represents the effects of atmospheric turbulence which has an average value of zero.

Inversion of $-\nabla_\perp \cdot [\langle u_j \rangle_\perp \psi_j]$: $\langle u_j \rangle_\perp$ Constant Across a Circular Wavefront Cross Section For the case of $\langle u_j \rangle_\perp$ constant across a circular wavefront, the inversion of the divergence $-\nabla_\perp \cdot [\langle u_j \rangle_\perp \psi_j]$ of $[\langle u_j \rangle_\perp \psi_j]$ which is obtained from temporal derivative $\partial \psi_j / \partial t$ may be performed by representing $\psi_j = \psi(x,y)$ in terms of Zernike polynomials for the case of a circular wavefront section. The Zernike polynomial expansion is written as $$\psi(\rho, \vartheta) = \sum_j c_j Z_j(\rho, \vartheta), \tag{20}$$
$$0 \leq \rho \leq 1,$$

where $Z_j$ is the Zernike polynomial of order index j, and $c_j$ are constants. The Zernike polynomials used herein are the same as the Zernike polynomials used by R. J. Noll in an article entitled "Zernike polynomials and atmospheric turbulence," *J. Opt. Soc. Am.*, Vol. 66, pp 207-211 (1976). The polynomials are given by the equations $$\left. \begin{array}{l} Z_j = [2(n+1)]^{1/2} R_n^m(\rho) \cos m\vartheta, \; j \text{ even} \\ Z_j = [2(n+1)]^{1/2} R_n^m(\rho) \sin m\vartheta, \; j \text{ odd} \end{array} \right\} m > 0, \tag{21}$$
$$Z_j = (n+1)^{1/2} R_n^0(\rho), \qquad m = 0,$$

where $$R_n^m(\rho) = \sum_{s=0}^{(n-m)/2} \frac{(-1)^s (n-s)!}{s! \left[\frac{(n+m)}{2} - s\right]! \left[\frac{(n-m)}{2} - s\right]!} \rho^{n-2s}. \tag{22}$$

The values of n and m are integral, $0 \leq m \leq n$, and (n−m) is an even valued integer. The index j is a mode ordering number and is a function of n and m. The first 10 Zernike polynomials are listed in Table 1 as functions of $\rho$ and $\partial$ and as functions of rectangular coordinates $\eta$ and $\xi$ where $\eta = \rho \cos \partial$, $\xi = \rho \sin \partial$. \hfill (23)

The respective modal orthogonality relation is written as $$\int W(r) Z_j Z_{j'} \rho \, d\rho \, d\vartheta = \delta_{jj'} \quad (24)$$

where $\delta_{jj'}$ is the Kronecker delta function and $$W(\rho) = \begin{cases} \frac{1}{\pi}, & 0 \le \rho \le 1, \\ 0, & \rho > 1. \end{cases} \quad (25)$$

For the gradient of Zernike polynomials, reference is made to the Section entitled "Zernike Derivatives" in cited reference by Noll, supra, where the gradient $\nabla Z_j$ is a vector represented as a linear combination of Zernike polynomials, i.e., $$\nabla Z_j = \sum_{j'} (\gamma_{jj'}^x \hat{x} + \gamma_{jj'}^y \hat{y}) Z_{j'}, \quad (26)$$

and $\hat{x}$ and $\hat{y}$ are unit vectors in the x and y directions, respectively. The matrix

TABLE 1

Zernike Polynomials $Z_j(\rho, \theta)$

| j | $Z_j(\rho, \theta)$ | $Z_j(\eta, \xi)$ |
|---|---|---|
| 1 | 1 | 1 |
| 2 | $2\rho \cos\theta$ | $2\eta$ |
| 3 | $2\rho \sin\theta$ | $2\xi$ |
| 4 | $\sqrt{3}(2\rho^2 - 1)$ | $\sqrt{8}\rho^3\sin3\vartheta \sqrt{3}(2\eta^2 + 2\xi^2 - 1)$ |
| 5 | $\sqrt{6}\rho^2\sin2\vartheta$ | $2\sqrt{6}\eta\xi$ |
| 6 | $\sqrt{6}\rho^2\cos2\vartheta$ | $\sqrt{6}(\eta^2 - \xi^2)$ |
| 7 | $\sqrt{8}(3\rho^3 - \rho)\sin\vartheta$ | $\sqrt{8}(3\eta^2\xi + 3\xi^3 - 2\xi)$ |
| 8 | $\sqrt{8}(3\rho^3 - \rho)\cos\vartheta$ | $\sqrt{8}(3\eta^3 + 3\eta\xi^2 - 2\eta)$ |
| 9 |  | $\sqrt{8}(3\eta^2\xi - \xi^3)$ |
| 10 | $\sqrt{8}\rho^3\cos3\vartheta$ | $\sqrt{8}(\eta^3 - 3\eta\xi^2)$ | elements $\gamma_{jj'}^x$ and $\gamma_{jj'}^y$ are most easily expressed in rectangular coordinates where $$\gamma_{jj'}^x = \int Z_{j'} \frac{dZ_j}{dx} \rho \, d\rho \, d\vartheta, \quad (27)$$

and $$\gamma_{jj'}^y = \int Z_{j'} \frac{dZ_j}{dy} \rho \, d\rho \, d\vartheta. \quad (28)$$

Examples of the matrix elements $\gamma_{jj'}^x$ and $\gamma_{jj'}^y$ are listed in Tables II and III of Noll, supra, and in Tables 2 and 3 herein. The matrix elements can be constructed by the following rules.

$\gamma_{jj'}^x$ a) All magnitudes are given by
   $[(n+1)(n'+1)]^{1/2}$ for m and m'≠0,
   $[2(n+1)(n'+1)]^{1/2}$ for m or m'=0.
b) The non-zero elements are for j and j' either both even or both odd except for m or m'=0. When m or m'=0, only even j or j' gives a non-zero result.
c) For a particular m, only m'=m±1 gives non-zero matrix elements.
d) All matrix elements are positive.

$\gamma_{jj'}^y$ a) All magnitudes are the same as $\gamma_{jj'}^x$.
b) The non-zero elements are for j and j' either even/odd or odd/even except for m or m'=0. When m or m'=0, only odd j or j' gives a non-zero result.
c) Only m'=m±1 gives non-zero results.
d) All m and m'=0 elements are positive.
   Elements with m'=m+1 and odd j are negative.
   Elements with m'=m−1 and even j are negative.
   All other elements are positive.

The divergence $-\nabla_\perp \cdot [\langle u_j \rangle_\perp \psi_j]$ is generated using Eq. (20) for the Zernike polynomial representation of $\psi(x,y)$ with the result

TABLE 2

$$-\nabla_\perp \cdot [\langle u_j \rangle_\perp \psi_j] = \sum_j c_j \sum_{j'} (\langle u_x \rangle \gamma_{jj'}^x + \langle u_y \rangle \gamma_{jj'}^y) Z_{j'}. \quad (29)$$

Zernike Derivative Matrix Element $\gamma_{jj'}^x$

| m' | 0 | 1 | 1 | 0 | 2 | 2 |
|---|---|---|---|---|---|---|
| j' | 1 | 2 | 3 | 4 | 5 | 6 |
| m | j | | | | | |
| 0 | 1 | | | | | |
| 1 | 2 | 2 | | | | |
| 1 | 3 | | | | | |
| 0 | 4 | | | $2\sqrt{3}$ | | |
| 2 | 5 | | | | $\sqrt{6}$ | |
| 2 | 6 | | | | | $\sqrt{6}$ |
| 1 | 7 | | | | | | $2\sqrt{3}$ |
| 1 | 8 | $\sqrt{8}$ | | | $2\sqrt{6}$ | | $2\sqrt{3}$ |
| 3 | 9 | | | | | | $2\sqrt{3}$ |
| 3 | 10 | | | | | | $2\sqrt{3}$ |

TABLE 3

Zernike Derivative Matrix Element $\gamma_{ij}^{y}$

| m | j | m'=0, j'=1 | m'=1, j'=2 | m'=1, j'=3 | m'=0, j'=4 | m'=2, j'=5 | m'=2, j'=6 |
|---|---|---|---|---|---|---|---|
| 0 | 1 | | | | | | |
| 1 | 2 | | 2 | | | | |
| 1 | 3 | | | | | | |
| 0 | 4 | | | | $2\sqrt{3}$ | | |
| 2 | 5 | | $\sqrt{6}$ | | | | |
| 2 | 6 | | | $-\sqrt{6}$ | | | |
| 1 | 7 | | $\sqrt{8}$ | | | $2\sqrt{6}$ | $-2\sqrt{3}$ |
| 1 | 8 | | | | | $2\sqrt{3}$ | |
| 3 | 9 | | | | | | $2\sqrt{3}$ |
| 3 | 10 | | | | | | $-2\sqrt{3}$ |

The coefficients $c_j$ are determined by representing $-\nabla_\perp \cdot [\langle u_j \rangle_\perp \psi_j]$ by the Zernike polynomial series expressed in Eq. (29). The coefficient $c_1 = 0$ since on the average $\psi(r, \partial)$ represents the effects of atmospheric turbulence which has an average value of zero.

Acquisition of an Array of Phase Measurements

A general description of various embodiments incorporating the present invention is first given for interferometric metrology systems wherein multiple-homodyne detection methods are used for making joint or substantially joint, and time-delayed measurements of components of conjugated quadratures of fields of beams reflected/scattered or transmitted/scattered by a measurement object. Referring to FIG. 1a, an interferometric metrology system is shown diagrammatically comprising an interferometer 10, a source 18, detector 70, an electronic processor and controller 80, and a measurement object or substrate 60. Source 18 generates beam 24 comprising one or more components that are encoded using frequency, polarization, temporal, or spatial encoding or some combination thereof. The interferometer metrology system may further comprise a wavelength monitor or monitors (not shown in FIG. 1a) for measurement and compensation of large scale environmental changes where the wavelength monitors are based on interferometers such as described in U.S. Pat. No. 4,733,967 entitled "Apparatus For The Measurement Of The Refractive Index Of Gas" by Gary E. Sommargren. The wavelength monitors can be used for example in the compensation of environmental affects that are not isotropic in the reference and measurement beam paths of the interferometry metrology system.

Frequency encoding is described in referenced U.S. Provisional Patent Application No. 60/442,858 and U.S. patent application Ser. No. 10/765,368. Polarization encoding is described in commonly owned U.S. Provisional Patent Application No. 60/459,425 and U.S. patent application Ser. No. 10/816,180 wherein both are entitled "Apparatus and Method for Joint Measurement of Fields of Scattered/Reflected Orthogonally Polarized Beams by an Object in Interferometry" and both are by Henry A. Hill, the contents of which are herein incorporated in their entirety by reference. Temporal encoding is described in commonly owned U.S. Provisional Patent Application No. 60/602,046 and U.S. patent application Ser. No. 11/204,758 wherein both are entitled "Apparatus and Method for Joint And Time Delayed Measurements of Components of Conjugated Quadratures of Fields of Reflected/Scattered and Transmitted/Scattered Beams by an Object in Interferometry" and by Henry A. Hill, the contents of both of which are herein incorporated in their entirety by reference. Spatial encoding is described in commonly owned U.S. Provisional Patent Application No. 60/501,666 and U.S. patent application Ser. No. 10/938,408 wherein both are entitled "Catoptric and Catadioptric Imaging Systems With Adaptive Catoptric Surfaces" and both are by Henry A. Hill, the contents of which are herein incorporated in their entirety by reference.

Input beam 24 is formed with components 24A and 24B that each comprise one or more encoded components. The relative orientation of polarizations of different components of beams 24A and 24B may be parallel or orthogonal or at some other angle according to the requirements of an end use application. The measurement beam components 24B of input beam 24 are coextensive in space and the corresponding reference beam components 24A are coextensive in space and have the same temporal window function as the temporal window function of the corresponding components of the measurement beam components although measurement beam components 24B and reference beam components 24A may be either spatially separated or spatially coextensive.

Measurement beam 30A incident on substrate 60 is generated either directly from beam 24B or in interferometer 10. Measurement beam 30B is a return measurement beam generated as a portion of measurement beam 30A reflected/scattered or transmitted/scattered by substrate 60. Return measurement beam 30B is combined with reference beam 24A in interferometer 10 to form output beam 34.

Output beam 34 is detected by detector 70 preferably by a quantum process to generate electrical interference signals for multiple-homodyne detection methods as signal 72. Detector 70 may further comprise an analyzer to select common polarization states of the reference and return measurement beam components of beam 34 to form a mixed beam. Alternatively, interferometer 10 may comprise an analyzer to select common polarization states of the reference and return measurement beam components such that beam 34 is a mixed beam.

In practice, known phase shifts are introduced between the encoded reference and measurement beam components of output beam 34 by one or more different techniques depending on the method of encoding used in a homodyne detection method. In one technique, phase shifts are introduced between certain of the corresponding encoded reference and measurement beam components of input beam 24 by source 18 as controlled by a component of signal 74 from electronic processor and controller 80. In another technique, phase shifts are introduced between certain other of the corresponding encoded reference and measurement beam components as a consequence of a non-zero optical path difference between the reference and measurement objects in interferometer 10 and corresponding frequency shifts introduced to the certain other encoded components of input beam components 24A and 24B by source 18 as controlled by a component of signal 74 from electronic processor and controller 80 such as described in a corresponding portion of the description of the first embodiment of the present invention. In yet another technique, phase shifts are introduced between other certain other of the corresponding encoded reference and measurement beam components as a consequence of relative translations of the reference and measurement objects as controlled by electronic processor and controller 80 such as described in a corresponding portion of the description of the first embodiment of the present invention.

There are different ways to configure source 18 to meet the input beam requirements of different embodiments of the present invention. For applications where interferometer 10 is an interferometer such as a Fizeau or a Twyman-Green type interferometer, a combination of frequency and temporal encoding can be used with or without use of phase shifting introduced by a relative translation of reference and measurement objects for multiple-homodyne detection methods.

Continuing with the description of different ways to configure source 18 to meet the input beam requirements of different embodiments of the present invention, source 18 may comprise a pulsed source and/or a shutter. There are a number of different ways for producing a pulsed source comprising one or more frequencies such as described in commonly owned U.S. Provisional Patent Application No. 60/602,046 and U.S. patent application Ser. No. 11/204,758. Source 18 may be configured using for example beam-splitters to generate an output beam comprising two or more encoded components to form a coextensive measurement beam and a coextensive reference beam that are either spatially separated beams for input beam 24 or form a coextensive beam for input beam 24 as required in various embodiments of the present invention.

Source 18 may be configured using other techniques, e.g., acousto-optical modulators (AOMs), described in referenced U.S. Provisional Patent Application No. 60/602,046 and No. 60/442,858, U.S. patent application Ser. No. 10/765,368, and U.S. patent application Ser. No. 11/204,758. Source 18 may also be configured using intra-cavity beam deflectors in external cavity diode laser sources (ECDLs) such as described in U.S. Provisional Patent Application No. 60/699,951 and No. 60/805,104 and U.S. patent application Ser. No. 11/457,025 wherein each are entitled "Continuously Tunable External Cavity Diode Laser Sources With High Tuning Rates And Extended Tuning Ranges." U.S. Provisional Patent Application No. 60/699,951 is by Henry A. Hill and U.S. Provisional Patent Application No. 60/805,104 and U.S. patent application Ser. No. 11/457,025 are by H. A. Hill, S. Hamann, and P. Shifflet and the contents of each of which are herein incorporated in their entirety by reference.

Figure 1B:
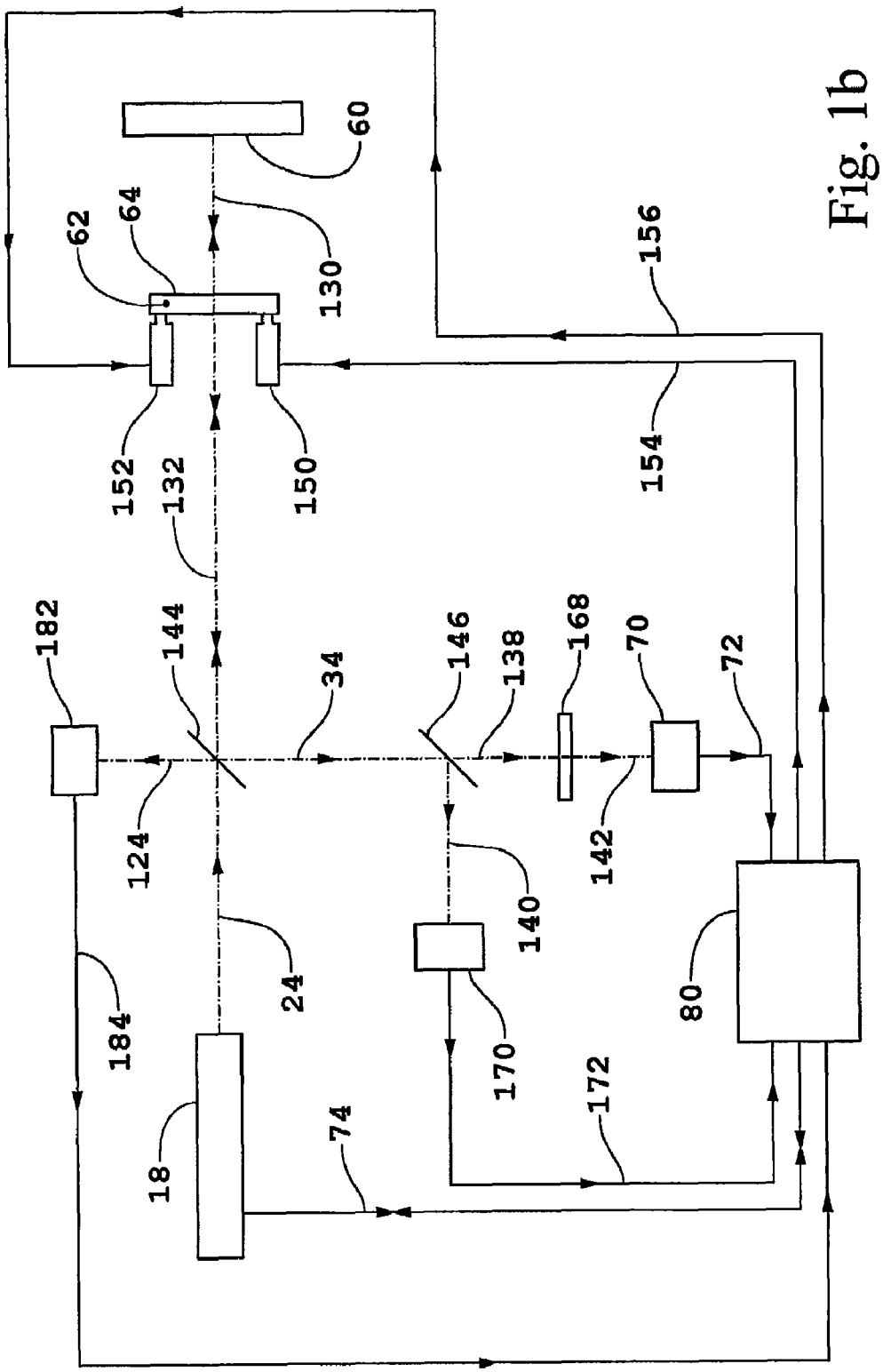
FIG. 1b is a schematic diagram of an interferometric metrology system of the Fizeau type that uses homodyne detection methods and that may be configured to operate with or without use of phase shifting introduced by a relative translation of reference and measurement objects.

The first embodiment of the present invention is shown diagrammatically in FIG. 1b and is operated with a reference frame and a reference optical frequency $f_R$ or corresponding reference wavelength $\lambda_R$ wherein the relative optical path length between a spot on surface 64 and a corresponding spot on measurement object 60 is maintained constant mod $2\pi$ at the reference optical frequency $f_R$. The first embodiment comprises interferometer 10 configured as a Fizeau interferometer that uses homodyne detection methods based on a combination of temporal and frequency encoding with or without use of phase shifting introduced by a relative translation of reference and measurement objects 62 and 60. The homodyne detection methods used in various embodiments of the present invention are configured to obtain information about effects of vibrations, environmental changes, and atmospheric turbulence as well as information about a wavefront profile.

In FIG. 1b, source 18 generates input beam 24 with a single frequency component that is switched between selected frequency values with a switching frequency that is preferably high compared to the frequencies of the effects of vibration and environmental changes that may be present. Source 18 of the first embodiment shown diagrammatically in FIG. 1c comprises an ECDL such as described in referenced U.S. Provisional Patent Application No. 60/699,951 and No. 60/805,104 and U.S. patent application Ser. No. 11/457,025 In addition, the reference and measurement beam components of input beam 24 are coextensive in space for the first embodiment.

The ECDL is a continuously tunable external cavity source comprising a coherent light source and a dispersive system. The dispersive system directs a selected wavelength from the coherent light source back into the coherent light source by either diffraction and/or refraction. Two features of an external cavity comprising a dispersive system is a first order sensitivity of the double pass path length of the external cavity to lateral shears of a beam incident on the dispersive system and a first order sensitivity of the wavelength of the selected wavelength to changes in the direction of propagation of a beam incident on a dispersive element of the dispersive system. The ECDL exploits both of these features to obtain continuously tunable external cavity diode laser sources with high tuning rates and extended tuning ranges in comparison to prior art which exploits only the second of the two features.

Figure 1C:
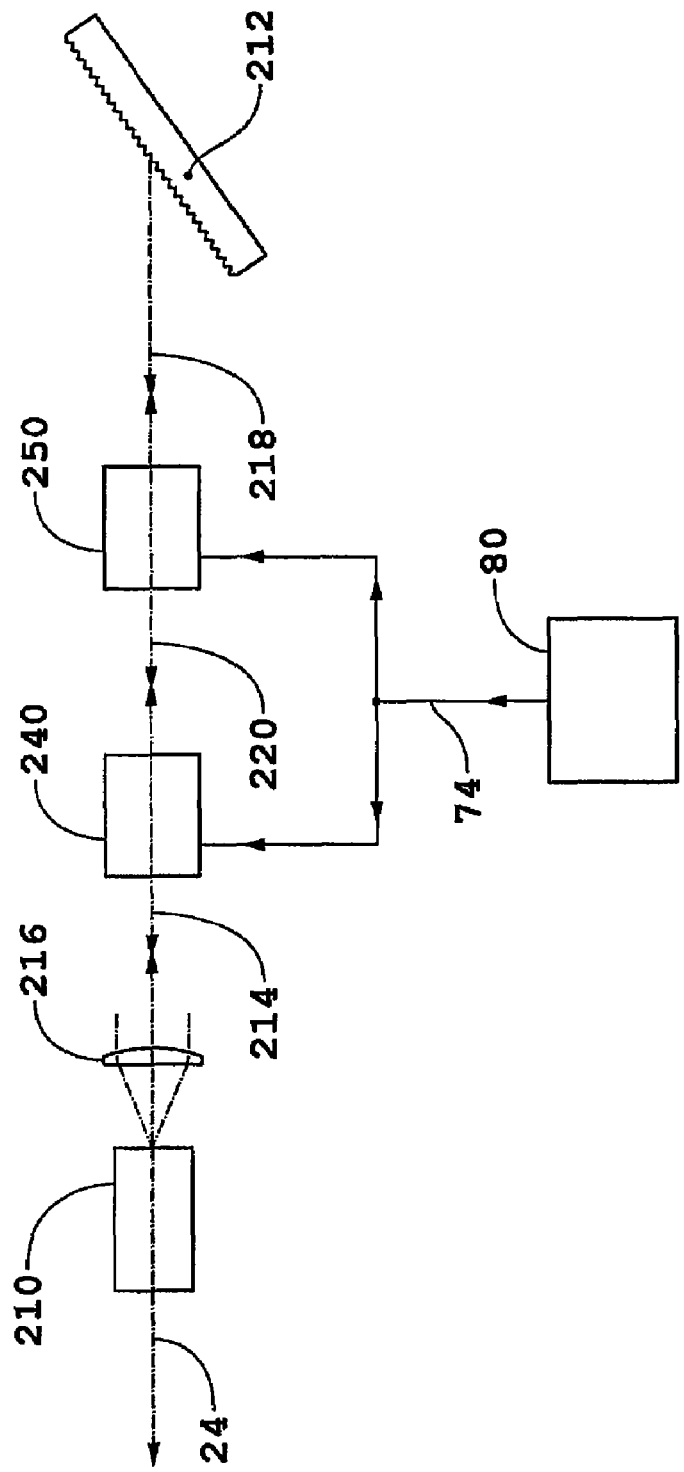
FIG. 1c is a schematic diagram of an external cavity diode laser (ECDL) with beam deflectors in the external cavity.

Source 18 configured as an ECDL in a Littrow configuration is shown diagrammatically in FIG. 1c comprising grating 212. The ECDL further comprises laser source 210, beam forming optics 216, beam deflectors 240 and 250, and electronic processor and controller 80. The output beam is beam 24.

Source 210 and beam forming optics 216 generate an intra-cavity collimated beam as a component of beam 214. The collimated component of beam 214 is incident on beam deflector 140 and a portion thereof is deflected as deflected component of beam 220. A portion of the deflected beam component of beam 220 is subsequently deflected by beam deflector 250 as deflected beam component of beam 218.

For the Littrow cavity configuration shown in FIG. 1c, a portion of the deflected component of beam 218 is diffracted as a diffracted component of beam 218. The path of diffracted beam component of beam 218 through the external cavities of FIG. 1c to source 210 coincides with the components of the intra-cavity components propagating to the right in FIG. 1c. A portion of diffracted beam component of beam 218 incident on source 210 is double passed by the cavity of source 210 after reflection by a reflector on the left side of source 210. The double passed beam corresponds to the component of collimated beam component of beam 214.

Also for the Littrow cavity configuration shown in FIG. 1c, a second portion of the diffracted beam component of beam 218 incident on source 210 is transmitted by the reflector on the left side of source 210 as output beam 24.

The two features of an external cavity with a dispersive system are exploited by the introduction and use of beam deflectors 240 and 250 which generate both beam shear and changes in direction of propagation of intra-cavity beams. The amount of beam shear and change in direction of propagation of the intra-cavity beams generated by beam deflectors 240 and 250 are controlled by components of signal 74 from electronic processor and controller 80. Beam deflectors 240 and 250 may comprise either electro-optic modulators (EOMs) or AOMs. The properties of the ECDL are listed in Table 4 for a set of different media used as birefringent media for beam deflectors 240 and 250 configured as EOMs.

It is relevant to note that the tuning ranges in frequency and wavelength are equal to $2\delta f$ and $2\Delta\lambda$, respectively. The response time $\tau$ is the response time for changing the frequency of the ECDL without mode hoping between different longitudinal modes of the external cavity.

TABLE 4

Performance Properties Of ECDLs With EOM Beam Deflectors

| Medium | δf/V (GHz/volt) | V (volts) | δf (GHz) | Δλ (nm) | τ (μsec) |
|---|---|---|---|---|---|
| LiNbO$_3$ | 0.216 | 33 | 7.1 | 0.018 | 0.03 |
|  |  | 100 | 21.6 | 0.035 | 0.1 |
| BSN x = 0.60 | 1.96 | 3.3 | 6.5 | 0.0064 | 0.03 |
|  |  | 10 | 20 | 0.032 | 0.1 |
|  |  | 33 | 65 | 0.160 | 0.3 |
|  |  | 100 | 196 | 0.320 | 1.0 |
| BSN x = 0.75 | 10.7 | 3.3 | 35 | 0.058 | 0.15 |
|  |  | 10 | 107 | 0.175 | 0.5 |
|  |  | 33 | 353 | 0.58 | 1.5 |
|  |  | 100 | 1,070 | 1.75 | 4.5 |

Figure 1D:
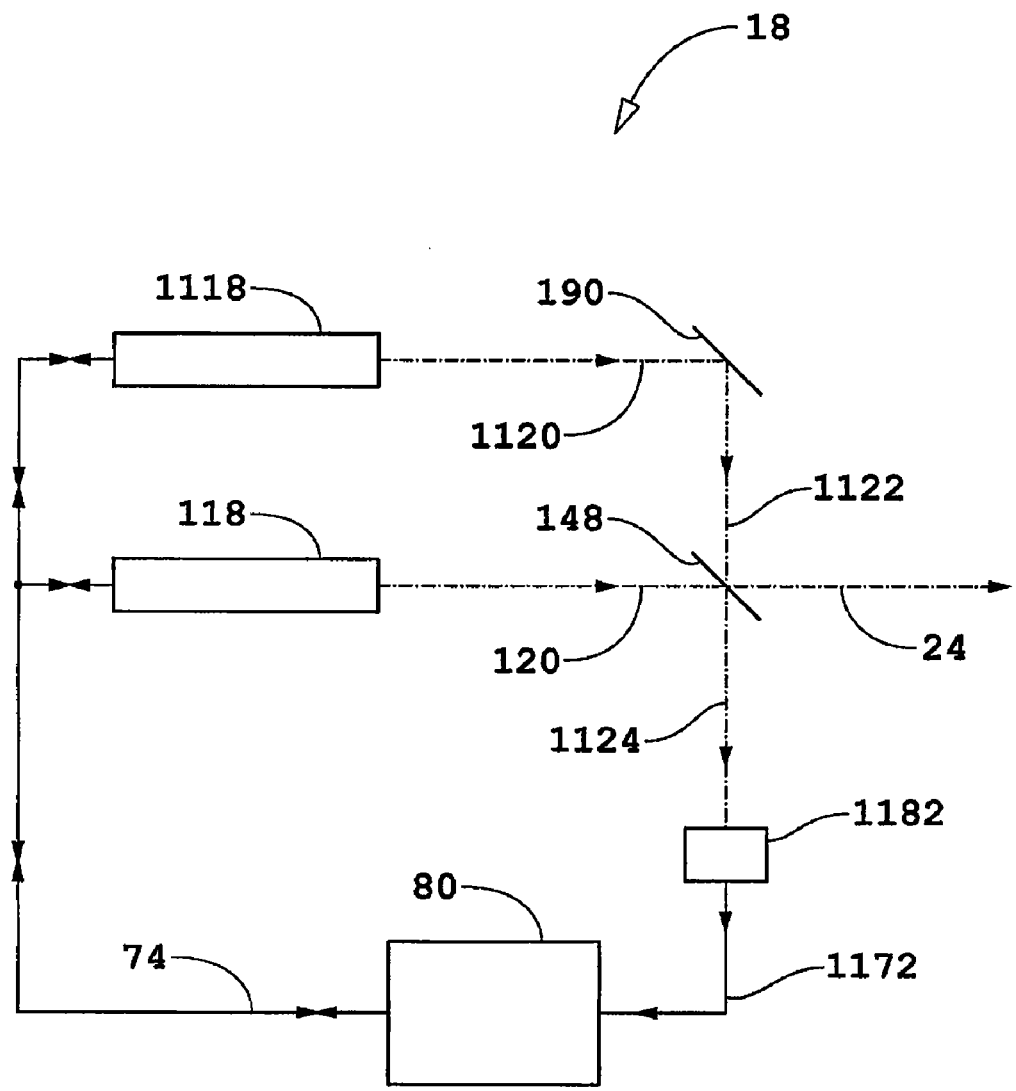
FIG. 1d is a schematic diagram of a source comprising two lasers operating in a master-slave mode.

The function of source 18 in the first embodiment may alternatively be served by use of a master-slave source configuration such as shown diagrammatically in FIG. 1d. With reference to FIG. 1d, the frequency of laser 1118 are controlled by a servo feedback as a component of signal 74 to control the frequency difference between the frequencies of master and slave lasers 118 and 1118, respectively. The frequency of laser 118 is controlled by a component of signal 74 from electronic processor and controller 80. A first portion of beam 120 generated by laser 118 is transmitted by a non-polarizing beam-splitter 148 as a first component of output beam 24 and a second portion of beam 120 is reflected by non-polarizing beam-splitter 148 as a first component of beam 1124. A first portion of Beam 1120 generated by laser 1118 is reflected by mirror 190 as beam 1122. A first portion of beam 1122 is reflected by non-polarizing beam-splitter 148 as a second component of output beam 24 and a second portion of beam 1122 is transmitted by non-polarizing beam-splitter 148 as a second component of beam 124.

The components of beam 124 are mixed with respect to polarization in detector if beam 124 is not a mixed beam and detected by detector 1182 preferably by a quantum process to generate electrical interference signal 1172. The difference in frequencies of beams 120 and 1120 corresponds to the frequency of electrical interference signal 1172. The difference in frequencies is compared to a value determined by electronic processor and controller 80 to generate an error signal. The error signal is used by electronic processor and controller 80 to a generate servo control signal component of signal 74 to control the frequency of laser 1118 relative to the frequency of laser 118.

With reference to FIG. 1b, interferometer 10 comprises non-polarizing beam-splitter 144, reference object 62 with reference surface 64; measurement object 60; transducers 150 and 152; detectors 70, 170, and 182; and electronic processor and controller 80. Input beam 24 is incident on non-polarizing beam splitter 144 and a first portion thereof transmitted as beam 132 and a second portion thereof reflected as monitor beam 124. Beam 132 is subsequently incident on reference object 62 and a first portion thereof reflected by surface 64 of object 62 as a reflected reference beam component of beam 132 and a second portion thereof transmitted as a measurement component of beam 130. The measurement beam component of beam 130 is incident on measurement object 60 and a portion thereof reflected/scattered as a reflected measurement beam component of beam 130. The reflected measurement beam component of beam 130 is incident on reference object 62 and a portion thereof transmitted as the reflected measurement beam component of beam 132.

The reflected reference and measurement beam components of beam 134 are next incident on beam-splitter 144 and a portion thereof reflected as output beam 34.

Continuing with the description of the first embodiment, output beam 34 is incident on non-polarizing beam-splitter 146 and first and second portions thereof transmitted and reflected, respectively, as beams 138 and 140, respectively. Beam 138 is detected by detector 70 preferably by a quantum process to generate electrical interference signal 72 after transmission by shutter 168 if required to generate beam 142 as a gated beam. Shutter 168 is controlled by electronic processor and controller 80. The function of shutter may be alternatively served by a shutter integrated into detector 70. Electrical interference signal 72 contains information about the difference in surface profiles of surface 64 and the reflecting surface of measurement object 60.

Beam 140 is incident on and detected by detector 170 preferably by a quantum process to generate electrical interference signal 172 to generate the respective transmitted beam as a mixed beam. If beam 140 is not a mixed beam, it is passed through an analyzer in detector 170 to form a mixed beam prior to detection by detector 170. Detector 170 comprises one or more high speed detectors where each of the high speed detectors may comprise one or more pixels. The photosensitive areas of each of the one or more high speed detectors overlaps a portion of the wavefront of beam 140. Electrical interference signal 172 contains information about the relative changes in the optical path lengths between the reference and measurement objects 62 and 60 at positions corresponding to the portions of the wavefront of beam 140 incident on each of the high speed detectors. The information contained in electrical interference signal 172 is processed and used by electronic processor and controller 80 to establish and maintain the reference frame and to detect changes in relative orientation and/or deformation of the reference and measurement objects 62 and 60.

Beam 124 is incident on detector 182 and detected preferably by a quantum process to generate electrical interference signal 184. Electrical interference signal 184 is processed and used by electronic processor and controller 80 to monitor and control the amplitude of beam 24 through a component of signal 74.

An advantage is that electrical interference signal 172 is processed by electronic processor and controller 80 using a homodyne detection method that is compatible with the multiple-homodyne detection method used by electronic processor and controller 80 to process electrical interference signal 72. In particular, if the first embodiment is configured to use multiple-homodyne detection methods based on a sequence of N≧3 phase shift values for the processing of electrical interference signal 72, the homodyne detection method used to process electrical interference signal 172 can be and is configured to operate with the same sequence of N≧3 phase shift values so as to not impose any restrictions on the selection of sequences of phase shift values and on the processing of electrical interference signals 72.

The homodyne detection method used to process electrical interference signal 172 takes advantage of the property of the multiple-homodyne detection methods wherein joint measurements of components of conjugated quadratures are measured, the temporal encoding used in the multiple-homodyne detection methods, and of the use of the reference frame. The homodyne detection method is in addition different from the multiple-homodyne detection methods with respect to sampling or integration times of respective detectors. The switching time of source 18 and the sampling time or integration time of detector 170 are much less than the inverse of the bandwidth of the effects of vibration and of environmental changes. The sampling time or integration time of detector 70 is based on signal-to-noise considerations including both systematic and statistical error sources. Accordingly, information about changes in the optical path length between the reference and measurement objects 62 and 60 due to effects of vibrations and effects of environmental changes can be obtained without imposing any restrictions on the sampling or integration times of detector 70 or on the processing of electrical interference signals 72.

The homodyne detection method used to process electrical interference signal 172 corresponds to a variant of a single homodyne detection method that takes advantage of the electrical interference signal values 172 being acquired in the reference frame of the first embodiment. In the reference frame, the phase of the conjugated quadratures is maintained zero or substantially zero by a feedback system. As a consequence, only one component of the respective conjugated quadratures needs to be monitored in order to detect changes in the relative displacement of reference and measurement objects 62 and 60. The one component of the respective conjugated quadratures corresponds to the component that is nominally equal to zero and which exhibits an extremum in sensitivity to changes in the relative optical path length. Since the phase shift associated with the difference in frequency of the two components of input beam 24 corresponding to two components of a conjugated quadratures is $\pi/2$, the associated difference between the two respective, i.e., contiguous, interference signal values contains in the first embodiment information about the component of the conjugated quadratures that has an extremum in sensitivity to changes in the relative optical path length. The information is in the form of ± the component of the conjugated quadratures which will be further described in the description of the first embodiment of the present invention.

The value of the optical frequency of the ECDL used as source 18 is controlled by components of signal 74 from electronic processor and controller 80 as drive voltages $V_1$ and $V_2$ for EOM beam deflectors 140 and 150, respectively. The relationship between $V_1$, $V_2$, and the optical frequency of the ECDL is described in U.S. Provisional Patent Application No. 60/699,951 and No. 60/805,104 and U.S. patent application Ser. No. 11/457,025. The value of the reference frequency $f_R$ will change as the difference in physical path length l between the reference and measurement objects changes due for example to vibrations and as the index of refraction of a refractive medium, e.g., gas, in the optical path of the measurement beam between the reference and measurement objects changes due for example to environmental changes. Changes in the relative optical path length due to vibrations and environmental effects are detected by monitoring the component of the conjugated quadratures of electrical interference signal 172 and the measured changes used as an error signal to control the value of reference frequency $f_R$ by controlling the voltages $V_1$ and $V_2$ such that the optical path length is kept constant mod $2\pi$. Actual knowledge of reference frequency $f_R$ or of the physical path length l is not required.

In a given reference frame, the rate of change of a frequency of beam 24 with respect to the phase of electrical interference signal 72 is required to implement a homodyne detection method. That rate of change is denoted as $f_\pi$, the change in frequency of beam 24 required to introduce a $\pi$ phase shift in the conjugated quadratures representing the electrical interference signal 72. The rate of frequency change per $\pi$ phase shift change $f_\pi$ is determined by first measuring the value of the electrical interference signal value as a function of changes of frequency of the ECDL and then analyzing the measured time sequence of the conjugated quadratures representing the electrical interference signal 72 for a value of $f_\pi$. The measured value of $f_\pi$ is used in the implementation of either single- or multiple homodyne detection methods for electrical interference signal 72.

It is important to note that knowledge of the value of l is not required a priori and as noted above, the actual physical path length difference l is not measured in the determination of $f_\pi$. It is also important to note that the actual value of $f_\pi$ need not measured or used as a frequency but the corresponding values of changes in voltages, $V_{1,\pi}$ and $V_{2,\pi}$, are measured and subsequently used. Accordingly, the actual physical path length difference l is not measured and can not be determined from knowledge of $V_{1,\pi}$ and $V_{2,\pi}$ without knowledge of the conversion of changes in $V_1$ and $V_2$ to changes in frequency of the ECDL.

Figure 1E:
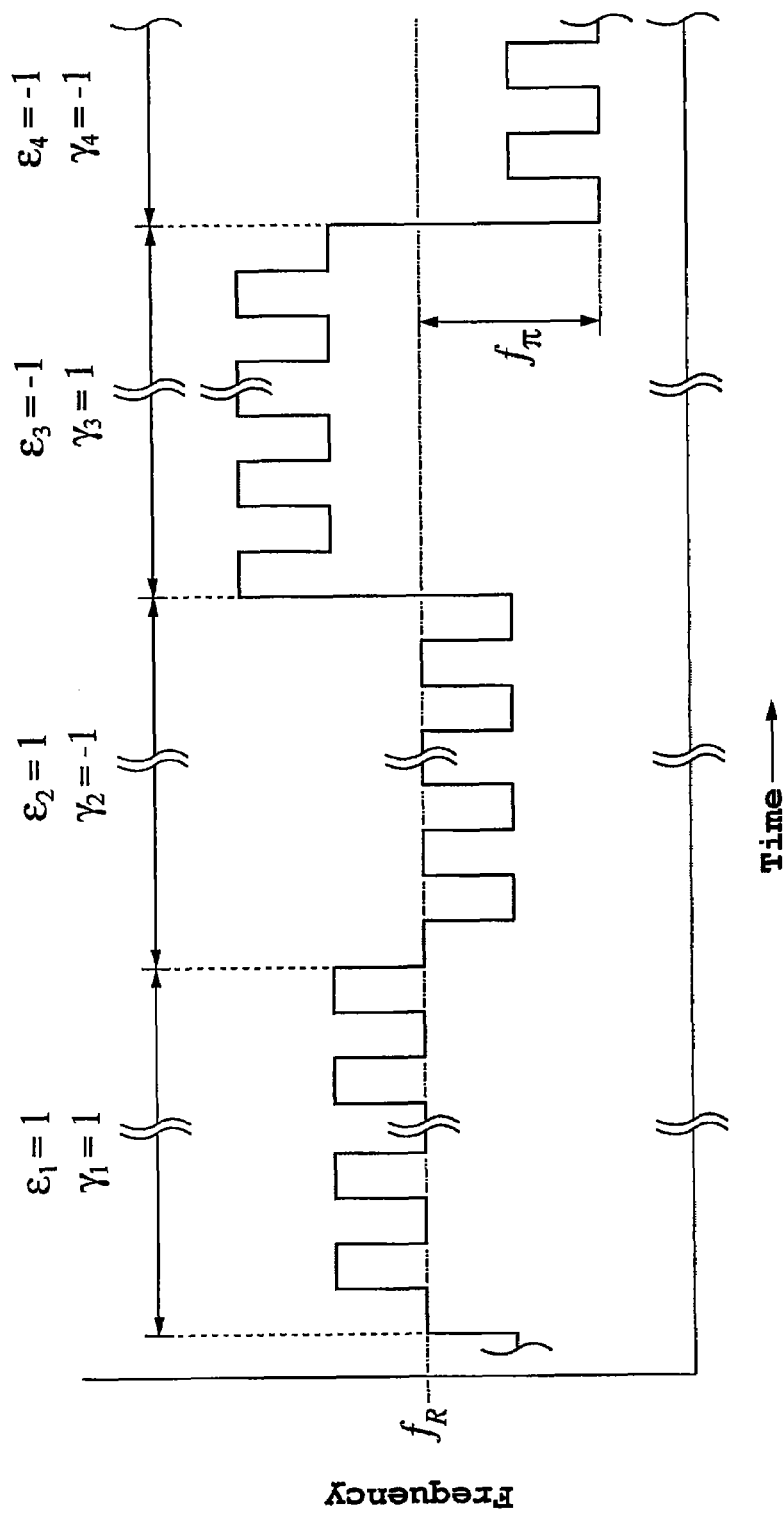
FIG. 1e is a graph showing the temporal properties of the frequency of the output beam from an ECDL with beam deflectors in the external cavity.

The waveforms of drive voltages $V_1$ and $V_2$ are preferably rectangle functions. Shown in FIG. 1*e* is the corresponding frequency of beam 24. The corresponding binary modulation of the frequency of beam 24 between two different frequency values is used in temporal encoding of the reference and measurement beams and in particular does not generate two frequency components such as when using source 18 configured as a master and slave lasers 118 and 1118. For the multiple-homodyne detection methods, the period of the rectangle functions is much less than the periods defined by the binary states of $\epsilon_j$ and $\gamma_j$ [see the description of $\epsilon_j$ and $\gamma_j$ given herein with respect to the Eq. (30)].

With reference to FIG. 1*b*, the phase shifting is achieved either with shifting the frequencies of components of input beam 24 or in conjunction with phase shifting introduced by translation and/or rotation of reference object 62 by transducers 150 and 152 which are controlled by signals 154 and 156, respectively, from electronic processor and controller 80. A third transducer located out of the plane of FIG. 1*b* (not shown in figure) is used to introduce changes in angular orientation of reference object 62 that are orthogonal to the changes in angular orientation introduced by transducers 150 and 152.

By operating in the reference frame, the integration or sampling time for detector 70 can be selected to optimize the signal-to-noise ratio for the conjugated quadratures obtained from analyzing the arrays of electrical interference values 72 independent of vibration effects and environmental effects that generate linear and/or rotational displacement effects. In the reference frame, measurement object 60 is stationary with respect to reference object 62 with respect to linear and/or rotational displacement effects. Therefore the integration or sampling time controlled by shutter 168 or a shutter in detector 70 may be long compared to a characteristic time of vibrations and environmental changes that generate linear and/or rotational displacement effects. The effects of rotation and deformation and gradients in environmental changes can be reduced by a rotation and/or deformation of reference object 62 relative to measurement object 60 by use of transducers and/or compensated in processing of measured arrays of electrical signal values.

Bandwidth for reduction of effects of vibration and environmental changes can be of the order of the maximum frequency switching time of source 18 which is of the order of 1 MHz for a source such as the ECDL described in U.S. Provisional Patent Application No. 60/699,951 and No. 60/805,104 and U.S. patent application Ser. No. 11/457,025. The wavelength of the ECDL may for example be in the visible or infrared. With respect to the signal acquisition and processing, the conjugated quadratures of fields of return measurement beams are obtained by making a set of at least three measurements of the electrical interference signal 72. In the single-homodyne detection method, a known sequence of phase shifts is introduced between the reference beam component and the return measurement beam component of the output beam 34 in the acquisition of the at least three measurements of the electrical interference signal 72. A sequence of commonly used four phase shift values is 0, $\pi/4$, $\pi/2$, and $3\pi/2$. For reference, the data processing procedure used to extract the conjugated quadratures of the reflected/scattered fields for the set of phase shifts values for a single-homodyne detection method is the same as the corresponding procedure described for example in U.S. Pat. No. 6,445,453 entitled "Scanning Interferometric Near-Field Confocal Microscopy" by Henry A. Hill, the contents of which are incorporated herein in their entirety by reference. The processing procedure is also described by Schwider ibid.

Electrical Interference Signal

The bi-homodyne detection method uses a single detector element for each electrical interference signal value obtained and an input beam to an interferometer system comprising two encoded components wherein each encoded component corresponds to a component of a conjugated quadratures. The encoding may be employ frequency encoding such as described in referenced U.S. Provisional Patent Application No. 60/442,858 and U.S. patent application Ser. No. 10/765,368; polarization encoding such as described in referenced U.S. Provisional Patent Application No. 60/459,425 and U.S. patent application Ser. No. 10/816,180; temporal encoding such as described in referenced U.S. Provisional Patent Application No. 60/602,046 and U.S. patent application Ser. No. 11/204,758; and spatial encoding such as described in referenced U.S. Provisional Patent Application No. 60/501,666 and U.S. patent application Ser. No. 10/938,408.

One encoded component of a reference beam and a corresponding encoded component of a measurement beam are used to generate an electrical interference signal component corresponding to a first component of conjugated quadratures of a field of a corresponding measurement beam comprising either a reflected and/or scattered or transmitted field from a spot in or on a measurement object that is conjugate to the detector element. A second encoded component of the reference beam and a corresponding encoded component of the measurement beam are used to generate a second electrical interference signal component corresponding to a respective second component of the conjugated quadratures of the field. Information about the first and second components of the conjugated quadratures are obtained jointly as a consequence of the two encoded components of the reference beam being coextensive in space and the two corresponding encoded components of the measurement beam being coextensive in space and also having the same or effectively the same temporal window function in the interferometer system.

The quad-homodyne detection method uses two detectors and an input beam to an interferometer system comprising four coextensive measurement beams and corresponding reference beams in the interferometer system simultaneously to obtain four electrical signal values wherein each measured value of an electrical interference signal contains simultaneously information about two orthogonal components of a conjugated quadratures for a joint measurement of conjugated quadratures of a field of a beam either reflected and/or scattered or transmitted by a spot on or in a substrate. One detector element is used to obtain two electrical interference signal values and the second detector element is used to obtain two other of the four electrical interference signal values.

The four coextensive measurement beams and corresponding reference beams are generated in the interferometer system simultaneously by using an input beam that comprises four frequency components wherein each frequency component corresponds to a measurement and corresponding reference beam. The frequency differences of the four frequency components are such that the four frequency components are resolved by an analyzer into two beams incident on the two different detector elements wherein each of the two beams comprises two different frequency components and the frequency differences are large compared to the frequency bandwidth of the detector. One of the two frequency components incident on a first detector element is used to generate an electrical interference signal component corresponding to a first component of conjugated quadratures of a field of a corresponding measurement beam comprising either a reflected and/or scattered or transmitted far-field or near-field from a spot in or on a measurement object that is conjugate to a detector element. The second of the two frequency components incident on the first detector element is used to generate a second electrical interference signal component corresponding to a respective second component of the conjugated quadratures of the field. The description for the second detector element with respect to frequency components and components of conjugated quadratures is the same as the corresponding description with respect to the first detector element.

Information about the first and second components of the conjugated quadratures are accordingly obtained jointly as a consequence of the four frequency components being coextensive in space and having the same temporal window function in the interferometer system. The temporal window function when operating in a scanning mode corresponds to the window function or a respective envelop of a frequency component of input beam 24 to the interferometer system.

Referring to the single- and bi-homodyne detection methods used in various embodiments of the present invention, a set of at least three electrical interference signal values are obtained for each spot on and/or in substrate 60 being imaged. The set of at least three electrical interference signal values $S_j$, j=1,2,3, ..., q where q is an integer, used for obtaining conjugated quadratures of fields for a single spot on and/or in a substrate being imaged is represented for the single- and bi-homodyne detection methods within a scale factor by the formula $$S_j = P_j \begin{cases} \xi_j^2 |A_1|^2 + \zeta_j^2 |B_1|^2 + \eta_j^2 |C_1|^2 + \zeta_j \eta_j 2|B_1||C_1|\cos\varphi_{B_1 C_1 \varepsilon_j} + \\ \xi_j \zeta_j 2|A_1||B_1|\cos\varphi_{A_1 B_1 \varepsilon_j} + \varepsilon_j \xi_j \eta_j 2|A_1||C_1|\cos\varphi_{A_1 C_1, j} + \\ \xi_j^2 |A_2|^2 + \zeta_j^2 |B_2|^2 + \eta_j^2 |C_2|^2 + \zeta_j \eta_j 2|B_2||C_2|\cos\varphi_{B_2 C_2 \gamma_j} + \\ \xi_j \zeta_j 2|A_2||B_2|\cos\varphi_{A_2 B_2 \gamma_j} + \gamma_j \xi_j \eta_j 2|A_2||C_2|\cos\varphi_{A_2 C_2, j} \end{cases} \quad (30)$$

where $\phi_{A_1 C_1, j}$ and $\phi_{A_2 C_2, j}$ include the effects of the phase shifts introduced by vibrations, environmental changes, and/or a tilt between reference and measurement object 62 and 60; coefficients $A_1$ and $A_2$ represent the amplitudes of the reference beams corresponding to the first and second frequency components of the input beam; coefficients $B_1$ and $B_2$ represent the amplitudes of background beams corresponding to reference beams $A_1$ and $A_2$, respectively; coefficients $C_1$ and $C_2$ represent the amplitudes of the return measurement beams corresponding to reference beams $A_1$ and $A_2$, respectively; $P_j$ represents the integrated intensity of the first frequency component of the input beam during the integration period used by detector 70 to acquire electrical interference signal value $S_j$; and $\epsilon_j = \pm 1$ and $\gamma_j = \pm 1$. The change in the values of $\epsilon_j$ and $\gamma_j$ from 1 to −1 or from −1 to 1 correspond to changes in relative phases of respective reference and measurement beams. The coefficients $\xi_j$, $\zeta_j$, and $\eta_j$ represent effects of variations in properties of a conjugate set of four pinholes such as size and shape if used in the generation of the spot on and/or in substrate 60 and the sensitivities of a conjugate set of four detector pixels corresponding to the spot on and/or in substrate 60 for the reference beam, the background beam, and the return measurement beam, respectively.

A set of values for $\epsilon_j$ and $\gamma_j$ is listed in Table 5 for single-homodyne detection methods when using a set of 4 phase shift values. The phase shifting algorithm corresponding to $\epsilon_j$ and $\gamma_j$ values listed in Table 5 as a schedule 1 corresponds to the algorithm based on the standard set of four phase shift values of 0, $\pi/2$, $\pi$, and $3\pi/2$. The corresponding single-homodyne detection method exhibits a first order sensitivity to effects of vibrations and environmental changes with a peak in sensitivity at a zero frequency value for components of the Fourier spectrum of effects of vibrations and environmental changes.

TABLE 5

Single-Homodyne Detection Method: Schedule 1

| j | $\epsilon_j$ | $\gamma_j$ | $\epsilon_j\gamma_j$ |
|---|---|---|---|
| 1 | +1 | 0 | 0 |
| 2 | 0 | +1 | 0 |
| 3 | −1 | 0 | 0 |
| 4 | 0 | −1 | 0 |

A phase shift algorithm based on five phase shift values that exhibits a second order sensitivity to effects of vibrations and environmental changes was introduced by J. Schwider, R. Burow, K.-E. Elssner, J. Grzanna, R. Spolaczyk, and K. Merkel in an article entitled "Digital wave-front measuring interferometry: some systematic error sources," *Appl. Opt.* 22, pp 3421-3432 (1983) [also see discussion by P. de Groot in an article entitled "Vibration in phase-shifting interferometry," *J. Opt. Soc. Am. A* 12, pp 354-365 (1995)]. The phase shift algorithm based on five phase shift values exhibits in addition to the second order sensitivity a peak in sensitivity at a non-zero frequency value for components of the Fourier spectrum of effects of vibrations and environmental changes. The phase shift algorithm based on five phase shift values was later popularized by P. Hariharan, B. F. Oreb, and T. Eiju in an article entitled "Digital phase-shifting interferometry: a simple error-compensating phase calculation algorithm," *Appl. Opt.* 26, pp 2504-2506 (1987) and by J. E. Breivenkamp and J. H. Bruning in an article entitled "Phase shifting interferometry," in *Optical Shop Testing*, D. Malacara, ed. (Wiley, New York, 1992). The advantage represented by a second order sensitivity as compared to a first order sensitivity has been important for large-aperture interferometry because of the difficulty in precisely calibrating piezoelectric transducers that perform the phase stepping and because of complications that arise with fast spherical cavities.

There are sets of four phase shift values disclosed herein for use in single-homodyne detection methods that also exhibit only a second order sensitivity to effects of vibrations and environmental changes, e.g., a first set 0, $\pi/2$, $-\pi/2$, and $\pm\pi$ and a second set $\pi/2$, 0, $\pm\pi$, and $-\pi/2$. A set of values of $\epsilon_j$ and $\gamma_j$ corresponding to a second set of phase shifts 0, $\pi/2$, $-\pi/2$, and $\pm\pi$ is listed in Table 6 as Schedule 2. The algorithm based on the first set of phase shift values listed in Table 6 exhibits only a second order sensitivity to effects of vibrations and environmental changes with a peak in sensitivity at a non-zero frequency value for components of the Fourier spectrum of effects of vibrations and environmental changes.

Table 7 lists as schedule 3 a set of values for $\epsilon_j$ and $\gamma_j$ for a bi-homodyne detection method that corresponds to the standard set of phase shifts 0, $\pi/2$, $\pi$, and $3\pi/2$ which is the same as Table 1 in referenced U.S. Provisional Patent Application No. 60/442,858 and U.S. patent application Ser. No. 10/765,368. The bi-homodyne

TABLE 6

Single-Homodyne Detection Method: Schedule 2

| j | $\epsilon_j$ | $\gamma_j$ | $\epsilon_j\gamma_j$ |
|---|---|---|---|
| 1 | +1 | 0 | 0 |
| 2 | 0 | +1 | 0 |
| 3 | 0 | −1 | 0 |
| 4 | −1 | 0 | 0 | detection method using the set of values of $\epsilon_j$ and $\gamma_j$ listed in Table 7 exhibits a first order sensitivity to effects of vibration and environmental changes with a peak in sensitivity at a zero frequency value for components of the Fourier spectrum of effects of vibrations and environmental changes.

TABLE 7

Bi-Homodyne Detection Method: Schedule 3

| j | $\epsilon_j$ | $\gamma_j$ | $\epsilon_j\gamma_j$ |
|---|---|---|---|
| 1 | +1 | +1 | +1 |
| 2 | −1 | −1 | +1 |
| 3 | −1 | +1 | −1 |
| 4 | +1 | −1 | −1 |

There are disclosed herein sets of values of $\epsilon_j$ and $\gamma_j$, an example of which is listed in Table 8 as schedule 4, for a bi-homodyne detection method that exhibits, for a sequence of q phase shift values where q is an even integer value, a second order sensitivity to effects of vibrations and environmental changes with a peak in sensitivity at a non-zero frequency value for components of the Fourier spectrum of effects of vibrations and environmental changes. The properties of the bi-homodyne detection methods with respect to whether there is a second order sensitivity to effects of vibrations and environmental changes is determined by the symmetry properties of $\epsilon_j\gamma_j$ about the value of j, i.e., $j=(q+1)/2$. The second order sensitivity to effects of vibration and environmental changes is further described in the description of the first embodiment of the present invention.

TABLE 8

Bi-Homodyne Detection Method: Schedule 4 Periodic in j with period of 4 in j

| j | $\epsilon_j$ | $\gamma_j$ | $\epsilon_j\gamma_j$ |
|---|---|---|---|
| 1 | +1 | +1 | +1 |
| 2 | +1 | −1 | −1 |
| 3 | −1 | −1 | +1 |
| 4 | −1 | +1 | −1 |
| 5 | +1 | +1 | +1 |
| 6 | +1 | −1 | −1 |
| 7 | −1 | −1 | +1 |
| 8 | −1 | +1 | −1 |

In summary, the single homodyne set of $\epsilon_j$ and $\gamma_j$ given in Table 5 and the bi-homodyne set of $\epsilon_j$ and $\gamma_j$ given in Table 7 lead to first order sensitivities of respective measured conjugated quadratures to vibrations and environmental changes with a peak in sensitivity at a zero frequency value for components of the Fourier spectrum of effects of vibrations and environmental changes and the single homodyne set of $\epsilon_j$ and $\gamma_j$ given in Table 6 and the bi-homodyne set of $\epsilon_j$ and $\gamma_j$ given in Table 8 lead for values of q=4 and 8 to second order sensitivities of respective measured conjugated quadratures to vibrations and environmental changes with a peak in sensitivity at a non-zero frequency value for components of the Fourier spectrum of effects of vibrations and environmental changes approximately zero frequencies. These properties with respect to Tables 5, 6, 7, and 8 are developed in the subsequent description of the first embodiment of the present invention as well the properties with respect to representation or appearance of the effects of vibrations and environmental changes as cyclic errors.

Note that first four rows of Table 8 are obtained from Table 7 by the simple permutation of row 2 and row 4. The $\epsilon_j$ and $\gamma_j$ schedule given in Table 8 is periodic in j with a period of 4 in j. Accordingly, the length of the $\epsilon_j$ and $\gamma_j$ schedule given in Table 8 can easily be extended in length as required by reproducing the periodic structure. Similar statements also apply to the $\epsilon_j$ and $\gamma_j$ schedules Tables 5, 6, and 7.

It is assumed in Eq. (30) that the ratio of $|A_2|/|A_1|$ is not dependent on j or on the value of $P_j$. In order to simplify the representation of $S_j$ so as to project the important features without departing from either the scope or spirit of the present invention, it is also assumed in Eq. (30) that the ratio of the amplitudes of the return measurement beams corresponding to $A_2$ and $A_1$ is not dependent on j or on the value of $P_j$ although this can be accommodated in the first embodiment by replacing $P_j$ with $P_{j,m}$ for amplitude $A_m$. However, the ratio $|C_2|/|C_1|$ will be different from the ratio $|A_2|/|A_1|$ when the ratio of the amplitudes of the measurement beam components corresponding to $A_2$ and $A_1$ are different from the ratio $|A_2|/|A_1|$.

Noting that $\cos\phi_{A_2C_2,j} = \pm\sin\phi_{A_1C_1,j}$ by the control of the relative phase shifts between corresponding reference and return measurement beam components in beam 34, Eq. (30) may be rewritten as $$S_j = P_j \begin{Bmatrix} \xi_j^2(|A_1|^2+|A_2|^2) + \zeta_j^2(|B_1|^2+|B_2|^2) + \eta_j^2(|C_1|^2+|C_2|^2) + \\ 2\xi_j\zeta_j(|A_1||B_1|\cos\varphi_{A_1B_1\epsilon_j} + |A_2||B_2|\cos\varphi_{A_2B_2\gamma_j}) + \\ 2\xi_j\eta_j\begin{bmatrix} \epsilon_j|A_1||C_1|\cos\varphi_{A_1C_1,j} + \\ \gamma_j\left(\frac{|A_2|}{|A_1|}\right)\left(\frac{|C_2|}{|C_1|}\right)|A_1||C_1|\sin\varphi_{A_1C_1,j} \end{bmatrix} + \\ 2\zeta_j\eta_j(\epsilon_j|B_1||C_1|\cos\varphi_{B_1C_1\epsilon_j} + \gamma_j|B_2||C_2|\cos\varphi_{B_2C_2\gamma_j}) \end{Bmatrix} \quad (31)$$

where the relationship $\cos\phi_{A_2C_2,j} = \sin\phi_{A_1C_1,j}$ has been used without departing from either the scope or spirit of the present invention.

The change in phase $\phi_{A_1B_1\epsilon_j}$ for a change in $\epsilon_j$ and the change in phase $\phi_{A_1B_1\epsilon_j}$ for a change in $\gamma_j$ may be different from $\pi$ in embodiments depending on where and how the background beam is generated. It may be of value in evaluating the effects of the background beams to note that the factor $\cos\phi_{B_1C_1\epsilon\epsilon_j}$ may be written as $\cos[\phi_{A_1C_1,j}+(\phi_{B_1C_1\epsilon_j}-\phi_{A_1C_1,j})]$ where the phase difference $(\phi_{B_1C_1\epsilon_j}-\phi_{A_1C_1,j})$ is the same as the phase $\phi_{A_1B_1\epsilon_j}$, i.e., $\cos\phi_{B_1C_1\epsilon_j} = \cos(\phi_{A_1C_1,j}+\phi_{A_1B_1\epsilon_j})$.

It is evident from inspection of Eq. (31) that the term in Eq. (31) corresponding to the component of conjugated quadratures $|C_1|\cos\phi_{A_1C_1,j}$ is a rectangular function that has a mean value of zero and is antisymmetric about j=2.5 since $\epsilon_j$ is antisymmetric about j=2.5 with respect to the values of $\epsilon_j$ in Table 7 and has a mean value of zero and is antisymmetric about I=(q+1)/2 for q=4,8, ... since $\epsilon_j$ is antisymmetric about j=(q+1)/2 with respect to the values of $\epsilon_j$ in Table 8. In addition the term in Eq. (31) corresponding to the component of conjugated quadratures $|C_1|\sin\phi_{A_1C_1,j}$ in Eq. (31) is a rectangular function that has a mean value of zero and is antisymmetric about j=(q+1)/2 for q=4,8, ... since $\gamma_j$ is a antisymmetric function about j=(q+1)/2 with respect to the respective values of $\gamma_j$ in both Tables 7 and 8. Another important property by the design of the bi-homodyne detection method for values of q=4 and 8 is that the conjugated quadratures $|C_1|\cos\phi_{A_1C_1,j}$ and $|C_1|\sin\phi_{A_1C_1,j}$ terms are orthogonal over the range of j=1, 2, ..., q since $\epsilon_j$ and $\gamma_j$ are orthogonal over the range of j=1, 2, ..., q, i.e., $$\sum_{j=1}^{q} \epsilon_j\gamma_j = 0$$

with respect to the values of corresponding $\epsilon_j$ and $\gamma_j$ in both Tables 7 and 8.

Information about conjugated quadratures $|C_1|\cos\phi_{A_1C_1,j}$ and $|C_1|\sin\phi_{A_1C_1,j}$ are obtained for the case of q=5 in a multiple-homodyne detection method (different from the five phase shift method introduced by J. Schwider, R. Burow, K.-E. Elssner, J. Grzanna, R. Spolaczyk, and K. Merkel, supra) using a weighing function $W_{j,\bar{j}}$ applied to the signal values $S_j$, the schedule for $\epsilon_j$ and $\gamma_j$ given in Table 8, the symmetry properties and orthogonality property of the conjugated quadratures terms in Eq. (31), and the following digital filters:

$$F_{1,\bar{j}}(S) = \sum_{j=\bar{j}-2}^{\bar{j}+2} w_{j,\bar{j}}\epsilon_j \frac{S_j}{P_j'\xi_j'^2} = (|A_1|^2+|A_2|^2)\sum_{j=\bar{j}-2}^{\bar{j}+2} w_{j,\bar{j}}\epsilon_j\left(\frac{P_j}{P_j'}\right)\left(\frac{\xi_j^2}{\xi_j'^2}\right) + \quad (32)$$

$$(|B_1|^2+|B_2|^2)\sum_{j=\bar{j}-2}^{\bar{j}+2} w_{j,\bar{j}}\epsilon_j\left(\frac{P_j}{P_j'}\right)\left(\frac{\zeta_j^2}{\xi_j'^2}\right) +$$

$$(|C_1|^2+|C_2|^2)\sum_{j=\bar{j}-2}^{\bar{j}+2} w_{j,\bar{j}}\epsilon_j\left(\frac{P_j}{P_j'}\right)\left(\frac{\eta_j^2}{\xi_j'^2}\right) +$$

$$2|A_1||C_1|\sum_{j=\bar{j}-2}^{\bar{j}+2} w_{j,\bar{j}}\epsilon_j^2\left(\frac{P_j}{P_j'}\right)\left(\frac{\xi_j\eta_j}{\xi_j'^2}\right)\cos\varphi_{A_1C_1,j} +$$

$$2\left(\frac{|A_2|}{|A_1|}\right)\left(\frac{|C_2|}{|C_1|}\right)|A_1||C_1|\sum_{j=\bar{j}-2}^{\bar{j}+2} w_{j,\bar{j}}\epsilon_j\gamma_j\left(\frac{P_j}{P_j'}\right)\left(\frac{\xi_j\eta_j}{\xi_j'^2}\right)\sin\varphi_{A_1C_1,j} +$$

$$2|A_1||B_1|\sum_{j=\bar{j}-2}^{\bar{j}+2} w_{j,\bar{j}}\epsilon_j\left(\frac{P_j}{P_j'}\right)\left(\frac{\xi_j\zeta_j}{\xi_j'^2}\right)\cos\varphi_{A_1B_1\epsilon_j} +$$

-continued $$2|A_2||B_2|\sum_{j=\bar{j}-2}^{\bar{j}+2} w_{j,\bar{j}}\varepsilon_j\left(\frac{P_j}{P'_j}\right)\left(\frac{\xi_j\zeta_j}{\xi'^2_j}\right)\cos\varphi_{A_2B_2\gamma_j} +$$

$$2|B_1||C_1|\sum_{j=\bar{j}-2}^{\bar{j}+2} w_{j,\bar{j}}\left(\frac{P_j}{P'_j}\right)\left(\frac{\xi_j\eta_j}{\xi'^2_j}\right)\cos\varphi_{B_1C_1\varepsilon_j} +$$

$$2|B_2||C_2|\sum_{j=\bar{j}-2}^{\bar{j}+2} w_{j,\bar{j}}\varepsilon_j\gamma_j\left(\frac{P_j}{P'_j}\right)\left(\frac{\xi_j\eta_j}{\xi'^2_j}\right)\cos\varphi_{B_2C_2\gamma_j},$$

$$F_{2,\bar{j}}(S) = \tag{33}$$

$$\sum_{j=\bar{j}-2}^{\bar{j}+2} w_{j,\bar{j}}\gamma_j\frac{S_j}{P_j\xi'^2_j} = (|A_1|^2+|A_2|^2)\sum_{j=\bar{j}-2}^{\bar{j}+2} w_{j,\bar{j}}\gamma_j\left(\frac{P_j}{P'_j}\right)\left(\frac{\xi^2_j}{\xi'^2_j}\right) +$$

$$(|B_1|^2+|B_2|^2)\sum_{j=\bar{j}-2}^{\bar{j}+2} w_{j,\bar{j}}\gamma_j\left(\frac{P_j}{P'_j}\right)\left(\frac{\zeta^2_j}{\xi'^2_j}\right) +$$

$$(|C_1|^2+|C_2|^2)\sum_{j=\bar{j}-2}^{\bar{j}+2} w_{j,\bar{j}}\gamma_j\left(\frac{P_j}{P'_j}\right)\left(\frac{\eta^2_j}{\xi'^2_j}\right) +$$

$$2|A_1||C_1|\sum_{j=\bar{j}-2}^{\bar{j}+2} w_{j,\bar{j}}\gamma_j\left(\frac{P_j}{P'_j}\right)\left(\frac{\xi_j\eta_j}{\xi'^2_j}\right)\cos\varphi_{A_1C_1,j} +$$

$$2\left(\frac{|A_2|}{|A_1|}\right)\left(\frac{|C_2|}{|C_1|}\right)|A_1||C_1|\sum_{j=\bar{j}-2}^{\bar{j}+2} w_{j,\bar{j}}\gamma^2_j\left(\frac{P_j}{P'_j}\right)\left(\frac{\xi_j\eta_j}{\xi'^2_j}\right)\sin\varphi_{A_1C_1,j} +$$

$$2|A_1||B_1|\sum_{j=\bar{j}-2}^{\bar{j}+2} w_{j,\bar{j}}\gamma_j\left(\frac{P_j}{P'_j}\right)\left(\frac{\xi_j\zeta_j}{\xi'^2_j}\right)\cos\varphi_{A_1B_1\varepsilon_j} +$$

$$2|A_2||B_2|\sum_{j=\bar{j}-2}^{\bar{j}+2} w_{j,\bar{j}}\gamma_j\left(\frac{P_j}{P'_j}\right)\left(\frac{\xi_j\zeta_j}{\xi'^2_j}\right)\cos\varphi_{A_2B_2\gamma_j} +$$

$$2|B_1||C_1|\sum_{j=\bar{j}-2}^{\bar{j}+2} w_{j,\bar{j}}\varepsilon_j\gamma_j\left(\frac{P_j}{P'_j}\right)\left(\frac{\xi_j\eta_j}{\xi'^2_j}\right)\cos\varphi_{B_1C_1\varepsilon_j} +$$

$$2|B_2||C_2|\sum_{j=\bar{j}-2}^{\bar{j}+2} w_{j,\bar{j}}\left(\frac{P_j}{P'_j}\right)\left(\frac{\xi_j\eta_j}{\xi'^2_j}\right)\cos\varphi_{B_2C_2\gamma_j}$$

where $\xi'_j$ and $P'_j$ are values used in the digital filters to represent $\xi_j$ and $P_j$ and weighting function $w_{j,\bar{j}}$ is defined as $$w_{j,\bar{j}} \equiv \begin{cases} 1/2, & |j-\bar{j}|=2 \\ 1, & |j-\bar{j}| \neq 2. \end{cases} \tag{34}$$

Note that the full width of weighing function $w_{j,\bar{j}}$ at half maximum is $\Delta j=3$ which is the same width as the corresponding effective width for the case of q=4 when not using a weighting function.

The parameter $$\left[\left(\frac{|A_2|}{|A_1|}\right)\left(\frac{|C_2|}{|C_1|}\right)\right] \tag{35}$$

in Eqs. (32) and (33) needs to be determined in order complete the determination of a conjugated quadratures. The parameter given in Eq. (35) can be measured for example by introducing $\pi/2$ phase shifts into the relative phase of the reference beam and the measurement beam and repeating the measurement for the conjugated quadratures. The ratio of the amplitudes of the conjugated quadratures corresponding to (sin $\phi_{A_1C_1}$/cos $\phi_{A_1C_1}$) from the first measurement divided by the ratio of the amplitudes of the conjugated quadratures corresponding to (sin $\phi_{A_1C_1}$/cos $\phi_{A_1C_1}$) from the second measurement is equal to $$\left[\left(\frac{|A_2|}{|A_1|}\right)\left(\frac{|C_2|}{|C_1|}\right)\right]^2. \tag{36}$$

Note that certain of the factors in Eqs. (32) and (33) have nominal values of 4 within scale factors, e.g., $$\sum_{j=\bar{j}-2}^{\bar{j}+2} w_{j,\bar{j}}\left(\frac{P_j}{P'_j}\right)\left(\frac{\xi_j\eta_j}{\xi'^2_j}\right) \simeq 4, \quad \sum_{j=\bar{j}-2}^{\bar{j}+2} w_{j,\bar{j}}\left(\frac{P_j}{P'_j}\right)\left(\frac{\zeta_j\eta_j}{\xi'^2_j}\right) \simeq 4. \tag{37}$$

The scale factors correspond to the average values for the ratios of $\xi'_j/\eta_j$ and $\xi'_j/\zeta_j$, respectively, assuming that the average value of $P_j/P'_j \cong 1$. Certain other of the factors in Eqs. (32) and (33) have nominal values of zero for values of q=5, e.g., $$\sum_{j=\bar{j}-2}^{\bar{j}+2} w_{j,\bar{j}}\varepsilon_j\left(\frac{P_j}{P'_j}\right)\left(\frac{\xi^2_j}{\xi'^2_j}\right) \simeq 0, \quad \sum_{j=\bar{j}-2}^{\bar{j}+2} w_{j,\bar{j}}\varepsilon_j\left(\frac{P_j}{P'_j}\right)\left(\frac{\zeta^2_j}{\xi'^2_j}\right) \simeq 0, \tag{38}$$

$$\sum_{j=\bar{j}-2}^{\bar{j}+2} w_{j,\bar{j}}\varepsilon_j\left(\frac{P_j}{P'_j}\right)\left(\frac{\eta^2_j}{\xi'^2_j}\right) \simeq 0,$$

$$\sum_{j=\bar{j}-2}^{\bar{j}+2} w_{j,\bar{j}}\gamma_j\left(\frac{P_j}{P'_j}\right)\left(\frac{\xi^2_j}{\xi'^2_j}\right) \simeq 0, \quad \sum_{j=\bar{j}-2}^{\bar{j}+2} w_{j,\bar{j}}\gamma_j\left(\frac{P_j}{P'_j}\right)\left(\frac{\zeta^2_j}{\xi'^2_j}\right) \simeq 0,$$

$$\sum_{j=\bar{j}-2}^{\bar{j}+2} w_{j,\bar{j}}\gamma_j\left(\frac{P_j}{P'_j}\right)\left(\frac{\eta^2_j}{\xi'^2_j}\right) \simeq 0,$$

$$\sum_{j=\bar{j}-2}^{\bar{j}+2} w_{j,\bar{j}}\varepsilon_j\gamma_j\left(\frac{P_j}{P'_j}\right)\left(\frac{\xi_j\eta_j}{\xi'^2_j}\right) \simeq 0.$$

The remaining factors, $$\sum_{j=\bar{j}-2}^{\bar{j}+2} w_{j,\bar{j}} \varepsilon_j \left(\frac{P_j}{P'_j}\right)\left(\frac{\xi_j \zeta_j}{\xi'^2_j}\right) \cos\varphi_{A_1 B_1 \varepsilon_j}, \quad (39)$$

$$\sum_{j=\bar{j}-2}^{\bar{j}+2} w_{j,\bar{j}} \varepsilon_j \left(\frac{P_j}{P'_j}\right)\left(\frac{\xi_j \zeta_j}{\xi'^2_j}\right) \cos\varphi_{A_2 B_2 \gamma_j},$$

$$\sum_{j=\bar{j}-2}^{\bar{j}+2} w_{j,\bar{j}} \left(\frac{P_j}{P'_j}\right)\left(\frac{\zeta_j \eta_j}{\xi'^2_j}\right) \cos\varphi_{B_1 C_1 \varepsilon_j},$$

$$\sum_{j=\bar{j}-2}^{\bar{j}+2} w_{j,\bar{j}} \varepsilon_j \gamma_j \left(\frac{P_j}{P'_j}\right)\left(\frac{\zeta_j \eta_j}{\xi'^2_j}\right) \cos\varphi_{B_2 C_2 \gamma_j},$$

$$\sum_{j=\bar{j}-2}^{\bar{j}+2} w_{j,\bar{j}} \gamma_j \left(\frac{P_j}{P'_j}\right)\left(\frac{\xi_j \zeta_j}{\xi'^2_j}\right) \cos\varphi_{A_1 B_1 \varepsilon_j},$$

$$\sum_{j=\bar{j}-2}^{\bar{j}+2} w_{j,\bar{j}} \gamma_j \left(\frac{P_j}{P'_j}\right)\left(\frac{\xi_j \zeta_j}{\xi'^2_j}\right) \cos\varphi_{A_2 B_2 \gamma_j},$$

$$\sum_{j=\bar{j}-2}^{\bar{j}+2} w_{j,\bar{j}} \varepsilon_j \gamma_j \left(\frac{P_j}{P'_j}\right)\left(\frac{\zeta_j \eta_j}{\xi'^2_j}\right) \cos\varphi_{B_1 C_1 \varepsilon_j},$$

$$\sum_{j=\bar{j}-2}^{\bar{j}+2} w_{j,\bar{j}} \left(\frac{P_j}{P'_j}\right)\left(\frac{\zeta_j \eta_j}{\xi'^2_j}\right) \cos\varphi_{B_2 C_2 \gamma_j},$$

will have for values of q=5 nominal magnitudes ranging from approximately zero to approximately 4 times a cosine factor and either the average value of factor $(P_j/P'_j)(\xi_j\zeta_j/\xi'^2_j)$ or $(P_j/P'_j)(\zeta_j\eta_j/\xi'^2_j)$ depending on the properties respective phases. For the portion of the background with phases that do not track to a first approximation the phases of the respective measurement beams, the magnitudes of all of the terms listed in the Eq. (39) will be approximately zero. For the portion of the background with phases that do track to a first approximation the phases of the respective measurement beams, the magnitudes of the terms listed in Eq. (39) will be approximately 4 times a cosine factor and either the average value of factor $(P_j/P'_j)(\xi_j\zeta_j/\xi'^2_j)$ and or factor $(P_j/P'_j)(\zeta_j\eta_j/\xi'^2_j)$.

The two largest terms in Eqs. (32) and (33) are generally the terms that have the factors $(|A_1|^2+|A_2|^2)$ and $(|B_1|^2+|B_2|^2)$. However, the corresponding terms are substantially eliminated by selection of $\xi'_j$ values for the terms that have $(|A_1|^2+|A_2|_2)$ as a factor and by the design of $\zeta_j$ values for the terms that have $(|B_1|^2+|B_2|^2)$ a factor as shown in Eqs. (32) and (33).

The largest contribution from effects of background is represented by the contribution to the interference term between the reference beam and the portion of the background beam generated by the measurement beam 30A. This portion of the effect of the background can be measured by measuring the corresponding conjugated quadratures of the portion of the background with the return measurement beam component of beam 34 set equal to zero, i.e., measuring the respective electrical interference signals $S_j$ with substrate 60 removed and with either $|A_2|=0$ or $|A_1|=0$ and visa versa. The measured conjugated quadratures of the portion of the effect of the background can than used to compensate for the respective background effects beneficially in an end use application if required.

Information about the largest contribution from effects of background amplitude $2\xi_j\zeta_j|A_1||B_1|$ and phase $\phi_{A_1B_1\varepsilon_j}$, i.e., the interference term between the reference beam and the portion of background beam generated by the measurement beam 30A, may be obtained by measuring $S_j$ for $\bar{j}-2 \leq j \leq \bar{j}+2$ as a function of relative phase shift between reference beam and the measurement beam 30A with substrate 60 removed and either $|A_2|=0$ or $|A_1|=0$ and visa versa and Fourier analyzing the measured values of $S_j$. Such information can be used to help identify the origin of the respective background.

Other techniques may be incorporated to reduce and/or compensate for the effects of background beams without departing from either the scope or spirit of the present invention such as described in commonly owned U.S. Pat. No. 5,760,901 entitled "Method And Apparatus For Confocal Interference Microscopy With Background Amplitude Reduction and Compensation," U.S. Pat. No. 5,915,048 entitled "Method and Apparatus for Discrimination In-Focus Images from Out-of-Focus Light Signals from Background and Foreground Light Sources," and U.S. Pat. No. 6,480,285 B1 wherein each of the three patents are by Henry A. Hill. The contents of each of the three patents are herein incorporated in their entirety by reference.

The selection of values for $\xi'_j$ is based on information about coefficients $\xi_j$ for j=1, 2, ..., q that may be obtained by measuring the $S_j$ for j=1, 2, ..., q with only the reference beam present in the interferometer system. In certain embodiments of the present invention, this may correspond simply blocking the measurement beam components of input beam 24 and in certain other embodiments, this may correspond to simply measuring the $S_j$ for j=1,2, ...,q with substrate 60 removed.

A test of the correctness of a set of values for is the degree to which the $(|A_1|^2+|A_2|^2)$ terms in Eqs. (32) and (33) are zero for values of q=5 (see subsequent description of the section entitled herein as "Interpretation of Effects of Vibrations and Environmental Changes as Cyclic Errors").

Information about coefficients $\xi_j \eta_j$ for j=1,2, ...,q may be obtained by scanning an artifact past the spots corresponding to the respective q conjugate detector pixels with either $|A_2|=0$ or $|A_1|=0$ and measuring the conjugated quadratures component $2|A_1||C_1|\cos\phi_{A_1C_1}$ or $2|A_1||C_1|\sin\phi_{A_1C_1}$, respectively. A change in the amplitude of the $2|A_1||C_1|\cos\phi_{A_1C_1}$ or $2|A_1||C_1|\sin\phi_{A_1C_1}$ term corresponds to a variation in $\xi_j\eta_j$ as a function of j. Information about the coefficients $\xi_j\eta_j$ for j=1,2, ..., q may be used for example to monitor the stability of one or more elements of interferometer system 10.

Detector 70 may comprise a CCD configured with an architecture that pairs each photosensitive pixel with a blanked-off storage pixel to which the integrated charge is shifted at the moment of an interline transfer. The interline transfer occurs in <1 µs and separates the odd and even fields of one image frame. If used with shutter 68 operated as synchronized shutter, adjacent integrations for corresponding electrical interference signal values, e.g., $S_j$ and $S_{j+1}$, of a millisecond or less can be recorded on either side of the moment of the line transfer. The interlaced electrical interference signal values may than be read-out at the frame rate of the respective CCD. With a readout system of this CCD configuration, the time to complete the acquisition of a sequence of the electrical signal values with q=4 is equal to the inverse of the frame read-out rate.

It is important that the advantage of using the CCD configured with the interline transfer architecture is enabled in various embodiments of the present invention by the use of source 18 based on the ECDL described in the U.S. Provisional Patent Application No. 60/699,951 and No. 60/805,104 and U.S. patent application Ser. No. 11/457,025 wherein the frequency of beam 24 can be switched at high rates, e.g., a MHz.

The bi-homodyne detection method is a robust technique for the determination of conjugated quadratures of fields. First, the conjugated quadratures $|C_1|\cos \phi_{A_1C_1}$ and $|C_1|\sin \phi_{A_1C_1}$ are the primary terms in the digitally filtered values $F_{1,\bar{j}}(S)$ and $F_{2,\bar{j}}(S)$, respectively, as expressed by Eqs. (32) and (33), respectively, since as noted in the discussion with respect to Eqs (32) and (33), the terms with the factors $(|A_1|^2+|A_2|^2)$ and $(|B_1|^2+|B_2|^2)$ are substantially zero for even values of q.

Secondly, the coefficients of factors $|C_1|\cos \phi_{A_1C_1}$ and $|C_2|\sin \phi_{A_1C_1}$ in Eqs. (32) and (33) are identical. Thus highly accurate measurements of the interference terms between the return measurement beam and the reference beam with respect to amplitudes and phases, i.e., highly accurate measurements of conjugated quadratures of fields can be measured wherein first order variations in $\xi_j$ and first order errors in normalizations such as $(P_j/P'_j)$ and $(\xi_j^2/\xi_j'^2)$ enter in only second or higher order. This property translates in a significant advantage. Also, the contributions to each component of the conjugated quadratures $|C_1|\cos \phi_{A_1C_1}$ and $|C_2|\sin \phi_{A_1C_1}$ from a respective set of q electrical interference signal values have the same window function and thus are obtained as jointly determined values.

Other distinguishing features of the bi-homodyne technique are evident in Eqs. (32) and (33): the coefficients of the conjugated quadratures $|C_1|\cos \phi_{A_1C_1}$ and $|C_1|\sin \phi_{A_1C_1}$ in Eqs. (32) and (33), respectively, corresponding to the first equation of Eqs. (37) are identical independent of errors in assumed values for $\xi'_j$ and the coefficients of the conjugated quadratures $|C_1|\sin \phi_{A_1C_1}$ and $|C_1|\cos \phi_{A_1C_1}$ in Eqs. (32) and (33), respectively, corresponding to the last equation of Eqs. (38) are identical independent of errors in assumed values for $\xi'_j$. Thus highly accurate values of the phases corresponding to conjugated quadratures can be measured with first order variations in $\xi_j$ and first order errors in normalizations such as $(P_j/P'_j)$ and $(\xi_j^2/\xi_j'^2)$ enter in only through some high order effect.

A yet other distinguishing feature of the bi-homodyne technique is evident in Eqs. (32) and (33) for $|\tan \phi_{A_1C_1\bar{j}}|\cong 1$, errors in the factors $$\sum_{j=1}^{q} w_{j,\bar{j}} \varepsilon_j \gamma_j \left(\frac{P_j}{P'_j}\right)\left(\frac{\xi_j \eta_j}{\xi_j'^2}\right) \sin\varphi_{A_1C_1,j}, \quad (40)$$

$$\sum_{j=1}^{q} w_{j,\bar{j}} \varepsilon_j \gamma_j \left(\frac{P_j}{P'_j}\right)\left(\frac{\xi_j \eta_j}{\xi_j'^2}\right) \cos\varphi_{A_1C_1,j} \quad (41)$$

in the right hand sides of Eqs. (32) and (33), respectively, cancel out in computing the phase $\phi_{A_1C_1\bar{j}}$ from the appropriate ratios of $F_{1,\bar{j}}(S)$ and $F_{2,\bar{j}}(S)$. Thus highly accurate values of the phase $\phi_{A_1C_1\bar{j}}$ corresponding to conjugated quadratures can be measured with first order effects of substrate effects enter in only through some high order effect when operating in a scanning mode.

It is also evident that since the conjugated quadratures of fields are obtained jointly when using the bi-homodyne detection method, there is a significant reduction in the potential for an error in tracking phase as a result of a phase redundancy unlike the situation possible in single-homodyne detection of conjugated quadratures of fields.

Reduction and Compensation for Effects of Vibration and Environmental Effects

The appearance of effects of vibrations and environmental changes is determined by expressing $\phi_{A_1C_1\bar{j}} \to \phi_{A_1C_1\bar{j}+\Delta\varphi_j}$ in Eqs. (32) and (33) where $\Delta\phi$ comprises the effects of vibration, environmental changes, tilts, and atmospheric turbulence effects between reference object 62 and measurement object 60. Eqs. (32) and (33) are rewritten accordingly as $$F_{1,\bar{j}}(S) = \sum_{j=\bar{j}-2}^{\bar{j}+2} w_{j,\bar{j}} \varepsilon_j \frac{S_j}{P'_j \xi_j'^2} = (|A_1|^2+|A_2|^2)\sum_{j=\bar{j}-2}^{\bar{j}+2} w_{j,\bar{j}} \varepsilon_j \left(\frac{P_j}{P'_j}\right)\left(\frac{\xi_j^2}{\xi_j'^2}\right) + \quad (42)$$

$$(|B_1|^2+|B_2|^2)\sum_{j=\bar{j}-2}^{\bar{j}+2} w_{j,\bar{j}} \varepsilon_j \left(\frac{P_j}{P'_j}\right)\left(\frac{\zeta_j^2}{\xi_j'^2}\right) +$$

$$(|C_1|^2+|C_2|^2)\sum_{j=\bar{j}-2}^{\bar{j}+2} w_{j,\bar{j}} \varepsilon_j \left(\frac{P_j}{P'_j}\right)\left(\frac{\eta_j^2}{\xi_j'^2}\right) +$$

$$2|A_1||C_1|\sum_{j=\bar{j}-2}^{\bar{j}+2} w_{j,\bar{j}} \varepsilon_j^2 \left(\frac{P_j}{P'_j}\right)\left(\frac{\xi_j \eta_j}{\xi_j'^2}\right)\begin{pmatrix}\cos\varphi_{A_1C_1} & \cos\Delta\varphi_j \\ -\sin\varphi_{A_1C_1} & \sin\Delta\varphi_j\end{pmatrix} +$$

$$2\left(\frac{|A_2|}{|A_1|}\right)\left(\frac{|C_2|}{|C_1|}\right)|A_1||C_1|$$

$$\sum_{j=\bar{j}-2}^{\bar{j}+2} w_{j,\bar{j}} \varepsilon_j \gamma_j \left(\frac{P_j}{P'_j}\right)\left(\frac{\xi_j \eta_j}{\xi_j'^2}\right)\begin{pmatrix}\sin\varphi_{A_1C_1} & \cos\Delta\varphi_j \\ +\cos\varphi_{A_1C_1} & \sin\Delta\varphi_j\end{pmatrix} + \ldots,$$

$$F_{2,\bar{j}}(S) = \sum_{j=\bar{j}-2}^{\bar{j}+2} w_{j,\bar{j}} \gamma_j \frac{S_j}{P'_j \xi_j'^2} = (|A_1|^2+|A_2|^2)\sum_{j=\bar{j}-2}^{\bar{j}+2} w_{j,\bar{j}} \gamma_j \left(\frac{P_j}{P'_j}\right)\left(\frac{\xi_j^2}{\xi_j'^2}\right) + \quad (43)$$

$$(|B_1|^2+|B_2|^2)\sum_{j=\bar{j}-2}^{\bar{j}+2} w_{j,\bar{j}} \gamma_j \left(\frac{P_j}{P'_j}\right)\left(\frac{\zeta_j^2}{\xi_j'^2}\right) +$$

$$(|C_1|^2+|C_2|^2)\sum_{j=\bar{j}-2}^{\bar{j}+2} w_{j,\bar{j}} \gamma_j \left(\frac{P_j}{P'_j}\right)\left(\frac{\eta_j^2}{\xi_j'^2}\right) +$$

$$2|A_1||C_1|\sum_{j=\bar{j}-2}^{\bar{j}+2} w_{j,\bar{j}} \varepsilon_j \gamma_j \left(\frac{P_j}{P'_j}\right)\left(\frac{\xi_j \eta_j}{\xi_j'^2}\right)\begin{pmatrix}\cos\varphi_{A_1C_1} & \cos\Delta\varphi_j \\ -\sin\varphi_{A_1C_1} & \sin\Delta\varphi_j\end{pmatrix} +$$

$$2\left(\frac{|A_2|}{|A_1|}\right)\left(\frac{|C_2|}{|C_1|}\right)|A_1||C_1|$$

$$\sum_{j=\bar{j}-2}^{\bar{j}+2} w_{j,\bar{j}} \gamma_j^2 \left(\frac{P_j}{P'_j}\right)\left(\frac{\xi_j \eta_j}{\xi_j'^2}\right)\begin{pmatrix}\sin\varphi_{A_1C_1} & \cos\Delta\varphi_j \\ +\cos\varphi_{A_1C_1} & \sin\Delta\varphi_j\end{pmatrix} + \ldots,$$

respectively.

Eqs. (42) and (43) are next written in a contracted form as $$F_{1,\bar{j}}(S) = a_{11,\bar{j}}\cos\phi_{A_1C_1\bar{j}} + a_{12,\bar{j}}\sin\phi_{A_1C_1\bar{j}} + a_{1,\bar{j}} + \ldots, \quad (44)$$

$$F_{2,\bar{j}}(S) = a_{21,\bar{j}}\cos\phi_{A_1C_1\bar{j}} + a_{22,\bar{j}}\sin\phi_{A_1C_1\bar{j}} + a_{2,\bar{j}} + \ldots, \quad (45)$$

where $$a_{11,\bar{j}} = b_{11,\bar{j}} + c_{11,\bar{j}}, \quad (46)$$

$$a_{12,\bar{j}} = b_{12,\bar{j}} + c_{12,\bar{j}}, \quad (47)$$

$$a_{21,\bar{j}} = b_{21,\bar{j}} + c_{21,\bar{j}}, \quad (48)$$

$$a_{22,\bar{j}} = b_{22,\bar{j}} + c_{22,\bar{j}}, \quad (49)$$

$$a_{1,\bar{j}} = (|A_1|^2 + |A_2|^2) \sum_{j=\bar{j}-2}^{\bar{j}+2} w_{j,\bar{j}} \varepsilon_j \left(\frac{P_j}{P'_j}\right)\left(\frac{\xi_j^2}{\xi_j'^2}\right) + \quad (50)$$

$$(|B_1|^2 + |B_2|^2) \sum_{j=\bar{j}-2}^{\bar{j}+2} w_{j,\bar{j}} \varepsilon_j \left(\frac{P_j}{P'_j}\right)\left(\frac{\xi_j^2}{\xi_j'^2}\right) +$$

$$(|C_1|^2 + |C_2|^2) \sum_{j=\bar{j}-2}^{\bar{j}+2} w_{j,\bar{j}} \varepsilon_j \left(\frac{P_j}{P'_j}\right)\left(\frac{\eta_j^2}{\xi_j'^2}\right),$$

$$a_{2,\bar{j}} = (|A_1|^2 + |A_2|^2) \sum_{j=\bar{j}-2}^{\bar{j}+2} w_{j,\bar{j}} \gamma_j \left(\frac{P_j}{P'_j}\right)\left(\frac{\xi_j^2}{\xi_j'^2}\right) + \quad (51)$$

$$(|B_1|^2 + |B_2|^2) \sum_{j=\bar{j}-2}^{\bar{j}+2} w_{j,\bar{j}} \gamma_j \left(\frac{P_j}{P'_j}\right)\left(\frac{\xi_j^2}{\xi_j'^2}\right) +$$

$$(|C_1|^2 + |C_2|^2) \sum_{j=\bar{j}-2}^{\bar{j}+2} w_{j,\bar{j}} \gamma_j \left(\frac{P_j}{P'_j}\right)\left(\frac{\eta_j^2}{\xi_j'^2}\right),$$

$$b_{11,\bar{j}} = 2|A_1||C_1| \sum_{j=\bar{j}-2}^{\bar{j}+2} w_{j,\bar{j}} \varepsilon_j^2 \left(\frac{P_j}{P'_j}\right)\left(\frac{\xi_j \eta_j}{\xi_j'^2}\right) \cos\Delta\varphi_j, \quad (52)$$

$$b_{12,\bar{j}} = -2|A_1||C_1| \sum_{j=\bar{j}-2}^{\bar{j}+2} w_{j,\bar{j}} \varepsilon_j^2 \left(\frac{P_j}{P'_j}\right)\left(\frac{\xi_j \eta_j}{\xi_j'^2}\right) \sin\Delta\varphi_j, \quad (53)$$

$$b_{21,\bar{j}} = 2\left(\frac{|A_2|}{|A_1|}\right)\left(\frac{|C_2|}{|C_1|}\right)|A_1||C_1| \sum_{j=\bar{j}-2}^{\bar{j}+2} w_{j,\bar{j}} \gamma_j^2 \left(\frac{P_j}{P'_j}\right)\left(\frac{\xi_j \eta_j}{\xi_j'^2}\right) \sin\Delta\varphi_j, \quad (54)$$

$$b_{22,\bar{j}} = 2\left(\frac{|A_2|}{|A_1|}\right)\left(\frac{|C_2|}{|C_1|}\right)|A_1||C_1| \sum_{j=\bar{j}-2}^{\bar{j}+2} w_{j,\bar{j}} \gamma_j^2 \left(\frac{P_j}{P'_j}\right)\left(\frac{\xi_j \eta_j}{\xi_j'^2}\right) \cos\Delta\varphi_j, \quad (55)$$

$$c_{11,j} = 2\left(\frac{|A_2|}{|A_1|}\right)\left(\frac{|C_2|}{|C_1|}\right)|A_1||C_1| \sum_{j=\bar{j}-2}^{\bar{j}+2} w_{j,\bar{j}} \varepsilon_j \gamma_j \left(\frac{P_j}{P'_j}\right)\left(\frac{\xi_j \eta_j}{\xi_j'^2}\right) \sin\Delta\varphi_j, \quad (56)$$

$$c_{12,\bar{j}} = 2\left(\frac{|A_2|}{|A_1|}\right)\left(\frac{|C_2|}{|C_1|}\right)|A_1||C_1| \sum_{j=\bar{j}-2}^{\bar{j}+2} w_{j,\bar{j}} \varepsilon_j \gamma_j \left(\frac{P_j}{P'_j}\right)\left(\frac{\xi_j \eta_j}{\xi_j'^2}\right) \cos\Delta\varphi_j, \quad (57)$$

$$c_{21,\bar{j}} = 2|A_1||C_1| \sum_{j=\bar{j}-2}^{\bar{j}+2} w_{j,\bar{j}} \varepsilon_j \gamma_j \left(\frac{P_j}{P'_j}\right)\left(\frac{\xi_j \eta_j}{\xi_j'^2}\right) \cos\Delta\varphi_j, \quad (58)$$

$$c_{22,\bar{j}} = -2|A_1||C_1| \sum_{j=\bar{j}-2}^{\bar{j}+2} w_{j,\bar{j}} \varepsilon_j \gamma_j \left(\frac{P_j}{P'_j}\right)\left(\frac{\xi_j \eta_j}{\xi_j'^2}\right) \sin\Delta\varphi_j. \quad (59)$$

The elements $c_{11,\bar{j}}$, $c_{12,\bar{j}}$, $c_{21,\bar{j}}$, and $c_{22,\bar{j}}$ are zero for non-multiple homodyne detection methods and generally non-zero for multiple homodyne detection methods.

The phase $\phi_{A_1 C_1 \bar{j}}$ of a conjugated quadratures is obtained from the $\sin\phi_{A_1 C_1 \bar{j}}$ and $\cos\phi_{A_1 C_1 \bar{j}}$ solutions of the simultaneous Eqs. (44) and (45) as $$\tan\varphi_{A_1 C_1 \bar{j}} = \frac{a_{11,\bar{j}}(F_{2,\bar{j}} - a_{2,\bar{j}}) - a_{21,\bar{j}}(F_{1,\bar{j}} - a_{1,\bar{j}})}{a_{22,\bar{j}}(F_{1,\bar{j}} - a_{1,\bar{j}}) - a_{12,\bar{j}}(F_{2,\bar{j}} - a_{2,\bar{j}})}. \quad (60)$$

The error $\delta\phi_{A_1 C_1 \bar{j}}$ in $\phi_{A_1 C_1 \bar{j}}$ due to errors $\delta a_{1,\bar{j}}$, $\delta a_{2,\bar{j}}$, $\delta a_{11,\bar{j}}$, $\delta a_{12,\bar{j}}$, $\delta a_{21,\bar{j}}$, and $\delta a_{22,\bar{j}}$ is obtained using the formula $$\delta\phi_{A_1 C_1 \bar{j}} = -\sin\phi_{A_1 C_1 \bar{j}}\delta(\cos\phi_{A_1 C_1 \bar{j}}) + \cos\phi_{A_1 C_1 \bar{j}}\delta(\sin\phi_{A_1 C_1 \bar{j}}) \quad (61)$$

which avoids the handling of singularities. The result is $$\delta\varphi_{A_1 C_1,\bar{j}} = \frac{1}{(a_{11,\bar{j}} a_{22,\bar{j}} - a_{12,\bar{j}} a_{21,\bar{j}})}\begin{bmatrix}(F_{2,\bar{j}} - a_{2,\bar{j}})\delta a_{1,\bar{j}} - \\ (F_{1,\bar{j}} - a_{1,\bar{j}})\delta a_{2,\bar{j}}\end{bmatrix} + \quad (62)$$

$$\frac{1}{2(a_{11,\bar{j}} a_{22,\bar{j}} - a_{12,\bar{j}} a_{21,\bar{j}})^2} \times$$

$$\left\{\begin{matrix}2(F_{1,\bar{j}} - a_{1,\bar{j}})(F_{2,\bar{j}} - a_{2,\bar{j}})\begin{pmatrix}a_{22,\bar{j}}\delta a_{11,\bar{j}} - a_{21,\bar{j}}\delta a_{12,\bar{j}} + \\ a_{12,\bar{j}}\delta a_{21,\bar{j}} - a_{11,\bar{j}}\delta a_{22,\bar{j}}\end{pmatrix} + \\ [(F_{1,\bar{j}} - a_{1,\bar{j}})^2 + (F_{2,\bar{j}} - a_{2,\bar{j}})^2]\begin{pmatrix}-a_{12,\bar{j}}\delta a_{11,\bar{j}} + a_{11,\bar{j}}\delta a_{12,\bar{j}} - \\ a_{22,\bar{j}}\delta a_{21,\bar{j}} + a_{21,\bar{j}}\delta a_{22,\bar{j}}\end{pmatrix} - \\ [(F_{1,\bar{j}} - a_{1,\bar{j}})^2 - (F_{2,\bar{j}} - a_{2,\bar{j}})^2]\begin{pmatrix}-a_{12,\bar{j}}\delta a_{11,\bar{j}} - a_{11,\bar{j}}\delta a_{12,\bar{j}} - \\ a_{22,\bar{j}}\delta a_{21,\bar{j}} - a_{21,\bar{j}}\delta a_{22,\bar{j}}\end{pmatrix}\end{matrix}\right\}.$$

The errors $\delta a_{11,\bar{j}}$, $\delta a_{12,\bar{j}}$, $\delta a_{21,\bar{j}}$, and $\delta a_{22,\bar{j}}$ in Eq. (62) are expressed in more fundamental quantities which are errors $\delta b_{11,\bar{j}}$, $\delta b_{12,\bar{j}}$, $\delta b_{21,\bar{j}}$, $\delta b_{22,\bar{j}}$, $\delta c_{11,\bar{j}}$, $\delta c_{12,\bar{j}}$, $\delta c_{21,\bar{j}}$, and $\delta c_{22,\bar{j}}$ to obtain the formula $$\delta\varphi_{A_1 C_1} = \frac{1}{(a_{11} a_{22} - a_{12} a_{21})}\begin{bmatrix}(F_2 - a_2)\delta a_1 - \\ (F_1 - a_1)\delta a_2\end{bmatrix} + \frac{1}{(a_{11} a_{22} - a_{12} a_{21})^2} \times \quad (63)$$

$$\left\{\begin{matrix}-2(F_1 - a_1)(F_2 - a_2)\begin{bmatrix}(\bar{b}_{11}\delta b_{22} - \bar{b}_{22}\delta b_{11}) + \\ (\bar{b}_{11}\delta c_{22} - \bar{b}_{22}\delta c_{11})\end{bmatrix} + \\ [(F_1 - a_1)^2 + (F_2 - a_2)^2]\begin{bmatrix}(\bar{b}_{11}\delta b_{12} - \bar{b}_{22}\delta b_{21}) + \\ (\bar{b}_{11}\delta c_{12} - \bar{b}_{22}\delta c_{21})\end{bmatrix} + \\ [(F_1 - a_1)^2 - (F_2 - a_2)^2]\begin{bmatrix}(\bar{b}_{11}\delta b_{12} + \bar{b}_{22}\delta b_{21}) + \\ (\bar{b}_{11}\delta c_{12} - \bar{b}_{22}\delta c_{21})\end{bmatrix}\end{matrix}\right\} + \ldots,$$

where first order terms are shown and $$\bar{b}_{11,\bar{j}} = 2|A_1||C_1| \sum_{j=\bar{j}-2}^{\bar{j}+2} w_{j,\bar{j}} \varepsilon_j^2 \left(\frac{P_j}{P'_j}\right)\left(\frac{\xi_j \eta_j}{\xi_j'^2}\right), \quad (64)$$

$$\bar{b}_{22,\bar{j}} = 2\left(\frac{|A_2|}{|A_1|}\right)\left(\frac{|C_2|}{|C_1|}\right)|A_1||C_1| \sum_{j=\bar{j}-2}^{\bar{j}+2} w_{j,\bar{j}} \gamma_j^2 \left(\frac{P_j}{P'_j}\right)\left(\frac{\xi_j \eta_j}{\xi_j'^2}\right). \quad (65)$$

The interpretation of Eq. (63) in terms of cyclic errors is helped with the expression of factors $(F_{1,\bar{j}}-a_{1,\bar{j}})(F_{2,\bar{j}}-a_{2,\bar{j}})$, $[(F_{1,\bar{j}}-a_{1,\bar{j}})^2+(F_{2,\bar{j}}-a_{2,\bar{j}})^2]$, and $[(F_{1,\bar{j}}-a_{1,\bar{j}})^2-(F_{2,\bar{j}}-a_{2,\bar{j}})^2]$ in terms of trigonometric functions with arguments proportional to $\phi_{A_1C_1,\bar{j}}$:

$$2(F_{1,\bar{j}}-a_{1,\bar{j}})(F_{2,\bar{j}}-a_{2,\bar{j}}) = \quad (66)$$
$$(a_{11,\bar{j}}a_{22,\bar{j}}+a_{12,\bar{j}}a_{21,\bar{j}})\sin(2\varphi_{A_1C_1,\bar{j}})+2a_{11,\bar{j}}a_{21,\bar{j}}(\cos\varphi_{A_1C_1,\bar{j}})^2 +$$
$$2a_{22,\bar{j}}a_{12,\bar{j}}(\sin\varphi_{A_1C_1,\bar{j}})^2 + \ldots = \bar{b}_{11,\bar{j}}\bar{b}_{22,\bar{j}}\sin(2\varphi_{A_1C_1,\bar{j}}) + \ldots ,$$

$$[(F_{1,\bar{j}}-a_{1,\bar{j}})^2+(F_{2,\bar{j}}-a_{2,\bar{j}})^2] = \quad (67)$$
$$(a_{11,\bar{j}}^2+a_{21,\bar{j}}^2)(\cos\varphi_{A_1C_1,\bar{j}})^2+(a_{22,\bar{j}}^2+a_{12,\bar{j}}^2)(\sin\varphi_{A_1C_1,\bar{j}})^2 +$$
$$(a_{11,\bar{j}}a_{12,\bar{j}}+a_{22,\bar{j}}a_{21,\bar{j}})\sin 2\varphi_{A_1C_1,\bar{j}} + \ldots =$$
$$\bar{b}_{11,\bar{j}}^2(\cos\varphi_{A_1C_1,\bar{j}})^2+\bar{b}_{22,\bar{j}}^2(\sin\varphi_{A_1C_1,\bar{j}})^2 + \ldots , =$$
$$\frac{1}{2}(\bar{b}_{11,\bar{j}}^2+b_{22,\bar{j}}^2)+\frac{1}{2}(\bar{b}_{11,\bar{j}}^2-\bar{b}_{22,\bar{j}}^2)\cos 2\varphi_{A_1C_1,\bar{j}} + \ldots ,$$

$$[(F_{1,\bar{j}}-a_{1,\bar{j}})^2-(F_{2,\bar{j}}-a_{2,\bar{j}})^2] = \quad (68)$$
$$(a_{11,\bar{j}}^2-a_{21,\bar{j}}^2)(\cos\varphi_{A_1C_1,\bar{j}})^2-(a_{22,\bar{j}}^2-a_{12,\bar{j}}^2)(\sin\varphi_{A_1C_1,\bar{j}})^2 +$$
$$(a_{11,\bar{j}}a_{12,\bar{j}}-a_{22,\bar{j}}a_{21,\bar{j}})\sin 2\varphi_{A_1C_1,\bar{j}} + \ldots =$$
$$\frac{1}{2}(\bar{b}_{11,\bar{j}}^2+\bar{b}_{22,\bar{j}}^2)\cos 2\varphi_{A_1C_1,\bar{j}}+\frac{1}{2}(\bar{b}_{11,\bar{j}}^2-\bar{b}_{22,\bar{j}}^2) + \ldots .$$

Interpretation of Effects of Vibrations and Environmental Changes as Cyclic Errors It is evident from Eq. (66) that the leading term with the factor $2(F_{1,\bar{j}}-a_{1,\bar{j}})(F_{2,\bar{j}}-a_{2,\bar{j}})$ is $\bar{b}_{11,\bar{j}}\bar{b}_{22,\bar{j}}\sin 2\phi_{A_1C_1,\bar{j}}$, from Eq. (67) that the leading term with the factor $[(F_{1,\bar{j}}-a_{1,\bar{j}})^2+(F_{2,\bar{j}}-a_{2,\bar{j}})^2]$ is $(\bar{b}_{11,\bar{j}}^2+\bar{b}_{22,\bar{j}}^2)/2$, and from Eq. (68) that the leading term with the factor $[(F_{1,\bar{j}}-a_{1,\bar{j}})^2-(F_{2,\bar{j}}-a_{2,\bar{j}})^2]$ is $[(\bar{b}_{11,\bar{j}}^2+\bar{b}_{22,\bar{j}}^2)/2]\cos 2\phi_{A_1C_1,\bar{j}}$. According with reference to Eq. (63), the effects of vibrations and environmental changes are present in the form of cyclic errors at zero spatial frequency and as conjugated quadratures at the second harmonic of phase $\phi_{A_1C_1,\bar{j}}$. Note that cyclic errors also appear as conjugated quadratures at the first harmonic of phase $\phi_{A_1C_1,\bar{j}}$ generated by errors $a_{1,\bar{j}}$ and $a_{2,\bar{j}}$ which are determined by errors in selection of values of $\xi'_j$ and $P'_j$ [see Eqs. (50) and (51)].

The transformation of the effects of vibrations and environmental changes and the effects of errors in the selection of values of $\xi'_j$ and $P'_j$ into cyclic errors that are represented as harmonics of phase $\phi_{A_1C_1,\bar{j}}$ represents a significant advantage of the use of the detection methods described above with respect to understanding, reducing, and compensating the effects of vibrations and environmental changes.

The Cyclic Errors reduced by Operating in the Reference Frame

The cyclic error that appears as a zeroth harmonic of $\phi_{A_1C_1,\bar{j}}$ represents a fixed offset in $\phi_{A_1C_1,\bar{j}}$ and as such does not present a problem in wavefront interferometry. The fixed offset in $\phi_{A_1C_1,\bar{j}}$ corresponds to a piston type of optical aberration. The amplitudes of the cyclic errors that appear as components of conjugated quadratures at the second harmonic of $\phi_{A_1C_1,\bar{j}}$ are determined by properties of the vibrations and environmental changes present during the acquisition of the corresponding electrical signal values. These amplitudes of the cyclic errors are reduced in the first embodiment of the present invention by operating in the reference frame where the optical path length of the cavity formed by the reference and measurement objects is maintained at or near a constant value mod $2\pi$ through the control of the reference frequency $f_R$.

The electrical interference signal 172 is processed for changes of one of the components of the corresponding conjugated quadratures and the measured changes of one of the components is used by electronic processor and controller 80 as an error signal to control the reference frequency of source 18.

The maintenance of optical path length of the cavity at or near a constant value mod $2\pi$ may alternatively be achieved by a combination of controlling with the error signal the reference frequency of source 18 and the relative physical length of the cavity by transducers 150 and 152 (see FIG. 1b). Transducers 150 and 152 which generally have a slower frequency response than that of source 18 may be beneficially used to extend the range over which the reference frequency may be controlled.

The contributions of changes in relative orientation due to vibrations, environmental changes, and non-zero atmospheric turbulence effects of the reference and measurement objects that are detected by processing electrical interference signal 172 by electronic processor and controller 80 are used by electronic processor and controller 80 to generate corresponding error signals. The corresponding error signals may be used by electronic processor and controller 80 to control the relative orientation of reference and measurement objects 62 and 60 by transducers 150 and 152.

The contributions of changes in relative deformation due to vibrations, environmental changes, and non-zero atmospheric turbulence effects of the reference and measurement objects that are detected by processing electrical interference signal 172 by electronic processor and controller 80 are used by electronic processor and controller 80 to generate other corresponding error signals. The other corresponding error signals may be used by electronic processor and controller 80 to control the relative deformation of reference and measurement objects 62 and 60 by transducers 150 and 152 augmented to introduce torques to reference object 62. Additional transducers other than augmented transducers 150 and 152 may be used beneficially in end use applications.

A primary advantage of operating in the reference frame is that the linearity and calibration of source 18 and of transducers 150 and 152 is an issue since the reference frame is maintained by an active servo control system. The linearity and calibration of transducers generally are an issue in prior art wavefront interferometry.

Another advantage is that the error signals that are detected by processing electrical interference signal 172 by electronic processor and controller 80 can be monitored whether or not used as error signals in the control of the properties of the cavity and used to limit the amplitude of cyclic errors. The amplitudes of the cyclic errors are computed on-line as a function of time by electronic processor and controller 80 using Eqs. (52), (53), (54), (55), (56), and (57). When one or more computed amplitudes of cyclic errors reach respective preset values, shutter 168 is closed. Thus the length of the window corresponding the integration period used by detector 70 is controlled by shutter 168 to limit the amplitudes of cyclic errors so as to not exceed the preset values.

Compensation for the Cyclic Errors Based on Measured Changes in Properties of Cavity The compensation of effects of the cyclic errors generated by effects of vibrations, environmental changes, non-zero atmospheric turbulence effects, and the effects of errors in the selection of values of $\xi'_j$ may be addressed in several different ways: the effects reduced by operating in the reference frame without any subsequent compensation; the effects reduced by operating in the reference frame and the residual effects of the cyclic errors generated by effects of vibrations and environmental changes, the residual effects of vibrations, environmental changes, and non-zero atmospheric turbulence effects measured as changes in properties of the cavity, the amplitudes of the corresponding cyclic errors computed from the measured residual effects, and the computed amplitudes of cyclic errors used to compensate for the effects of cyclic errors; and the amplitudes of the cyclic errors due to the effects measured and the measured amplitudes of the cyclic errors used to compensate for the effects of cyclic errors.

The contributions of the residual effects of vibrations, environmental changes, and non-zero atmospheric turbulence effects that are present when operating in the reference frame are detected and measured by processing electrical interference signal 172 by electronic processor and controller 80. The measured residual effects are used by electronic processor and controller 80 to compute the amplitudes of respective cyclic errors using Eqs. (52), (53), (54), (55), (56), and (57). The computed amplitudes of respective cyclic errors are subsequently used to compensate for the effects of cyclic errors.

Compensation for the Cyclic Errors Based on Measured Amplitudes of Cyclic Errors The amplitudes of the cyclic errors are measured by the introduction of a tilt in the relative wavefronts of the reference and measurement beams. The cyclic L errors are measured as first and second harmonics of the contribution to phase $\phi_{A_1 C_1 \bar{J}}$ by the tilt. The measured amplitudes of the cyclic errors are subsequently used to compensate for the effects of the cyclic errors.

The measurement of the amplitudes of the cyclic errors may be repeated for several different tilts in order to compensate for the effects of a relative periodic surface structure of the reference and measurement objects that accidentally coincided with the spatial frequency introduced by a particular tilt value and orientation.

From Eq. (63), we have for the error in phase the equation $$\delta\varphi_{A_1 C_1, \bar{J}} = \frac{1}{(a_{11,\bar{J}} a_{22,\bar{J}} - a_{12,\bar{J}} a_{21,\bar{J}})} \begin{bmatrix} \bar{b}_{22,\bar{J}} \delta a_{1,\bar{J}} \sin\varphi_{A_1 C_1, \bar{J}} - \\ \bar{b}_{11,\bar{J}} \delta a_{2,\bar{J}} \cos\varphi_{A_1 C_1, \bar{J}} \end{bmatrix} + \tag{69}$$

$$\frac{1}{4(a_{11,\bar{J}} a_{22,\bar{J}} - a_{12,\bar{J}} a_{21,\bar{J}})^2} \times$$

$$\left\{ \begin{array}{l} 2(\bar{b}_{22,\bar{J}} \delta b_{11,\bar{J}} - \bar{b}_{11,\bar{J}} \delta b_{22,\bar{J}}) \bar{b}_{11,\bar{J}} \bar{b}_{22,\bar{J}} \sin 2\varphi_{A_1 C_1, \bar{J}} - \\ (\bar{b}_{22,\bar{J}} \delta b_{21,\bar{J}} - \bar{b}_{11,\bar{J}} \delta b_{12,\bar{J}}) \begin{bmatrix} (\bar{b}_{11,\bar{J}}^2 + \bar{b}_{22,\bar{J}}^2) + \\ (\bar{b}_{11,\bar{J}}^2 - \bar{b}_{22,\bar{J}}^2) \cos 2\varphi_{A_1 C_1, \bar{J}} \end{bmatrix} + \\ (\bar{b}_{22,\bar{J}} \delta b_{21,\bar{J}} + \bar{b}_{11,\bar{J}} \delta b_{12,\bar{J}}) \begin{bmatrix} (\bar{b}_{11,\bar{J}}^2 + \bar{b}_{22,\bar{J}}^2) \cos 2\varphi_{A_1 C_1, \bar{J}} + \\ (\bar{b}_{11,\bar{J}}^2 - \bar{b}_{22,\bar{J}}^2) \end{bmatrix} \end{array} \right\} +$$

$$\frac{1}{4(a_{11,\bar{J}} a_{22,\bar{J}} - a_{12,\bar{J}} a_{21,\bar{J}})^2} \times$$

$$\left\{ \begin{array}{l} 2(\bar{b}_{22,\bar{J}} \delta c_{11,\bar{J}} - \bar{b}_{11,\bar{J}} \delta c_{22,\bar{J}}) \bar{b}_{11,\bar{J}} \bar{b}_{22,\bar{J}} \sin 2\varphi_{A_1 C_1, \bar{J}} - \\ (\bar{b}_{22,\bar{J}} \delta c_{21,\bar{J}} - \bar{b}_{11,\bar{J}} \delta c_{12,\bar{J}}) \begin{bmatrix} (\bar{b}_{11,\bar{J}}^2 + \bar{b}_{22,\bar{J}}^2) + \\ (\bar{b}_{11,\bar{J}}^2 - \bar{b}_{22,\bar{J}}^2) \cos 2\varphi_{A_1 C_1, \bar{J}} \end{bmatrix} + \\ (\bar{b}_{22,\bar{J}} \delta c_{21,\bar{J}} + \bar{b}_{11,\bar{J}} \delta c_{12,\bar{J}}) \begin{bmatrix} (\bar{b}_{11,\bar{J}}^2 + \bar{b}_{22,\bar{J}}^2) \cos 2\varphi_{A_1 C_1, \bar{J}} + \\ (\bar{b}_{11,\bar{J}}^2 - \bar{b}_{22,\bar{J}}^2) \end{bmatrix} \end{array} \right\} + \dots$$

Eq. (69) reduces to the following equation where terms representing first order effects are shown.

$$\delta\varphi_{A_1 C_1, \bar{J}} = \tag{70}$$

$$\frac{1}{\bar{b}_{11,\bar{J}} \bar{b}_{22,\bar{J}}} (\bar{b}_{22,\bar{J}} \delta a_{1,\bar{J}} \sin\varphi_{A_1 C_1, \bar{J}} - \bar{b}_{11,\bar{J}} \delta a_{2,\bar{J}} \cos\varphi_{A_1 C_1, \bar{J}}) +$$

$$\frac{1}{4(\bar{b}_{11,\bar{J}} \bar{b}_{22,\bar{J}})^2} \times$$

$$\begin{bmatrix} 2(\bar{b}_{22,\bar{J}} \delta b_{11,\bar{J}} - \bar{b}_{11,\bar{J}} \delta b_{22,\bar{J}}) \bar{b}_{11,\bar{J}} \bar{b}_{22,\bar{J}} \sin 2\varphi_{A_1 C_1, \bar{J}} - \\ (\bar{b}_{22,\bar{J}} \delta c_{21,\bar{J}} - \bar{b}_{11,\bar{J}} \delta c_{12,\bar{J}}) (\bar{b}_{11,\bar{J}}^2 + \bar{b}_{22,\bar{J}}^2) + \\ (\bar{b}_{22,\bar{J}} \delta c_{21,\bar{J}} + \bar{b}_{11,\bar{J}} \delta c_{12,\bar{J}}) (\bar{b}_{11,\bar{J}}^2 + \bar{b}_{22,\bar{J}}^2) \cos 2\varphi_{A_1 C_1, \bar{J}} \end{bmatrix} +$$

$$\frac{1}{4(\bar{b}_{11,\bar{J}} \bar{b}_{22,\bar{J}})^2} \times$$

$$\begin{bmatrix} 2(\bar{b}_{22,\bar{J}} \delta c_{11,\bar{J}} - \bar{b}_{11,\bar{J}} \delta c_{22,\bar{J}}) \bar{b}_{11,\bar{J}} \bar{b}_{22,\bar{J}} \sin 2\varphi_{A_1 C_1, \bar{J}} - \\ (\bar{b}_{22,\bar{J}} \delta c_{21,\bar{J}} - \bar{b}_{11,\bar{J}} \delta c_{12,\bar{J}}) (\bar{b}_{11,\bar{J}}^2 + \bar{b}_{22,\bar{J}}^2) + \\ (\bar{b}_{22,\bar{J}} \delta c_{21,\bar{J}} + \bar{b}_{11,\bar{J}} \delta c_{12,\bar{J}}) (\bar{b}_{11,\bar{J}}^2 + \bar{b}_{22,\bar{J}}^2) \cos 2\varphi_{A_1 C_1, \bar{J}} \end{bmatrix} + \dots$$

Single-Homodyne Detection Methods

For the single-homodyne detection methods where an electrical interference signal value contains information about a single component of a conjugated quadratures, the product $\epsilon_j \gamma_j = 0$ (see Tables 5 and 6). As a consequence, $$c_{ij,\bar{J}} = 0 \tag{71}$$

[see Eqs. (56), (57), (58), and (59)] and Eq. (70) reduces to the expression $$\delta\varphi_{A_1 C_1, \bar{J}} = \tag{72}$$

$$\frac{1}{\bar{b}_{11,\bar{J}} \bar{b}_{22,\bar{J}}} (\bar{b}_{22,\bar{J}} \delta a_{1,\bar{J}} \sin\varphi_{A_1 C_1, \bar{J}} - \bar{b}_{11,\bar{J}} \delta a_{2,\bar{J}} \cos\varphi_{A_1 C_1, \bar{J}}) +$$

$$\frac{1}{4(\bar{b}_{11,\bar{J}} \bar{b}_{22,\bar{J}})^2} \times$$

$$\begin{bmatrix} 2(\bar{b}_{22,\bar{J}} \delta b_{11,\bar{J}} - \bar{b}_{11,\bar{J}} \delta b_{22,\bar{J}}) \bar{b}_{11,\bar{J}} \bar{b}_{22,\bar{J}} \sin 2\varphi_{A_1 C_1, \bar{J}} - \\ (\bar{b}_{22,\bar{J}} \delta b_{21,\bar{J}} - \bar{b}_{11,\bar{J}} \delta b_{12,\bar{J}}) (\bar{b}_{11,\bar{J}}^2 + \bar{b}_{22,\bar{J}}^2) + \\ (\bar{b}_{22,\bar{J}} \delta b_{21,\bar{J}} + \bar{b}_{11,\bar{J}} \delta b_{12,\bar{J}}) (\bar{b}_{11,\bar{J}}^2 + \bar{b}_{22,\bar{J}}^2) \cos 2\varphi_{A_1 C_1, \bar{J}} \end{bmatrix} + \dots$$

Note that the cyclic error at zero spatial frequency corresponds to a constant offset in $\phi_{A_1 C_1, \bar{J}}$ or a piston type of optical aberration that is unimportant in determining properties of the differences in reference and measurement beam wavefronts. However, that offset can be used in certain cases as an error signal for reducing the effects of vibrations, environmental changes, and non-zero atmospheric turbulence effects as will be described.

The phase shifting algorithm corresponding to $\epsilon_j$ and $\gamma_j$ values listed in Table 8 as a Schedule 1 corresponds to the algorithm based on the standard set of four phase shift values of 0, $\pi/2$, $\pi$, and $3\pi/2$. The corresponding single-homodyne detection method exhibits according to Eq. (72) a first order sensitivity to effects of vibrations and environmental changes with a peak in sensitivity at a zero frequency value for components of the Fourier spectrum of effects of vibrations, environmental changes, and non-zero atmospheric turbulence effects. For a constant rate of change of the optical path length, $\delta b_{21,j} = \delta b_{12,j}$ and $\delta b_{12,j}$ is proportional to the constant rate of change [see Eqs. (53) and (54)].

A set of values of $\epsilon_j$ and $\gamma_j$ corresponding to a second set of phase shifts $0, \pi/2, -\pi/2,$ and $\pm\pi$ is listed in Table 6 as Schedule 2 for a single-homodyne detection method. The algorithm based on the first set of phase shift values listed in Table 6 exhibits according to Eq. (72) only a second order sensitivity to effects of vibrations and environmental changes with a peak in sensitivity at a non-zero frequency value for components of the Fourier spectrum of effects of vibrations, environmental changes, and non-zero atmospheric turbulence effects. For a constant rate of change of the optical path length, $\delta b_{21,j} = \delta b_{12,j} = 0$ [see Eqs. (53) and (54)]. As a consequence, the effects of vibrations, environmental changes, and non-zero atmospheric turbulence effects contribute to the factor $\overline{b}_{22,j}\delta b_{21,j} + \overline{b}_{11,j}\delta b_{12,j}$ in Eq. (72) through second and higher order effects. Because of the properties of $\delta b_{11,j}$ and $\delta b_{22,j}$ as exhibited in Eqs. (55) and (56), the effects of vibrations, environmental changes, and non-zero atmospheric turbulence effects contribute to the factor $(\overline{b}_{22,j}\delta b_{11,j} - \overline{b}_{11,j}\delta b_{22,j})$ and higher order effects.

Thus an advantage of the single-homodyne detection method based on the values of $\epsilon_j$ and $\gamma_j$ corresponding to the second set of phase shifts $0, \pi/2, -\pi/2,$ and $\pi$ listed in Table 6 is an intrinsic reduced sensitivity to effects of vibrations, environmental changes, and non-zero atmospheric turbulence effects.

Bi-Homodyne Detection Methods

Table 7 lists as Schedule 3 a set of values for $\epsilon_j$ and $\gamma_j$ for a bi-homodyne detection method that corresponds to the standard set of phase shifts $0, \pi/2, \pi,$ and $3\pi/2$ which is the same as Table 1 in referenced U.S. Provisional Patent Application No. 60/442,858 and U.S. patent application Ser. No. 10/765,368. The bi-homodyne detection method using the set of values of $\epsilon_j$ and $\gamma_j$ listed in Table 7 exhibits according to Eq. (70) a first order sensitivity to effects of vibrations, environmental changes, and non-zero atmospheric turbulence effects with a peak in sensitivity at a zero frequency value for components of the Fourier spectrum of effects of vibrations, environmental changes, and non-zero atmospheric turbulence effects.

For a constant rate of change of the optical path length, $\delta b_{21,j} = \delta b_{12,j} = 0$ [see Eqs. (53) and (54)]. As a consequence, the effects of vibrations and environmental changes contribute to the factor $\overline{b}_{22,j}\delta b_{21,j} + \overline{b}_{11,j}\delta b_{12,j}$ in Eq. (70) only through second and higher order effects. Because of the properties of $\delta b_{11,j}$ and $\delta b_{22,j}$ as exhibited in Eqs. (55) and (56), the effects of vibrations, environmental changes, and non-zero atmospheric turbulence effects contribute to the factor $(\overline{b}_{22,j}\delta b_{11,j} - \overline{b}_{11,j}\delta b_{22,j})$ in Eq. (72) through second and higher order effects.

Also for a constant rate of change of the optical path length, $\delta c_{21,j} = \delta c_{12,j} = 0$ [see Eqs. (57) and (58)]. As a consequence, the effects of vibrations, environmental changes, and non-zero atmospheric turbulence effects contribute to the factor $\overline{b}_{22,j}\delta c_{21,j} + \overline{b}_{11,j}\delta c_{12,j}$ in Eq. (70) only through second and higher order effects.

However, $\delta c_{21,j} = \delta c_{12,j}$ and $\delta c_{12,j}$ is proportional the constant rate of change of the optical path length [see Eqs. (56) and (59)]. As a consequence, the factor $(\overline{b}_{22,j}\delta c_{11,j} - \overline{b}_{11,j}\delta c_{22,j})$ in Eq. (70) has a first order sensitvity to a constant rate of change of the optical path length.

There are disclosed herein sets of values of $\epsilon_j$ and $\gamma_j$, an example of which is listed in Table 8 as schedule 4, for a bi-homodyne detection method that exhibits according to Eq. (70) for a sequence of q phase shift values where q=4,8, . . . a second order sensitivity to effects of vibrations, environmental changes, and non-zero average atmospheric turbulence effects with a peak in sensitivity at a non-zero frequency value for components of the Fourier spectrum of effects of vibrations and environmental changes. The properties of the bi-homodyne detection methods with respect to whether there is a second order sensitivity to effects of vibrations, environmental changes, and non-zero atmospheric turbulence effects is determined by the symmetry properties of $\epsilon_j\gamma_j$ about the value of j, i.e., j=(q+1)/2.

For a constant rate of change of the optical path length, $\delta b_{21} = \delta b_{12} = 0$ [see Eqs. (53) and (54)]. As a consequence, the effects of vibrations, environmental changes, and non-zero atmospheric turbulence effects contribute to the factor $\overline{b}_{22}\delta b_{21} + \overline{b}_{11}\delta b_{12}$ in Eq. (70) only through second and higher order effects. Because of the properties of $\delta b_{11}$ and $\delta b_{22}$ as exhibited in Eqs. (55) and (56), the effects of vibrations, environmental changes, and non-zero atmospheric turbulence effects contribute to the factor $(\overline{b}_{22}\delta b_{11} - \overline{b}_{11}\delta b_{22})$ in Eq. (72) through second and higher order effects.

In addition for a constant rate of change of the optical path length, $\delta c_{21} = \delta c_{12} = 0$ [see Eqs. (57) and (58)]. As a consequence, the effects of vibrations, environmental changes, and non-zero atmospheric turbulence effects contribute to the factor $\overline{b}_{22}\delta c_{21} + \overline{b}_{11}\delta c_{12}$ in Eq. (70) only through second and higher order effects.

However, $\delta c_{11} = \delta c_{22} = 0$ for the constant rate of change of the optical path length [see Eqs. (56) and (59)]. As a consequence, the effects of vibrations, environmental changes, and non-zero atmospheric turbulence effects contribute to the factor $(\overline{b}_{22}\delta c_{11} - \overline{b}_{11}\delta c_{22})$ in Eq. (70) only through second and higher order effects.

Thus an advantage of the bi-homodyne detection method based on the values of $\epsilon_j$ and $\gamma_j$ listed in Table 8 for a sequence of q phase shift values where q=4,8, . . . is an intrinsic reduced sensitivity to effects of vibrations and environmental changes.

There are disclosed herein sets of values of $\epsilon_j$ and $\gamma_j$, an example of which is listed in Table 8 as schedule 4, for a bi-homodyne detection method that exhibits according to Eq. (70) for a sequence of q=5 phase shift values, digital filters given by Eqs. (32) and (33), and weighting function $w_{j,\overline{j}}$ given by Eq. (34) a second order sensitivity to effects of vibrations, environmental changes, and non-zero average atmospheric turbulence effects with a peak in sensitivity at a non-zero frequency value for components of the Fourier spectrum of effects of vibrations and environmental changes. The properties of the bi-homodyne detection methods with respect to whether there is a second order sensitivity to effects of vibrations, environmental changes, and non-zero average atmospheric turbulence effects is determined by the symmetry properties of $\epsilon_j\gamma_j$ and $w_{j,\overline{j}}$ about the value of $\overline{j}$.

For a constant rate of change of the optical path length, $\delta b_{21} = \delta b_{12} = 0$ [see Eqs. (53) and (54)]. As a consequence, the effects of vibrations, environmental changes, and non-zero average atmospheric turbulence effects contribute to the factor $\overline{b}_{22}\delta b_{21} + \overline{b}_{11}\delta b_{12}$ in Eq. (70) only through second and higher order effects. Because of the properties of $\delta b_{11}$ and $\delta b_{22}$ as exhibited in Eqs. (55) and (56), the effects of vibrations, environmental changes, and non-zero average atmospheric turbulence effects contribute to the factor $(\overline{b}_{22}\delta b_{11} - \overline{b}_{11}\delta b_{22})$ in Eq. (72) through second and higher order effects.

In addition for a constant rate of change of the optical path length, $\delta c_{21} = \delta c_{12} = 0$ [see Eqs. (57) and (58)]. As a consequence, the effects of vibrations, environmental changes, and non-zero average atmospheric turbulence effects contribute to the factor $\bar{b}_{22}\delta c_{21}+\bar{b}_{11}\delta c_{12}$ in Eq. (70) only through second and higher order effects.

However, $\delta C_{11}=\delta c_{22}=0$ for the constant rate of change of the optical path length [see Eqs. (56) and (59)]. As a consequence, the effects of vibrations, environmental changes, and non-zero average atmospheric turbulence effects contribute to the factor $(\bar{b}_{22}\delta c_{11}-\bar{b}_{11}\delta c_{22})$ in Eq. (70) only through second and higher order effects.

Thus an advantage of the bi-homodyne detection method based on the values of $\epsilon_j$ and $\gamma_j$ listed in Table 8 for a sequence of q=5 phase shift values, digital filters given by Eqs. (32) and (33), and weighting function $w_{j,\bar{j}}$ given by Eq. (34) is an intrinsic reduced sensitivity to effects of vibrations, environmental changes, and non-zero average atmospheric turbulence effects.

In summary, the single homodyne set of $\epsilon_j$ and $\gamma_j$ given in Table 5 and the bi-homodyne set of $\epsilon_j$ and $\gamma_j$ given in Table 7 lead to first order sensitivities of respective measured conjugated quadratures to vibrations and environmental changes with a peak in sensitivity at a zero frequency value for components of the Fourier spectrum of effects of vibrations and environmental changes. In contrast, the single-homodyne set of $\epsilon_j$ and $\gamma_j$ given in Table 6, the bi-homodyne set of $\epsilon_j$ and $\gamma_j$ given in Table 8 lead for values of q=4 and 8, and the bi-homodyne set of $\epsilon_j$ and $\gamma_j$ given in Table 8 lead for values of q=5, digital filters given by Eqs. (32) and (33), and weighting function $w_{j,\bar{j}}$ given by Eq. (34) to second and higher order sensitivities of respective measured conjugated quadratures to effects of vibrations and environmental changes with a peak in sensitivity at a non-zero frequency value for components of the Fourier spectrum of effects of vibrations and environmental changes approximately zero frequencies.

Two-Dimensional Array of Rate of Stochastic Phase Changes

Information about two-dimensional arrays of rate of stochastic phase changes are obtained for the case of q=5 in a multiple-homodyne detection method (different from the five phase shift method introduced by J. Schwider, R. Burow, K.-E. Elssner, J. Grzanna, R. Spolaczyk, and K. Merkel, ibid.) using a weighing function $w'j_{j,\bar{j}}$ applied to the signal values $S_j$, the schedule for $\epsilon_j$ and $\gamma_j$ given in Table 8, the symmetry properties and orthogonality property of the conjugated quadratures terms in Eq. (31), and the following digital filters:

$$F'_{1,\bar{j}}(S) = \sum_{j=\bar{j}-2}^{\bar{j}+2} w'_{j,\bar{j}}\epsilon_j \frac{S_j}{P'_j \xi'^2_j} = (|A_1|^2+|A_2|^2)\sum_{j=\bar{j}-2}^{\bar{j}+2} w'_{j,\bar{j}}\epsilon_j\left(\frac{P_j}{P'_j}\right)\left(\frac{\xi^2_j}{\xi'^2_j}\right)+ \tag{73}$$

$$(|B_1|^2+|B_2|^2)\sum_{j=\bar{j}-2}^{\bar{j}+2} w^2_{j,\bar{j}}\epsilon_j\left(\frac{P_j}{P'_j}\right)\left(\frac{\xi^2_j}{\xi'^2_j}\right)+$$

$$(|C_1|^2+|C_2|^2)\sum_{j=\bar{j}-2}^{\bar{j}+2} w'_{j,\bar{j}}\epsilon_j\left(\frac{P_j}{P'_j}\right)\left(\frac{\eta^2_j}{\xi'^2_j}\right)+$$

$$2|A_1||C_1|\sum_{j=\bar{j}-2}^{\bar{j}+2} w'_{j,\bar{j}}\epsilon^2_j\left(\frac{P_j}{P'_j}\right)\left(\frac{\xi_j\eta_j}{\xi'^2_j}\right)\cos\varphi_{A_1C_1,j}+$$

$$2\left(\frac{|A_2|}{|A_1|}\right)\left(\frac{|C_2|}{|C_1|}\right)|A_1||C_1|\sum_{j=\bar{j}-2}^{\bar{j}+2} w'_{j,\bar{j}}\epsilon_j\gamma_j\left(\frac{P_j}{P'_j}\right)\left(\frac{\xi_j\eta_j}{\xi'^2_j}\right)\sin\varphi_{A_1C_1,j}+$$

$$2|A_1||B_1|\sum_{j=\bar{j}-2}^{\bar{j}+2} w'_{j,\bar{j}}\epsilon_j\left(\frac{P_j}{P'_j}\right)\left(\frac{\xi_j\zeta_j}{\xi'^2_j}\right)\cos\varphi_{A_1B_1\epsilon_j}+$$

$$2|A_2||B_2|\sum_{j=\bar{j}-2}^{\bar{j}+2} w'_{j,\bar{j}}\epsilon_j\left(\frac{P_j}{P'_j}\right)\left(\frac{\xi_j\zeta_j}{\xi'^2_j}\right)\cos\varphi_{A_2B_2\gamma_j}+$$

$$2|B_1||C_1|\sum_{j=\bar{j}-2}^{\bar{j}+2} w'_{j,\bar{j}}\epsilon_j\left(\frac{P_j}{P'_j}\right)\left(\frac{\zeta_j\eta_j}{\xi'^2_j}\right)\cos\varphi_{B_1C_1\epsilon_j}+$$

$$2|B_2||C_2|\sum_{j=\bar{j}-2}^{\bar{j}+2} w'_{j,\bar{j}}\epsilon_j\gamma_j\left(\frac{P_j}{P'_j}\right)\left(\frac{\zeta_j\eta_j}{\xi'^2_j}\right)\cos\varphi_{B_2C_2\gamma_j},$$

$$F'_{1,\bar{j}}(S) = \tag{74}$$

$$\sum_{j=\bar{j}-2}^{\bar{j}+2} w'_{j,\bar{j}}\gamma_j\frac{S_j}{P'_j\xi'^2_j} = (|A_1|^2+|A_2|^2)\sum_{j=\bar{j}-2}^{\bar{j}+2} w'_{j,\bar{j}}\gamma_j\left(\frac{P_j}{P'_j}\right)\left(\frac{\xi^2_j}{\xi'^2_j}\right)+$$

$$(|B_1|^2+|B_2|^2)\sum_{j=\bar{j}-2}^{\bar{j}+2} w^2_{j,\bar{j}}\gamma_j\left(\frac{P_j}{P'_j}\right)\left(\frac{\xi^2_j}{\xi'^2_j}\right)+$$

$$(|C_1|^2+|C_2|^2)\sum_{j=\bar{j}-2}^{\bar{j}+2} w'_{j,\bar{j}}\gamma_j\left(\frac{P_j}{P'_j}\right)\left(\frac{\eta^2_j}{\xi'^2_j}\right)+$$

$$2|A_1||C_1|\sum_{j=\bar{j}-2}^{\bar{j}+2} w'_{j,\bar{j}}\epsilon_j\gamma_j\left(\frac{P_j}{P'_j}\right)\left(\frac{\xi_j\eta_j}{\xi'^2_j}\right)\sin\varphi_{A_1C_1,j}+$$

$$2\left(\frac{|A_2|}{|A_1|}\right)\left(\frac{|C_2|}{|C_1|}\right)|A_1||C_1|\sum_{j=\bar{j}-2}^{\bar{j}+2} w'_{j,\bar{j}}\gamma^2_j\left(\frac{P_j}{P'_j}\right)\left(\frac{\xi_j\eta_j}{\xi'^2_j}\right)\sin\varphi_{A_1C_1,j}+$$

$$2|A_1||B_1|\sum_{j=\bar{j}-2}^{\bar{j}+2} w'_{j,\bar{j}}\gamma_j\left(\frac{P_j}{P'_j}\right)\left(\frac{\xi_j\zeta_j}{\xi'^2_j}\right)\cos\varphi_{A_1B_1\epsilon_j}+$$

$$2|A_2||B_2|\sum_{j=\bar{j}-2}^{\bar{j}+2} w'_{j,\bar{j}}\gamma_j\left(\frac{P_j}{P'_j}\right)\left(\frac{\xi_j\zeta_j}{\xi'^2_j}\right)\cos\varphi_{A_2B_2\gamma_j}+$$

$$2|B_1||C_1|\sum_{j=\bar{j}-2}^{\bar{j}+2} w'_{j,\bar{j}}\epsilon_j\gamma_j\left(\frac{P_j}{P'_j}\right)\left(\frac{\zeta_j\eta_j}{\xi'^2_j}\right)\cos\varphi_{B_1C_1\epsilon_j}+$$

$$2|B_2||C_2|\sum_{j=\bar{j}-2}^{\bar{j}+2} w'_{j,\bar{j}}\left(\frac{P_j}{P'_j}\right)\left(\frac{\zeta_j\eta_j}{\xi'^2_j}\right)\cos\varphi_{B_2C_2\gamma_j},$$

where $$w'_{j,\bar{j}}=[\text{sign}(j-\bar{j})]w_{j,\bar{j}}, \tag{75}$$

$$\phi_{A_1C_1,j}=\phi_{A_1C_1,\bar{j}}+(j-\bar{j})\delta, \tag{76}$$

$\delta$ is the change in phase $\phi_{A_1C_1,j}$ per increment in index j by 1 due to a constant rate of change in $\phi_{A_1C_1,j}$ evaluated $j=\bar{j}$, sing$(j-\bar{j})=0$ if $(j-\bar{j})=0$, and sign $(j-\bar{j})$ is equal to the sign of $(j-\bar{j})$ if (j−

$\bar{j}) \neq 0$. Note that weight function $w'_{j,\bar{j}}$ is an anti-symmetric function about $j=\bar{j}$ and the full width $\Delta j$ at half maximum of weighing function $w_{j,\bar{j}}$ is $\Delta j=3$ which is the same width for the weight function $w_{j,\bar{j}}$ given by Eq. (34).

From Eqs. (73) and (74), we obtain retaining first order effects in $\delta$ $$F'_{1,\bar{j}}(S) = -2|A_1||C_1|\sin\varphi_{A_1C_1,\bar{j}} \left[ \sum_{j=\bar{j}-2}^{\bar{j}+2} w'_{j,\bar{j}} \varepsilon_j^2 \left(\frac{P_j}{P'_j}\right)\left(\frac{\xi_j \eta_j}{\xi_j'^2}\right) \right] \sin\delta + \dots , \quad (77)$$

$$F'_{2,\bar{j}}(S) = 2\left(\frac{|A_2|}{|A_2|}\right)\left(\frac{|C_2|}{|C_1|}\right)|A_1||C_1| \times$$

$$\cos\varphi_{A_1C_1,\bar{j}} \left[ \sum_{j=\bar{j}-2}^{\bar{j}+2} w'_{j,\bar{j}} \gamma_j^2 \left(\frac{P_j}{P'_j}\right)\left(\frac{\xi_j \eta_j}{\xi_j'^2}\right) \right] \sin\delta + \dots . \quad (78)$$

Note that second order terms of the type $(\partial^2 \psi/\partial t^2)^2 \tau^2$ and $(\partial^3 \psi/\partial t^3)\tau^2$ cancel out in Eqs. (77) and (78).

Eqs. (77) and (78) are solved for the rate of change $\delta$ to generate a measured two-dimensional array of rate of stochastic phase changes using measured values of $\sin\varphi_{A_1C_1,\bar{j}}$ and $\cos\varphi_{A_1C_1,\bar{j}}$ obtained from conjugated quadratures measured in the first embodiment of the present invention with the result $$\delta = \frac{[-\sin\varphi_{A_1C_1,\bar{j}} F'_{1,\bar{j}}(S) + \cos\varphi_{A_1C_1,\bar{j}} F'_{2,\bar{j}}(S)]}{\left[ \sum_{j=\bar{j}-2}^{\bar{j}+2} w'_{j,\bar{j}} \left(\frac{P_j}{P'_j}\right)\left(\frac{\xi_j \eta_j}{\xi_j'^2}\right) \right]} + \dots , \quad (79)$$

The bi-homodyne detection technique is robust with respect to errors introduced for example by pixel-to-pixel sensitivity variations since the factors in Eqs. (77) and (78) represented by the summations are identical, i.e., $$\left[ \sum_{j=\bar{j}-2}^{\bar{j}+2} w'_{j,\bar{j}} \left(\frac{P_j}{P'_j}\right)\left(\frac{\xi_j \eta_j}{\xi_j'^2}\right) \right] = +\left[ \sum_{j=\bar{j}-2}^{\bar{j}+2} w'_{j,\bar{j}} \varepsilon_j^2 \left(\frac{P_j}{P'_j}\right)\left(\frac{\xi_j \eta_j}{\xi_j'^2}\right) \right] \quad (80)$$

$$= +\left[ \sum_{j=\bar{j}-2}^{\bar{j}+2} w'_{j,\bar{j}} \gamma_j^2 \left(\frac{P_j}{P'_j}\right)\left(\frac{\xi_j \eta_j}{\xi_j'^2}\right) \right].$$

The remaining portion of the description for the determination of arrays of rate of stochastic phase changes $-\nabla_\perp \cdot [\langle u_j \rangle_{\perp \psi j}]$ is the same as the corresponding portion of the description given in the first embodiment for the determination of the corresponding arrays of phases.

There are a number of advantages of the bi-homodyne detection method as a consequence of the conjugated quadratures of fields being jointly acquired quantities. One advantage is a reduced sensitivity to the effects of an overlay error of a spot in or on the substrate that is being imaged and a conjugate image of conjugate pixel of a multi-pixel detector during the acquisition of four electrical interference signal values of each spot in and/or on a substrate imaged using interferometric far-field and/or near-field confocal and non-confocal microscopy. Overlay errors are errors in the set of four conjugate images of a respective set of conjugate detector pixels relative to the spot being imaged.

Another advantage is that when operating in the scanning mode there is a reduced sensitivity to effects of pinhole-to-pinhole variations in properties of a conjugate set of pinholes used in a confocal microscopy system that are conjugate to a spot in or on the substrate being imaged at different times during the scan.

Another advantage is that when operating in the scanning mode there is a reduced sensitivity to effects of pixel-to-pixel variation of properties within a set of conjugate pixels that are conjugate to a spot in or on the substrate being imaged at different times during the scan.

Another advantage is that when operating in the scanning mode there is reduced sensitivity to effects of pulse sequence to pulse sequence variations of a respective conjugate set of pulse sequences of the input beam 24 to the interferometer system.

The pinholes and pixels of a multi-pixel detector of a set of conjugate pinholes and conjugate pixels of a multi-pixel detector may comprise contiguous pinholes of an array of pinholes and/or contiguous pixels of a multi-pixel detector or may comprise selected pinholes from an array of pinholes and/or pixels from an array of pixels wherein the separation between the selected pinholes is an integer number of pinhole spacings and the separation between an array of respective pixels corresponds to an integer number of pixel spacings without loss of lateral and/or longitudinal resolution and signal-to-noise ratios. The corresponding scan rate would be equal to the integer times the spacing of spots on the measurement object 60 conjugate to set of conjugate pinholes and/or set of conjugate pixels divided by the read out rate of the multi-pixel detector. This property permits a significant increase in throughput for an interferometric far-field or near-field confocal or non-confocal microscope with respect to the number of spots in and/or on a substrate imaged per unit time.

Referring to the quad-homodyne detection method used in various embodiments of the present invention, a set of electrical interference signal values are obtained for each spot on and/or in substrate 60 being imaged. The properties of the quad-homodyne detection method with respect to effects of vibration and environmental changes are developed herein for the case of q equal to 4 in order to display the features relating to effects of vibration and environmental changes without departing from the scope and spirit of the present invention. The results for q equal to 4 can easily be extended to the cases of q equal to 8, 12, . . . . The corresponding set of electrical interference signal values $S_j$ for q equal to 4 used for obtaining conjugated quadratures of fields for a single a spot on and/or in a substrate being imaged is represented for the quad-homodyne detection within a scale factor by the formulae $$S_1 = P_1 \begin{Bmatrix} \xi_1^2 |A_1|^2 + \zeta_1^2 |B_1|^2 + \eta_1^2 |C_1|^2 + \zeta_1 \eta_1 2|B_1||C_1|\cos\varphi_{B_1C_1\varepsilon_1} + \\ \xi_1\zeta_1 2|A_1||B_1|\cos\varphi_{A_1B_1\varepsilon_1} + \varepsilon_1\xi_1\eta_1 2|A_1||C_1|\cos\varphi_{A_1C_1,1} + \\ \xi_1^2 |A_2|^2 + \zeta_1^2 |B_2|^2 + \eta_1^2 |C_2|^2 + \zeta_1\eta_1 2|B_2||C_2|\cos\varphi_{B_2C_2\gamma_1} + \\ \xi_1\zeta_1 2|A_2||B_2|\cos\varphi_{A_2B_2\gamma_1} + \gamma_1\xi_1\eta_1 2|A_2||C_2|\cos\varphi_{A_2C_2,1} \end{Bmatrix}, \quad (81)$$

-continued $$S_2 = P_1 \begin{Bmatrix} \xi_2^2|A_3|^2 + \zeta_2^2|B_3|^2 + \eta_2^2|C_3|^2 + \zeta_2\eta_2 2|B_3||C_3|\cos\varphi_{B_3C_3\varepsilon_2} + \\ \xi_2\zeta_2 2|A_3||B_3|\cos\varphi_{A_3B_3\varepsilon_2} + \varepsilon_2\xi_2\eta_2 2|A_3||C_3|\cos\varphi_{A_3C_3,2} + \\ \xi_2^2|A_4|^2 + \zeta_2^2|B_4|^2 + \eta_2^2|C_4|^2 + \zeta_2\eta_2 2|B_4||C_4|\cos\varphi_{B_4C_4\gamma_2} + \\ \xi_2\zeta_2 2|A_4||B_4|\cos\varphi_{A_4B_4\gamma_2} + \gamma_2\xi_2\eta_2 2|A_4||C_4|\cos\varphi_{A_4C_4,2} \end{Bmatrix}, \quad (82)$$

$$S_3 = P_2 \begin{Bmatrix} \xi_1^2|A_1|^2 + \zeta_1^2|B_1|^2 + \eta_1^2|C_1|^2 + \zeta_1\eta_1 2|B_1||C_1|\cos\varphi_{B_1C_1\varepsilon_3} + \\ \xi_1\zeta_1 2|A_1||B_1|\cos\varphi_{A_1B_1\varepsilon_3} + \varepsilon_3\xi_1\eta_1 2|A_1||C_1|\cos\varphi_{A_1C_1,3} + \\ \xi_1^2|A_2|^2 + \zeta_1^2|B_2|^2 + \eta_1^2|C_2|^2 + \zeta_1\eta_1 2|B_2||C_2|\cos\varphi_{B_2C_2\gamma_3} + \\ \xi_1\zeta_1 2|A_2||B_2|\cos\varphi_{A_2B_2\gamma_3} + \gamma_3\xi_1\eta_1 2|A_2||C_2|\cos\varphi_{A_2C_2,3} \end{Bmatrix}, \quad (83)$$

$$S_4 = P_2 \begin{Bmatrix} \xi_2^2|A_3|^2 + \zeta_2^2|B_3|^2 + \eta_2^2|C_3|^2 + \zeta_2\eta_2 2|B_3||C_3|\cos\varphi_{B_3C_3\varepsilon_4} + \\ \xi_2\zeta_2 2|A_3||B_3|\cos\varphi_{A_3B_3\varepsilon_4} + \varepsilon_4\xi_2\eta_2 2|A_3||C_3|\cos\varphi_{A_3C_3,4} + \\ \xi_2^2|A_4|^2 + \zeta_2^2|B_4|^2 + \eta_2^2|C_4|^2 + \zeta_2\eta_2 2|B_4||C_4|\cos\varphi_{B_4C_4\gamma_4} + \\ \xi_2\zeta_2 2|A_4||B_4|\cos\varphi_{A_4B_4\gamma_4} + \gamma_4\xi_2\eta_2 2|A_4||C_4|\cos\varphi_{A_4C_4,4} \end{Bmatrix}, \quad (84)$$

where coefficients $A_1$, $A_2$, $A_3$, and $A_4$ represent the amplitudes of the reference beams corresponding to the first, second, third, and fourth frequency components, respectively, of input beam 24; coefficients $B_1$, $B_2$, $B_3$, and $B_4$ represent the amplitudes of background beams corresponding to reference beams $A_1$, $A_2$, $A_3$, and $A_4$, respectively; coefficients $C_1$, $C_2$, $C_3$, and $C_4$ represent the amplitudes of the return measurement beams corresponding to reference beams $A_1$, $A_2$, $A_3$, and $A_4$, respectively; $P_1$ and $P_2$ represent the integrated intensities of the first frequency component in the first and second windows, respectively, of the input beam 24; and the values for $\epsilon_j$ and $\gamma_j$ are listed in Tables 7 and 8. The description of the coefficients $\xi_j$, $\zeta_j$, and $\eta_j$ for the quad-homodyne detection method is the same as the corresponding portion of the description given for $\xi_j$, $\zeta_j$, and $\eta_j$ of the bi-homodyne detection method.

It is assumed in Eqs. (81), (82), (83), and (84) that the ratios of $|A_2|/|A_1|$ and $|A_4|/|A_3|$ are not dependent on j or the value of $P_j$. In order to simplify the representation of $S_j$ so as to project the important features without departing from either the scope or spirit of the present invention, it is also assumed in Eqs. (81), (82), (83), and (84) that the ratios of the amplitudes of the return measurement beams corresponding to $|A_2|/|A_1|$ and $|A_4|/|A_3|$ are not dependent on j or the value of $P_j$. However, the ratios $|C_2|/|C_1|$ and $|C_4|/|C_3|$ will be different from the ratios $|A_2|/|A_1|$ and $|A_4|/|A_3|$, respectively, when the ratio of the amplitudes of the measurement beam components corresponding to $|A_2|/|A_1|$ and $|A_4|/|A_3|$, respectively, are different from the ratios $|A_2|/|A_1|$ and $|A_4|/|A_3|$, respectively.

Noting that $\cos \phi_{A_2C_2,j} = \pm\sin \phi_{A_1C_1,j}$ by the control of the relative phase shifts between corresponding reference and measurement beam components in beam 32, Eqs. (81), (82), (83), and (84) may be written, respectively, as $$S_1 = P_1 \begin{Bmatrix} \xi_1^2(|A_1|^2 + |A_2|^2) + \zeta_1^2(|B_1|^2 + |B_2|^2) + \eta_1^2(|C_1|^2 + |C_2|^2) + \\ 2\zeta_1\eta_1[|B_1||C_1|\cos\varphi_{B_1C_1\varepsilon_1} + |B_2||C_2|\cos\varphi_{B_2C_2\gamma_1}] + \\ 2\xi_1\eta_1\begin{bmatrix} \varepsilon_1|A_1||C_1|\cos\varphi_{A_1C_1,1} + \\ \gamma_1\left(\frac{|A_2|}{|A_1|}\right)\left(\frac{|C_2|}{|C_1|}\right)|A_1||C_1|\sin\varphi_{A_1C_1,1} \end{bmatrix} + \\ 2\xi_1\zeta_1[|A_1||B_1|\cos\varphi_{A_1B_1\varepsilon_1} + |A_2||B_2|\cos\varphi_{A_2B_2\gamma_1}] \end{Bmatrix}, \quad (85)$$

$$S_2 = P_1 \begin{Bmatrix} \xi_2^2(|A_3|^2 + |A_4|^2) + \zeta_2^2(|B_3|^2 + |B_4|^2) + \eta_2^2(|C_3|^2 + |C_4|^2) + \\ 2\zeta_2\eta_2[|B_3||C_3|\cos\varphi_{B_3C_3\varepsilon_2} + |B_4||C_4|\cos\varphi_{B_4C_4\gamma_2}] + \\ 2\xi_2\eta_2\left(\frac{|A_3|}{|A_1|}\right)\left(\frac{|C_3|}{|C_1|}\right)\begin{bmatrix} \varepsilon_2|A_1||C_1|\cos\varphi_{A_1C_1,2} + \gamma_2 \\ \left(\frac{|A_4|}{|A_3|}\right)\left(\frac{|C_4|}{|C_3|}\right) \\ |A_1||C_1|\sin\varphi_{A_1C_1,2} \end{bmatrix} + \\ 2\xi_2\zeta_2[|A_3||B_3|\cos\varphi_{A_3B_3\varepsilon_2} + |A_4||B_4|\cos\varphi_{A_4B_4\gamma_2}] \end{Bmatrix}, \quad (86)$$

$$S_3 = P_2 \begin{Bmatrix} \xi_1^2(|A_1|^2 + |A_2|^2) + \zeta_1^2(|B_1|^2 + |B_2|^2) + \eta_1^2(|C_1|^2 + |C_2|^2) + \\ 2\zeta_1\eta_1[|B_1||C_1|\cos\varphi_{B_1C_1\varepsilon_3} + |B_2||C_2|\cos\varphi_{B_2C_2\gamma_3}] + \\ 2\xi_1\eta_1\begin{bmatrix} \varepsilon_3|A_1||C_1|\cos\varphi_{A_1C_1,3} + \gamma_3 \\ \left(\frac{|A_2|}{|A_1|}\right)\left(\frac{|C_2|}{|C_1|}\right) \\ |A_1||C_1|\sin\varphi_{A_1C_1,3} \end{bmatrix} + \\ 2\xi_1\zeta_1[|A_1||B_1|\cos\varphi_{A_1B_1\varepsilon_3} + |A_2||B_2|\cos\varphi_{A_2B_2\gamma_3}] \end{Bmatrix}, \quad (87)$$

$$S_4 = P_2 \begin{Bmatrix} \xi_2^2(|A_3|^2 + |A_4|^2) + \zeta_2^2(|B_3|^2 + |B_4|^2) + \eta_2^2(|C_3|^2 + |C_4|^2) + \\ 2\zeta_2\eta_2[|B_3||C_3|\cos\varphi_{B_3C_3\varepsilon_4} + |B_4||C_4|\cos\varphi_{B_4C_4\gamma_4}] + \\ 2\xi_2\eta_2\left(\frac{|A_3|}{|A_1|}\right)\left(\frac{|C_3|}{|C_1|}\right)\begin{bmatrix} \varepsilon_4|A_1||C_1|\cos\varphi_{A_1C_1,4} + \gamma_4 \\ \left(\frac{|A_4|}{|A_3|}\right)\left(\frac{|C_4|}{|C_3|}\right) \\ |A_1||C_1|\sin\varphi_{A_1C_1,4} \end{bmatrix} + \\ 2\xi_2\zeta_2[|A_3||B_3|\cos\varphi_{A_3B_3\varepsilon_4} + |A_4||B_4|\cos\varphi_{A_4B_4\gamma_4}] \end{Bmatrix}, \quad (88)$$

where the relationships $\cos \phi_{A_3C_3,j} = \cos \phi_{A_1C_1,j}$, $\cos \phi_{A_4C_4,j} = \cos \phi_{A_2C_2,j}$, and $\cos \phi_{A_2C_2,j} = \sin \phi_{A_1C_1,j}$ have been used without departing from either the scope or spirit of the present invention.

Information about the conjugated quadratures $|C_1|\cos \phi_{A_1C_1,j}$ and $|C_1|\sin \phi_{A_1C_1,j}$ are obtained using the symmetric and antisymmetric properties and orthogonality property of the conjugated quadratures as represented by the following digital filters applied to the signal values $S_j$: j=1, 2,3,4

$$F_3(S) = \left(\frac{1}{P_1'}\right)\left(\frac{S_1}{\xi_1'^2} - \frac{S_2}{\xi_2'^2}\right) - \left(\frac{1}{P_2'}\right)\left(\frac{S_3}{\xi_1'^2} - \frac{S_4}{\xi_2'^2}\right), \quad (89)$$

$$F_4(S) = \left(\frac{1}{P_1'}\right)\left(\frac{S_1}{\xi_1'^2} - \frac{S_2}{\xi_2'^2}\right) + \left(\frac{1}{P_2'}\right)\left(\frac{S_3}{\xi_1'^2} - \frac{S_4}{\xi_2'^2}\right). \quad (90)$$

The description of $\xi'_j$ and $P'_j$ for the quad-homodyne detection method is the same as the corresponding description given for $\xi'_j$ and $P'_j$ in the bi-homodyne detection method. Using Eqs. (85), (86), (87), (88), (89), and (90), the following expressions are obtained for the filtered quantities containing components of the conjugated quadratures $|C_1|\cos \phi_{A_1C_1,j}$ and $|C_1|\sin \phi_{A_1C_1,j}$:

$$F_3(S) = 2|A_1||C_1| \times \left\{ \begin{array}{l} \dfrac{P_1}{P_1'}\left[ \begin{array}{l} \left(\dfrac{\xi_1\eta_1}{\xi_1'^2}\right)\cos\varphi_{A_1C_1,1} + \\ \left(\dfrac{\xi_2\eta_2}{\xi_2'^2}\right)\left(\dfrac{|A_3|}{|A_1|}\right)\left(\dfrac{|C_3|}{|C_1|}\right)\cos\varphi_{A_1C_1,2} \end{array} \right] + \\ \dfrac{P_2}{P_2'}\left[ \begin{array}{l} \left(\dfrac{\xi_1\eta_1}{\xi_1'^2}\right)\cos\varphi_{A_1C_1,3} + \\ \left(\dfrac{\xi_2\eta_2}{\xi_2'^2}\right)\left(\dfrac{|A_3|}{|A_1|}\right)\left(\dfrac{|C_3|}{|C_1|}\right)\cos\varphi_{A_1C_1,4} \end{array} \right] \end{array} \right\} + \tag{91}$$

$$2\left(\dfrac{|A_2|}{|A_1|}\right)\left(\dfrac{|C_2|}{|C_1|}\right)|A_1||C_1| \times$$

$$\left\{ \begin{array}{l} \dfrac{P_1}{P_1'}\left[ \begin{array}{l} \left(\dfrac{\xi_1\eta_1}{\xi_1'^2}\right)\sin\varphi_{A_1C_1,1} + \\ \left(\dfrac{\xi_2\eta_2}{\xi_2'^2}\right)\left(\dfrac{|A_4|}{|A_2|}\right)\left(\dfrac{|C_4|}{|C_2|}\right)\sin\varphi_{A_1C_1,2} \end{array} \right] - \\ \dfrac{P_2}{P_2'}\left[ \begin{array}{l} \left(\dfrac{\xi_1\eta_1}{\xi_1'^2}\right)\sin\varphi_{A_1C_1,3} + \\ \left(\dfrac{\xi_2\eta_2}{\xi_2'^2}\right)\left(\dfrac{|A_4|}{|A_2|}\right)\left(\dfrac{|C_4|}{|C_2|}\right)\sin\varphi_{A_1C_1,4} \end{array} \right] \end{array} \right\} + a_3 + \ldots,$$

$$F_4(S) = 2|A_1||C_1| \times \left\{ \begin{array}{l} \dfrac{P_1}{P_1'}\left[ \begin{array}{l} \left(\dfrac{\xi_1\eta_1}{\xi_1'^2}\right)\cos\varphi_{A_1C_1,1} + \\ \left(\dfrac{\xi_2\eta_2}{\xi_2'^2}\right)\left(\dfrac{|A_3|}{|A_1|}\right)\left(\dfrac{|C_3|}{|C_1|}\right)\cos\varphi_{A_1C_1,2} \end{array} \right] - \\ \dfrac{P_2}{P_2'}\left[ \begin{array}{l} \left(\dfrac{\xi_1\eta_1}{\xi_1'^2}\right)\cos\varphi_{A_1C_1,3} + \\ \left(\dfrac{\xi_2\eta_2}{\xi_2'^2}\right)\left(\dfrac{|A_3|}{|A_1|}\right)\left(\dfrac{|C_3|}{|C_1|}\right)\cos\varphi_{A_1C_1,4} \end{array} \right] \end{array} \right\} + \tag{92}$$

$$2|A_1||C_1|\left(\dfrac{|A_2|}{|A_1|}\right)\left(\dfrac{|C_2|}{|C_1|}\right) \times$$

$$\left\{ \begin{array}{l} \dfrac{P_1}{P_1'}\left[ \begin{array}{l} \left(\dfrac{\xi_1\eta_1}{\xi_1'^2}\right)\sin\varphi_{A_1C_1,1} + \\ \left(\dfrac{\xi_2\eta_2}{\xi_2'^2}\right)\left(\dfrac{|A_4|}{|A_2|}\right)\left(\dfrac{|C_4|}{|C_2|}\right)\sin\varphi_{A_1C_1,2} \end{array} \right] + \\ \dfrac{P_2}{P_2'}\left[ \begin{array}{l} \left(\dfrac{\xi_1\eta_1}{\xi_1'^2}\right)\sin\varphi_{A_1C_1,3} + \\ \left(\dfrac{\xi_2\eta_2}{\xi_2'^2}\right)\left(\dfrac{|A_4|}{|A_2|}\right)\left(\dfrac{|C_4|}{|C_2|}\right)\sin\varphi_{A_1C_1,4} \end{array} \right] \end{array} \right\} + a_4 + \ldots.$$

where $$a_3 = \left(\dfrac{P_1}{P_1'} - \dfrac{P_2}{P_2'}\right)\left[ \begin{array}{l}(|A_1|^2 + |A_2|^2)\left(\dfrac{\xi_1^2}{\xi_1'^2}\right) - \\ (|A_3|^2 + |A_4|^2)\left(\dfrac{\xi_2^2}{\xi_2'^2}\right)\end{array} \right] + \tag{93}$$

$$\left(\dfrac{P_1}{P_1'} - \dfrac{P_2}{P_2'}\right)\left[ \begin{array}{l}(|B_1|^2 + |B_2|^2)\left(\dfrac{\xi_1^2}{\xi_1'^2}\right) - \\ (|B_3|^2 + |B_4|^2)\left(\dfrac{\xi_2^2}{\xi_2'^2}\right)\end{array} \right] +$$

$$\left(\dfrac{P_1}{P_1'} - \dfrac{P_2}{P_2'}\right)\left[ \begin{array}{l}(|C_1|^2 + |C_2|^2)\left(\dfrac{\eta_1^2}{\xi_1'^2}\right) - \\ (|C_3|^2 + |C_4|^2)\left(\dfrac{\eta_2^2}{\xi_2'^2}\right)\end{array} \right],$$

-continued $$a_4 = \left(\dfrac{P_1}{P_1'} + \dfrac{P_2}{P_2'}\right)\left[ \begin{array}{l}(|A_1|^2 + |A_2|^2)\left(\dfrac{\xi_1^2}{\xi_1'^2}\right) - \\ (|A_3|^2 + |A_4|^2)\left(\dfrac{\xi_2^2}{\xi_2'^2}\right)\end{array} \right] + \tag{94}$$

$$\left(\dfrac{P_1}{P_1'} + \dfrac{P_2}{P_2'}\right)\left[ \begin{array}{l}(|B_1|^2 + |B_2|^2)\left(\dfrac{\xi_1^2}{\xi_1'^2}\right) - \\ (|B_3|^2 + |B_4|^2)\left(\dfrac{\xi_2^2}{\xi_2'^2}\right)\end{array} \right] +$$

$$\left(\dfrac{P_1}{P_1'} + \dfrac{P_2}{P_2'}\right)\left[ \begin{array}{l}(|C_1|^2 + |C_2|^2)\left(\dfrac{\eta_1^2}{\xi_1'^2}\right) - \\ (|C_3|^2 + |C_4|^2)\left(\dfrac{\eta_2^2}{\xi_2'^2}\right)\end{array} \right].$$

The parameters $$\left[\left(\dfrac{|A_2|}{|A_1|}\right)\left(\dfrac{|C_2|}{|C_1|}\right)\right], \tag{95}$$

$$\left(\dfrac{|A_4|}{|A_2|}\right)\left(\dfrac{|C_4|}{|C_2|}\right), \tag{96}$$

$$\left[\left(\dfrac{|A_3|}{|A_1|}\right)\left(\dfrac{|C_3|}{|C_1|}\right)\right] \tag{97}$$

need to be determined in order to complete the determination of a conjugated quadratures for certain end use applications. The parameters given by Eqs. (95), (96), and (97) can for example be measured by procedures analogous to the procedure described for the bi-homodyne detection method with respect to measuring the quantity specified by Eq. (35).

The remaining description of the quad-homodyne detection method with respect to considerations not related to effects of vibrations, environmental changes, and atmospheric turbulence effects is the same as the corresponding portion of the description given for the bi-homodyne detection method.

The appearance of effects of vibrations and environmental changes is determined by expressing $\Phi_{A_1C_1,j} = \Phi_{A_1C_1} + \Delta\Phi_j$ in Eqs. (91) and (92) where $\Delta\Phi$ comprises the effects of vibration, environmental changes, tilts, and non-zero average atmospheric turbulence effects between reference object 62 and measurement object 60 and following the same procedures used with respect to the single- and bi-homodyne detection methods herein to determine the corresponding effects of vibrations, environmental changes, and non-zero average atmospheric turbulence effects. The results obtained for the quad-homodyne detection method exhibit properties that are substantially the same as the properties exhibited for the bi-homodyne detection method.

Certain embodiments of the present invention may use the quad-homodyne detection method instead of the bi-homodyne detection method. For the other embodiments such as those that are based on the apparatus shown in FIG. 1a, the corresponding the other embodiments use variants of the apparatus shown in FIG. 1a. In the variants of the apparatus such as used in the first embodiment of the present invention, interferometer 10 is modified to include for example a CCD configured with a architecture that pairs each photosensitive pixel with a blanked-off storage pixel to which the integrated charge is shifted at the moment of an interline transfer or a dispersive element such as a direct vision prism or a dichroic beam-splitter. When configured with a dispersive element, a second detector is further added to the system.

Descriptions of the variants of the apparatus based on the incorporation of a dispersive element are the same as corresponding portions of descriptions given for corresponding systems in commonly owned U.S. Provisional Application No. 60/442,982 (ZI-45) and U.S. patent application Ser. No. 10/765,229 (ZI-45) wherein both are entitled "Interferometric Confocal Microscopy Incorporating Pinhole Array Beam-Splitter" and both are by Henry A. Hill. The contents of both are here within incorporated in their entirety by reference. Corresponding variants of apparatus are also used for various embodiments of the present invention that comprise interferometers such as linear displacement interferometers.

It is also evident that since the conjugated quadratures of fields are obtained jointly when using the quad-homodyne detection, there is a significant reduction in the potential for an error in tracking phase as a result of a phase redundancy unlike the situation possible in single-homodyne detection of conjugated quadratures of fields.

There are a number of advantages of the quad-homodyne detection as a consequence of the conjugated quadratures of fields being jointly acquired quantities.

One advantage of the quad-homodyne detection method in relation to the bi-homodyne detection method is a factor of two increase in throughput.

Another advantage is a reduced sensitivity to the effects of an overlay error of a spot in or on the substrate that is being imaged and a conjugate image of a pixel of a conjugate set of pixels of a multi-pixel detector during the acquisition of the four electrical interference signal values of each spot in and/or on a object imaged. Overlay errors are errors in the set of four conjugate images of a respective set of conjugate detector pixels relative to the spot being imaged.

Another advantage is that when operating in the scanning mode there is reduced sensitivity to effects of window to window variations of a respective conjugate set of windows of the input beam 24 to the interferometer system.

Another advantage is that when operating in the scanning mode there is an increase in throughput since only two windows of the source is required to generate the four electrical interference values.

Figure 1F:
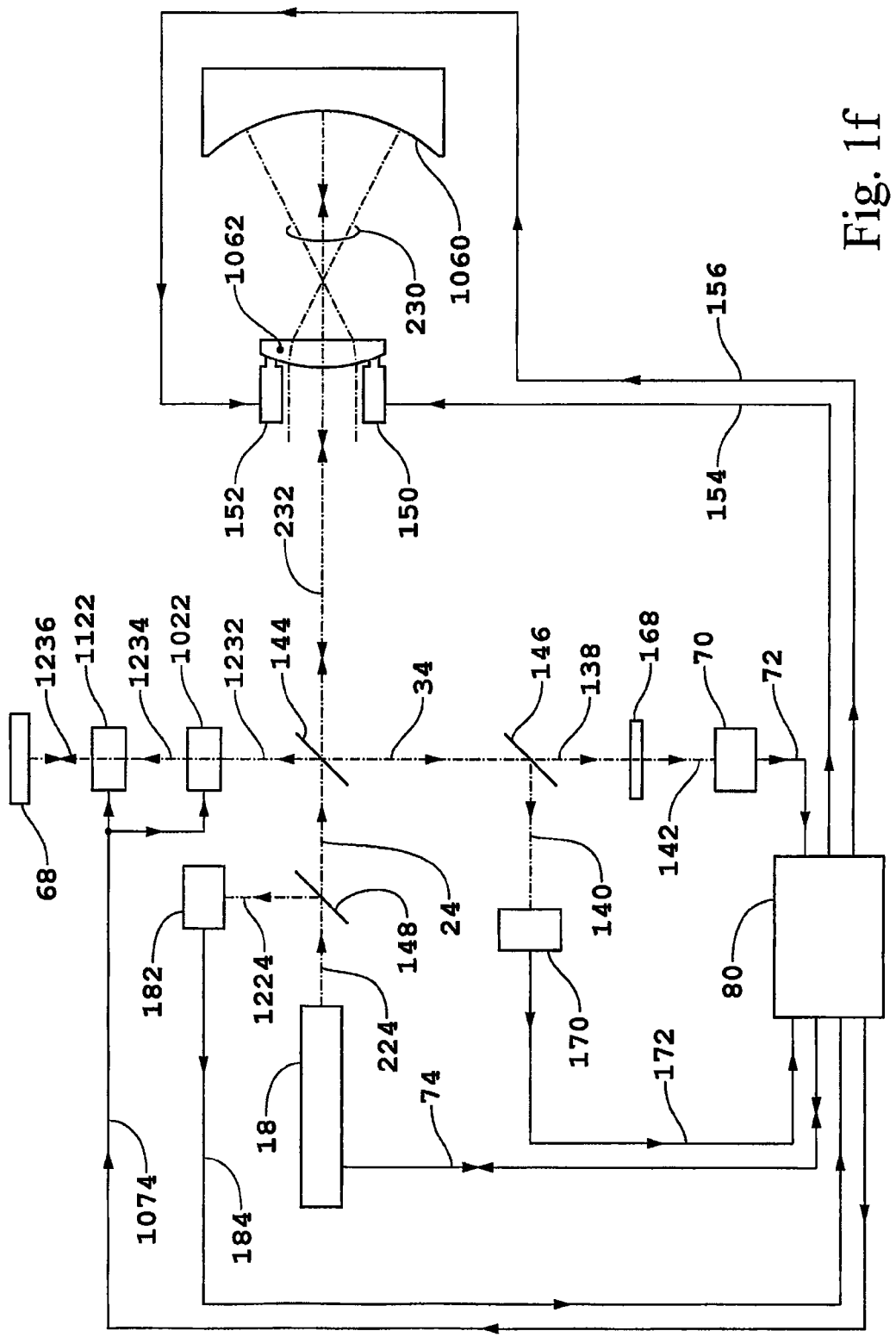
FIG. 1f is a schematic diagram of an interferometer system of the Twyman-Green type that uses homodyne detection methods configured to operate with modulation of the optical path length difference between the reference and measurement objects.

A second embodiment of the present invention is shown schematically in FIG. 1f. The first embodiment comprises interferometer 10 configured as a Twyman-Green interferometer that uses homodyne detection methods based on a combination of polarization, temporal, and frequency encoding with or without use of phase shifting introduced by a relative translation of reference and measurement objects 62 and 1060 or by phase modulators 1022 and 1122. Phase modulators 1022 and 1122 are controlled by components of signal 1074 from electronic processor and controller 80. The second embodiment is in addition operated with a reference frame and a reference optical frequency $f_R$ wherein the relative optical path length between a spot on surface 64 and a corresponding spot on measurement object 1060 is maintained constant mod $2\pi$ at the reference optical frequency $f_R$. The homodyne detection methods exhibit an intrinsic reduced sensitivity to vibrations and environmental changes.

In FIG. 1f, source 18 generates input beam 224 with two orthogonally polarized components wherein each polarized component comprises a single frequency component that is switched between selected frequency values with a switching frequency that is preferably high compared to the frequencies of the effects of vibration and environmental changes that may be present. The description of source 18 is the same as the description of source 18 of the first embodiment of the present invention with the addition of EOMs and analyzers to rotate the polarization state of beam 224 between different frequency components.

With reference to FIG. 1f, interferometer 10 comprises polarizing beam-splitter 144, reference object 62 with reference surface 64; measurement object 1060; transducers 150 and 152; detectors 70, 170, and 182; and electronic processor and controller 80. Input beam 224 is incident on non-polarizing beam splitter 148 and a first portion thereof transmitted as beam 24 and a second portion thereof reflected as monitor beam 1224. Beam 24 is incident on polarizing beam-splitter 144 and a first portion thereof transmitted as a measurement beam component of beam 232 and a second portion thereof reflected as reference beam component of beam 1232. The first and second portions are polarized parallel and orthogonal to the plane of FIG. 1f, respectively. Measurement beam component of beam 232 is subsequently incident on lens 1062 and transmitted as a measurement component of beam 230. The measurement beam component of beam 230 is incident on measurement object 1060 and a portion thereof reflected as a reflected measurement beam component of beam 230. The reflecting surface of measurement object 1060 is shown as a curved surface in FIG. 1f. The reflected measurement beam component of beam 230 is incident on lens 1062 and transmitted as the collimated reflected measurement beam component of beam 232. The reflected measurement beam component of beam 232 is next incident on polarizing beam-splitter 144 and reflected as a measurement beam component of output beam 34.

Reference beam component of beam 1232 is transmitted by phase modulator 1022 as a reference beam component of beam 1234 which is transmitted by phase modulator 1122 as a reference beam component of beam 1236. The reference beam component of beam 1236 is reflected by reference object 68 as a reflected reference beam component of beam 1236. The reflected reference beam component of beam 1236 is transmitted by phase modulators 1122 and 1022 as reflected reference beam components of beams 1234 and 1232, respectively. The reflected reference beam component of beam 1232 is incident on and transmitted by polarizing beam-splitter 144 as a reference beam component of output beam 34

Continuing with the description of the second embodiment, output beam 34 is incident on non-polarizing beam-splitter 146 and first and second portions thereof transmitted and reflected, respectively, as beams 138 and 140, respectively. Beam 138 is detected by detector 70 preferably by a quantum process to generate electrical interference signal 72 after transmission by shutter 168 if required to generate beam 142 as a gated beam. Shutter 168 is controlled by electronic processor and controller 80. The function of shutter may be alternatively served by a shutter integrated into detector 70. Electrical interference signal 72 contains information about the difference in surface profiles of surfaces of reference object 68 and the reflecting surface of measurement object 1060.

Beam 140 is incident on and detected by detector 170 preferably by a quantum process to generate electrical interference signal 172 to generate the respective transmitted beam as a mixed beam. If beam 140 is not a mixed beam, it is passed through an analyzer in detector 170 to form a mixed beam prior to detection by detector 170. Detector 170 comprises one or more high speed detectors where each of the high speed detectors may comprise one or more pixels. The photosensitive areas of each of the one or more high speed detectors overlaps a portion of the wavefront of beam 140.

Electrical interference signal 172 contains information about the relative changes in the optical path lengths between the reference and measurement objects 68 and 1060 at positions corresponding to the portions of the wavefront of beam 140 incident on each of the high speed detectors. The information contained in electrical interference signal 172 is processed and used by electronic processor and controller 80 to establish and maintain the reference frame and to detect changes in relative orientation and/or deformation of the reference and measurement objects 68 and 1060. The description of electrical interference signal 172 and the subsequent processing by electronic processor and controller 80 is the same as the corresponding portion of the description of the first embodiment of the present invention.

Beam 1224 is incident on detector 182 and detected preferably by a quantum process to generate electrical interference signal 184. Electrical interference signal 184 is processed and used by electronic processor and controller 80 to monitor and control the amplitude of components of beam 224 through a component of signal 74.

With reference to FIG. 1*f*, the phase shifting is achieved either with shifting the frequencies of components of input beam 24 or in conjunction with phase shifting introduced by translation and/or rotation of reference object 68 by transducers such as the transducers used to translate and/or rotate the reference object 62 of the first embodiment of the present invention or by phase modulators 1022 and 1122. Phase modulators 1022 and 1122 modulate the phases of orthogonally polarized components of transmitted beams as controlled by components of signal 1074 from electronic processor and controller 80. Transducers 150 and 152 which are controlled by signals 154 and 156, respectively, from electronic processor and controller 80 control the position and orientation of lens 1062. A third transducer located out of the plane of FIG. 1*f* (not shown in figure) is used to introduce changes in angular orientation of reference object 62 that are orthogonal to the changes in angular orientation introduced by transducers 150 and 152.

The remaining description of the second embodiment is the same as corresponding portions of the descriptions of the first embodiment of the present invention.

Figure 2:
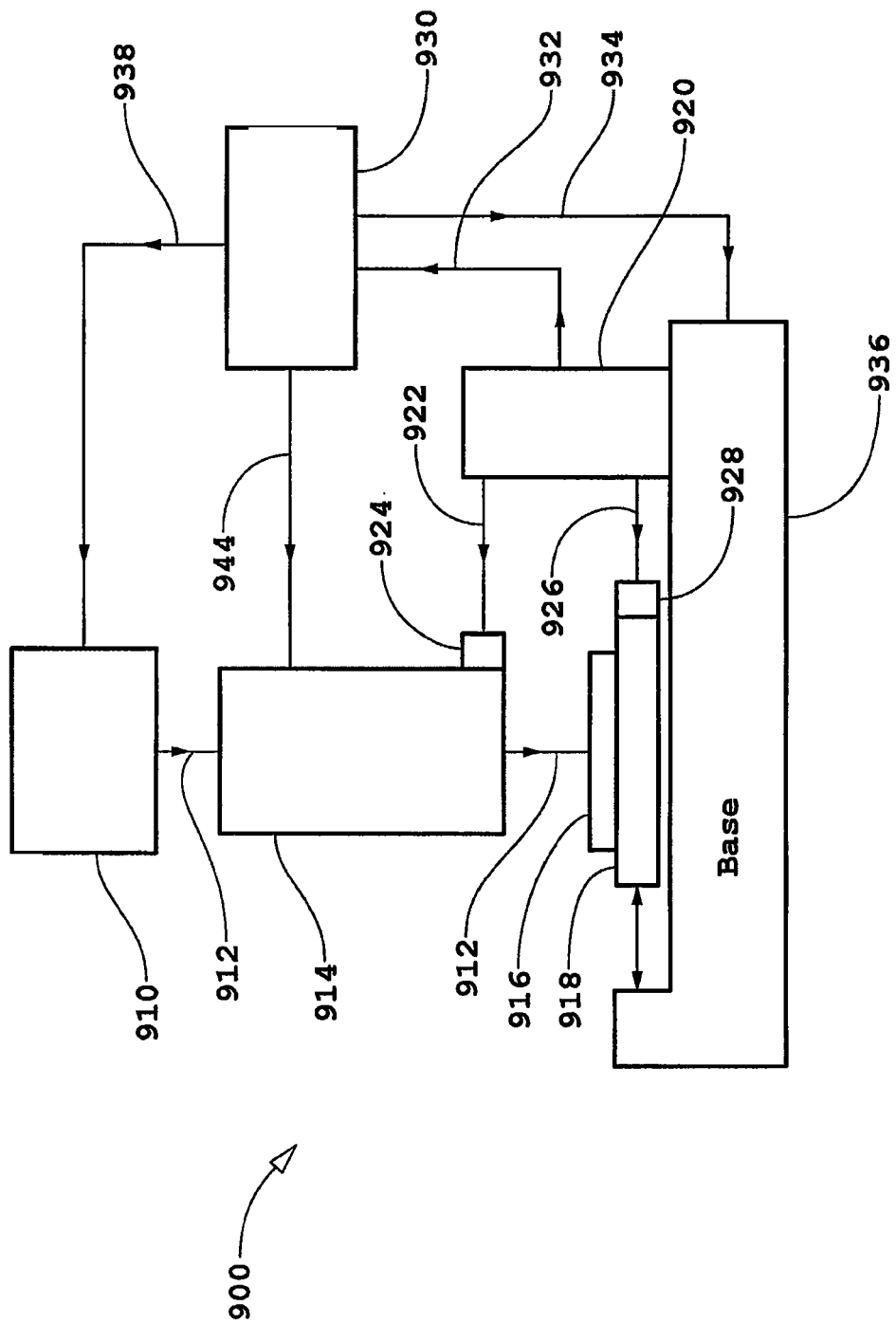
FIG. 2 is a diagram of an interferometric metrology system and scanning system for scanning a measurement object.

Two different modes are described for the acquisition of the electrical interference signals 72. The first mode to be described is a step and stare mode wherein objects 60 and 1060 of the first and second embodiments are stepped between fixed locations corresponding to locations where image information is desired. The second mode is a scanning mode. The descriptions of the two different modes are made with reference to FIG. 2 where a schematic of a metrology system 900 using a wavefront metrology system embodying the present invention is shown. A source 910 generates a source beam and a wavefront metrology system 914 such as described in the first and second embodiments of the present invention directs a measurement beam 912 to a measurement object 916 supported by a movable stage 918. Source 910 is the same as source 18 shown in FIG. 1*a*. Measurement beam 912 located between wavefront metrology system 914 and measurement object 916 corresponds to measurement beam components 30A and 30B as shown in FIG. 1*a*.

To determine the relative position of stage 918, an interferometry system 920 directs a reference beam 922 to a mirror 924 mounted on wavefront metrology system 914 and a measurement beam 926 to a mirror 928 mounted on stage 918. Changes in the position measured by interferometry system 920 correspond to changes in the relative position of measurement beam 912 on measurement object 916. Interferometry system 920 sends a measurement signal 932 to controller 930 that is indicative of the relative position of measurement beam 912 on measurement 916. Controller 930 sends an output signal 934 to a base 936 that supports and positions stage 918. Interferometer system 920 may comprise for example linear displacement and angular displacement interferometers and cap gauges.

Controller 930 can cause the wavefront metrology system 914 to scan the measurement beam 912 over a region of the measurement object 916, e.g., using signal 934. As a result, controller 930 directs the other components of the system to generate information about different regions of the measurement object.

In the step and stare mode for generating a one-dimensional, a two-dimensional or a three-dimensional profile of measurement object 916, controller 930 translates stage 918 to a desired position and then acquires a set of at least three arrays of electrical interference signal values. After the acquisition of the sequence of at least three arrays of electrical interference signals, controller 930 then repeats the procedure for the next desired position of stage 918. The elevation and angular orientation of measurement object 916 is controlled by base 936.

The second mode for the acquisition of the electrical interference signal values is next described wherein the electrical interference signal values are obtained with the position of stage 918 scanned in one or more directions. In the scanning mode, source 910 is pulsed at times controlled by signal 938 from controller 930. Source 910 is pulsed at times corresponding to the registration of the conjugate image of pixels of the detector corresponding for example to detector 70 of FIG. 1*b* with positions on and/or in measurement object 916 for which image information is desired.

There will be a restriction on the duration or "pulse width" of a beam pulse sequence $\tau_{p1}$ or corresponding integration time of the detector produced by source 910 as a result of the continuous scanning mode. Pulse width $\tau_{p1}$ will be a parameter that in part controls the limiting value for spatial resolution in the direction of a scan to a lower bound of $$\tau_{p1} v, \tag{98}$$

where v is the scan speed. For example, with a value of $\tau_{p1}$=50 nsec and a scan speed of v=0.20 m/sec, the limiting value of the spatial resolution $\tau_{p1} v$ in the direction of scan will be $$\tau_{p1} v = 10 \text{ nm}. \tag{99}$$

Pulse width $\tau_{p1}$ will also determine the minimum frequency difference that can be used in the bi-homodyne detection. In order that there be no contributions to the electrical interference signals from interference between fields of conjugated quadratures, the minimum frequency spacing $\Delta f_{min}$ is expressed as $$\Delta f_{min} \gg \frac{1}{\tau_{p1}}. \tag{100}$$

For the example of $\tau_{p1}$=50 nsec, $1/\tau_{p1}$=20 MHz.

The frequencies of input beam 912 are controlled by signal 938 from controller 930 to correspond to the frequencies that will yield the desired phase shifts between the reference and return measurement beam components of output beams. In the first mode or step and stare mode for the acquisition of the electrical interference signal values, the set of at least three electrical interference signal values corresponding to a set of at least three electrical interference values are generated by common pixels of the detector. In the second or scanning mode for the acquisition of electrical interference signals, a set of at least three electrical interference signal values are not generated by a common pixel of the detector. Thus in the scanning mode of acquisition, the differences in pixel efficiency are compensated in the signal processing by controller 930 as described in the above description of the bi- and quad-homodyne detection methods. The joint measurements of conjugated quadratures of fields are generated by controller 930 as previously described in the description of the bi- and quad-homodyne detection methods.

A third embodiment of the present invention comprises the interferometer system of FIG. 1a with interferometer 10 comprising an interferometric far-field confocal microscope such as described in referenced U.S. Pat. No. 5,760,901. In the third embodiment, the interferometer system is configured to use a multiple-homodyne detection method. Embodiments in U.S. Pat. No. 5,760,901 are configured to operate in either the reflection or transmission mode. The third embodiment has reduced effects of background because of background reduction features of U.S. Pat. No. 5,760,901.

A fourth embodiment of the present invention comprises the interferometer system of FIG. 1a with interferometer 10 comprising an interferometric far-field confocal microscope such as described in referenced U.S. Pat. No. 6,480,285 B1. In the fifth embodiment, the interferometer system is configured to use a multiple-homodyne detection method. Embodiments in U.S. Pat. No. 6,480,285 B1 are configured to operate in either the reflection or transmission mode. The fourth embodiment has reduced effects of background because of background reduction features of U.S. Pat. No. 6,480,285 B1.

A fifth embodiment of the present invention comprises the interferometer system of FIG. 1a with interferometer 10 comprising an interferometric near-field confocal microscope such as described in U.S. Pat. No. 6,445,453. In the fifth embodiment, the interferometer system is configured to use a multiple-homodyne detection method. Embodiments in U.S. Pat. No. 6,445,453 are configured to operate in either the reflection or transmission mode. The fifth embodiment of U.S. Pat. No. 6,445,453 in particular is configured to operate in the transmission mode with the measurement beam separated from the reference beam and incident on the measurement object being imaged by a non-confocal imaging system. Accordingly, the fifth embodiment of the present invention represents an application of a multiple-homodyne detection method in a non-confocal configuration for the measurement beam.

Interferometer 10 may further comprise any type of interferometer, e.g., a differential plane mirror interferometer, a double-pass interferometer, a Michelson-type interferometer and/or a similar device such as is described in an article entitled "Differential Interferometer Arrangements For Distance And Angle Measurements: Principles, Advantages And Applications" by C. Zanoni, VDI Berichte Nr. 749, 93-106 (1989) configured for multiple-homodyne detection. Interferometer 10 may also comprise a passive zero shear plane mirror interferometer as described in U.S. patent application Ser. No. 10/207,314 entitled "Passive Zero Shear Interferometers" or an interferometer with a dynamic beam steering element such as described in U.S. patent application Ser. No. 09/852,369 entitled "Apparatus And Method For Interferometric Measurements Of Angular Orientation And Distance To A Plane Mirror Object" and U.S. Pat. No. 6,271,923 entitled "Interferometry System Having A Dynamic Beam Steering Assembly For Measuring Angle And Distance," all of which are by Henry A. Hill. For embodiments of the present invention which comprise interferometric apparatus such as described in the US patents and the article by Zanoni, the described interferometers are configured for a multiple-homodyne detection and the embodiments represent configurations that are of a non-confocal type.

It should be understood that the algorithms and mathematical computations that are described above can be performed entirely by an appropriately programmed processor and controller within the interferometry system or they can be performed with the aid of or exclusively by another processor system.

Other embodiments are within the following claims.

What is claimed is:

1. A wavefront interferometry system comprising:
a wavefront interferometer that during operation combines a reference beam from a reference object and a return measurement beam from a measurement object to generate a combined beam;
a detector system for receiving the combined beam and generating therefrom an array of interference signals; and
a processor system programmed to process the array of interference signals and to compute therefrom a first array of phase measurements for a first time and a second array of phase measurements for a second time, to compute a difference of the first and second arrays of phase measurements to determine an array of rates of phase changes, and from the array of rates of phase changes to compute an array of atmospheric turbulence effect values which is a measure of atmospheric turbulence effects in the wavefront interferometer.

2. The wavefront interferometry system of claim 1, wherein the processor system is further programmed to subtract the array of atmospheric turbulence effect values from an array of phase measurements obtained from the array of interference signals to thereby remove the effects of atmospheric turbulence from phase measurements produced by the wavefront interferometry system.

3. The wavefront interferometry system of claim 1, wherein the wavefront interferometer is a Fizeau interferometer.

4. The wavefront interferometry system of claim 1, wherein the wavefront interferometer is a Twyman-Green interferometer.

5. The wavefront interferometry system of claim 1, wherein the detector system includes an array of detector elements.

6. The wavefront interferometry system of claim 1, wherein the array of interference signals is a two-dimensional array of interference signals and the first and second arrays of phase measurements are both two-dimensional arrays.

7. The wavefront interferometry system of claim 1, wherein the processor system is programmed to compute the array of atmospheric turbulence effect values by inverting the array of rates of phase changes.

8. The wavefront interferometry system of claim 7, wherein during operation the wavefront interferometer includes a gas through which the reference and return measurement beams pass and wherein the processor system is further programmed to compute the array of atmospheric turbulence effect values by dividing values derived from the inverted array of rates of phase changes by corresponding values for a speed of the gas.

9. The wavefront interferometry system of claim 8, further comprising gas flow monitors within the wavefront interferometer and wherein the processor system is further programmed to determine components of velocity of the gas from gas flows measured by the gas flow monitors, wherein said corresponding values for the speed of the gas are derived from the determined components of velocity of the gas.

10. The wavefront interferometry system of claim 8, wherein the processor system is further programmed to determine components of velocity of the gas by employing a cross-correlation technique and computed arrays of rates of phase changes derived from the array of interference signals, wherein said corresponding values for the speed of the gas are derived from the determined components of velocity of the gas.

11. The wavefront interferometry system of claim 1, wherein the array of rates of phase changes is an array of temporal first derivatives of the atmospheric turbulence effects.

12. The wavefront interferometry system of claim 2, wherein the array of phase measurements from which the array of atmospheric turbulence effect values is subtracted is obtained concurrently with either the first array of phase measurements or the second array of phase measurements.

13. The wavefront interferometry system of claim 2, wherein the array of phase measurements from which the array of atmospheric turbulence effect values is subtracted is selected from the group consisting of the first array of phase measurements and the second array of phase measurements.

14. The wavefront interferometry system of claim 1, wherein the processor system includes a controller that controls the operation of the wavefront interferometer.

15. The wavefront interferometry system of claim 1, wherein the processor system is programmed to use the array of interference signals to determine conjugated quadratures of fields of the return measurement beam.

16. The wavefront interferometry system of claim 1, wherein the processor system controls the wavefront interferometer and is programmed to process the array of interference signals by employing a multiple-homodyne technique.

17. A method of operating a wavefront interferometry system, said method comprising:
combining a reference beam from a reference object and a return measurement beam from a measurement object to generate a combined beam;
receiving the combined beam and generating therefrom an array of interference signals;
based on the array of interference signals, computing a first array of phase measurements for a first time and a second array of phase measurements for a second time;
computing a difference of the first and second arrays of phase measurements to determine an array of rates of phase changes; and
from the array of rates of phase changes, computing an array of atmospheric turbulence effect values which is a measure of atmospheric turbulence effects in the wavefront interferometry system.

18. The method of claim 17, further comprising subtracting the array of atmospheric turbulence effect values from an array of phase measurements obtained from the array of interference signals to thereby remove the effects of atmospheric turbulence from phase measurements produced by the wavefront interferometry system.

19. The method of claim 17, wherein the array of interference signals is a two-dimensional array of interference signals and the first and second arrays of phase measurements are both two-dimensional arrays.

20. The method of claim 17, wherein computing the array of atmospheric turbulence effect values involves inverting the array of rates of phase changes.

21. The method of claim 20, wherein during operation the wavefront interferometer includes a gas through which the reference and return measurement beams pass, said method further comprising computing the array of atmospheric turbulence effect values by dividing values derived from the inverted array of rates of phase changes by corresponding values for a speed of the gas.

22. The method of claim 21, further comprising:
measuring gas flows within the wavefront interferometer;
from the measured gas flows, determining components of velocity of the gas, wherein said corresponding values for the speed of the gas are derived from the determined components of velocity of the gas.

23. The method of claim 21, further comprising determining components of velocity of the gas by employing a cross-correlation technique and computed arrays of rates of phase changes derived from the array of interference signals, wherein said corresponding values for the speed of the gas are derived from the determined components of velocity of the gas.

24. The method of claim 17, wherein the array of rates of phase changes is an array of temporal first derivatives of the atmospheric turbulence effects.

25. The method of claim 18, wherein the array of phase measurements from which the array of atmospheric turbulence effect values is subtracted is obtained concurrently with either the first array of phase measurements or the second array of phase measurements.

26. The method of claim 18, wherein the array of phase measurements from which the array of atmospheric turbulence effect values is subtracted is selected from the group consisting of the first array of phase measurements and the second array of phase measurements.

27. The method of claim 17, wherein the processor system computes the first and second arrays of phase measurements by using the array of interference signals to determine conjugated quadratures of fields of the return measurement beam.

28. A method of operating a wavefront interferometry system that generates an array of interference signals that contains information about relative wavefronts of measurement and reference beams, said method comprising:
from the array of interference signals, computing a first array of phase measurements for a first time and a second array of phase measurements for a second time;
computing a difference of the first and second arrays of phase measurements to determine an array of rates of phase changes; and
from the array of rates of phase changes, computing an array of atmospheric turbulence effect values which is a measure of atmospheric turbulence effects in the wavefront interferometry system.

* * * * *